United States Patent [19]
Craven

[11] Patent Number: 5,548,286
[45] Date of Patent: Aug. 20, 1996

[54] ANALOGUE AND DIGITAL CONVERTORS USING PULSE EDGE MODULATORS WITH NON-LINEARITY ERROR CORRECTION

[75] Inventor: Peter G. Craven, Oxon, England

[73] Assignee: B&W Loudspeakers Ltd., Worthing, United Kingdom

[21] Appl. No.: 107,842

[22] PCT Filed: Feb. 21, 1992

[86] PCT No.: PCT/GB92/00312

§ 371 Date: Aug. 25, 1993

§ 102(e) Date: Aug. 25, 1993

[87] PCT Pub. No.: WO92/15153

PCT Pub. Date: Sep. 3, 1992

[30] Foreign Application Priority Data

Feb. 22, 1991 [GB] United Kingdom ............ 9103777

[51] Int. Cl.$^6$ .......... H03M 1/06; H03M 1/12; H03M 1/66; H03K 7/08
[52] U.S. Cl. .......... 341/126; 341/144; 341/155; 332/107; 332/109
[58] Field of Search .......... 332/106, 107, 332/109, 112; 341/126, 140, 144, 155

[56] References Cited

U.S. PATENT DOCUMENTS 4,947,171 8/1990 Pfeifer et al. ............ 341/143
5,339,054 8/1994 Taguchi ............ 332/107 X

FOREIGN PATENT DOCUMENTS

| 0335988 | 10/1989 | European Pat. Off. |
| 1284123 | 2/1990 | Japan. |
| 1444216 | 7/1976 | United Kingdom. |
| 2076240 | 11/1981 | United Kingdom. |
| 2077539 | 12/1981 | United Kingdom. |
| 2144299 | 2/1985 | United Kingdom. |
| 2171568 | 8/1986 | United Kingdom. |
| 2171569 | 8/1986 | United Kingdom. |
| 2176070 | 12/1986 | United Kingdom. |

OTHER PUBLICATIONS

Cataltepe et al.; *IEEE ISCAS* 89; May–1989; "Digitally Corrected Multi–Bit . . ." pp. 647–650.

*Primary Examiner*—David Mis
*Attorney, Agent, or Firm*—Nixon & Vanderhye P.C.

[57] ABSTRACT

A signal convertor comprising a pulse modulator, and a modifier for modifying the signal input thereto in dependence upon the error in previous values of the output thereof, to reduce the effects of said error within a desired signal band.

14 Claims, 41 Drawing Sheets

→ INCREASING Q 3 1 -1 -3 -1 1 3
2 0 -2 -2 0 2
← INCREASING Q →

−

=

5,548,286

ANALOGUE AND DIGITAL CONVERTORS USING PULSE EDGE MODULATORS WITH NON-LINEARITY ERROR CORRECTION

BACKGROUND OF THE INVENTION

1. Field of the Invention

This invention relates to signal converters, i.e., digital to analogue convertors, and to analogue to digital convertors.

2. Discussion of Prior Art

In one type of digital to analogue convertor, a multi-bit digital signal is employed to control the width of pulses output by a pulse width modulator. The pulses are then integrated or otherwise low pass filtered over a period of time to provide analogue output levels. The pulse rate of the pulse width modulator, and hence the rate at which digital samples are supplied thereto, clearly needs to be well above that of the pass bang of the low pass filter for this to be successful, however; since the pass band at the low pass filter is half the sampling frequency for the signal to be converted, the rate at which digital samples are supplied is therefore generally well in excess of the sampling frequency for the signal to be converted.

Another type of digital to analogue convertor, described for example in GB2183115, employs oversampling—that is, receives digital data samples at a significant multiple of the Nyquist frequency for the signal represented. The accuracy of the signal is then reduced by a quantizer (or more accurately, a re-quantizer) having a small number of levels. The output of the quantizer is fed back and subtracted from the input to the quantizer, and the result (which represents the error due to the quantizer, hereinafter referred to as the quantizer noise) is subtracted from the next sample input to the quantizer.

If the input signal level is constant (that is, the input signal contains no frequencies above zero hertz or DC) the quantizer error is thus taken account of to some extent in the following sample and if the quantizer output is averaged over a sufficiently large number of samples, the quantizer noise is eliminated. Reducing the number of quantization levels increases the magnitude of the quantization noise and consequently increases the number of samples over which the quantizer output must be averaged; and hence the sampling rate of the convertor (and its oversampling ratio).

However, the quantizer noise increases as the frequency of the input signal rises, leading to errors at nigher frequencies in the output of the convertor. To reduce this effect, a filter may be placed in the path so as to filter the quantizer noise before it is subtracted from the next sample. The filter has a prediction characteristic so that when the path is added the spectral distribution of the quantizer noise is "shaped", to reduce the noise level at frequencies below the Nyquist frequency of the signal to be converted, and consequently increase the noise at higher frequencies outside the signal band.

Alternatively, a similar effect may be achieved by placing a different low pass filter in the signal path at a point following that at which the quantizer noise has been introduced by an overall feedback path from the quantizer output.

The quantizer may, as described in GB2183115, have only two levels (in other words, it may be a one bit quantizer). In this case the output of the quantizer may (after suitable buffering or amplification) be integrated or otherwise low pass filtered using an analogue filter to provide an analogue signal corresponding to the digital input signal. Alternative types of convertor employ a quantizer having a greater, but still small, number of levels and consequently producing output signals comprising a small number of bits (for example, 3). However, since the output of such quantizers remains a multi-bit digital signal some form of conversion to an analogue signal is skill required. It has therefore been proposed to employ, following the quantizer, a pulse width modulator controlled by the digital output of the quantizer to produce a pulse of constant height but of length determined by the quantizer output. This is advantageous because, whilst control of the precise height of a pulse requires high precision analogue circuits, control of the pulse lengths (with constant height) requires only a single amplitude source and an accurate timer, both of which are commercially available.

A digital to analogue convertor of this general type is disclosed in "Seventeen bit oversampling D to A conversion technology using multi stage noise shaping", Matsuya et al, IEEE Journal of Solid State Circuits VOL 24 No. 4 August, 1989. Although that reference shows the use of the so-called MASH or multiple stage noise shaping structure, in which the quantization error is itself further re-quantized, a structure employing only a single quantizer with a noise shaping filter is equally possible.

The widespread use of digital audio technology, caused by the availability of low cost digital storage devices such as digital audio tape and compact disc, has led to a requirement for greater accuracy in digital to analogue and analogue to digital conversion. Seventeen and eighteen bit digital to analogue convertors utilizing oversampling and noise shaping and having a band width around 20 kilohertz are already known; the above referenced IEEE paper claims such a performance. A summary of known devices is given in HI-FI CHOICE, DECEMBER 1990, P54–59, "Keeping in Shape" (P Miller). However, there is evidence that the human ear can be responsive to quantization errors even using eighteen bits.

It is stated in the above referenced IEEE paper that resistance mis-matching of P and N channel MOS devices causes second order harmonic distortion in the output signal. Accordingly, a differential or "push-pull" output structure is adopted in which the output of the quantizer controls two separate pulse width modulators; one producing longer pulses for higher signal levels, and the other producing shorter pulses per higher signal levels. The outputs of the two pulse width modulators are then fed to a differential amplifier which consequently produces pulses of lengths proportional to the quantizer output with reduced second order harmonic distortion.

We have realized, however, that there is another cause of distortion which is directly due to the use of pulse width modulation itself; the non-linear distortion due to the pulse width modulator can bring the quantizer noise back into the audio band. At resolutions of seventeen or eighteen bits, and employing the differential output configuration above, the effects of such distortion are not noticeable and hence, it is believed, have not been recognized, but at accuracies of 22 or 24 bits the inaccuracy inherent in the pulse width modulation stage would limit the performance of the convertor as a whole.

In "Multibit oversampled Σ-Δ A/D convertor with digital error correction", Larson et al, Electronics Letters, Aug. 4, 1988, pages 1051–1052, and "Digitally corrected multi-bit Σ-/Δ data convertors", by the same authors in Proc 1989 IEEE Int Symp on Circuits and Systems (1989, pages 467–650), there is disclosed a method of correcting for non-linearity in a sampled system by providing a corresponding non-linearity in a feedback loop at a stage prior to the non-linear stage; the feedback non-linearity is provided as a ROM look up table. However, it is acknowledged that this technique is only suitable for errors which occur at sampling instants in the sampled system, and not for errors such as "settling errors" or random noise.

GB 2176070 provides a pulse width type modulator in which the edges of the pulses are allowed to have stepped amplitudes so as to reduce the non-linear distortion produced by the modulation. This would, of course, require several high accuracy reference amplitude sources. Further, it does not solve the problem of the reintroduction of quantizer noise into the audio band due to the remaining non-linearity.

SUMMARY OF THE INVENTION

When pulse width or like modulations are used, the pulse edges lie at variable points between the sampling instants of the sampled system, and so do the corresponding errors, which consequently cannot be corrected by the above disclosed method, in this application, the term "Pulse Edge Modulator" will be used to describe modulations effected by moving the edge of a pulse in time in this way, and encompasses all the various known pulse width modulation schemes.

According to one aspect of the invention there is therefore provided a signal convertor which includes a pulse edge modulator, characterized by means for correcting the non-linearity due to the pulse edge modulator in dependence upon the value of the signal input to the modulator. Preferably the correction is derived in dependence upon the signal which would be output by the modulator. Feedback from the modulator output under some circumstances may be employed, but it is preferred to calculate or predict the error within the modulator output, or a representation thereof over the signal band of interest (e.g. the audio band), and effect correction accordingly. Where the modulator can produce only a limited number of different output signal types, the prediction is preferably performed by employing a store which includes a look-up table; for example a read only memory (ROM).

This solution therefore renders possible digital to analogue convertors operating at accuracies of 24 or more bits. However, it is of course applicable to convertors which include distortions between sampling instants due to other factors provided these factors can be sufficiently well characterized, and operating at lower accuracies. It is equally applicable to analogue to digital convertors; for example those which employ a feed back path including a digital to analogue convertor.

To compensate a non-linear error occurring between sampling instants, the invention in another aspect provides means responsive to the signal at a point prior to the error generating stage to produce a plurality of outputs non-linearly related to the signal and delayed by different amounts and for modifying the signal, prior to the error generating stage, in dependence thereon. In one embodiment, the non-linear signals are fed back to affect the input signal at later instants than that for which they were derived; preferably, the feedback includes filtering to reduce error within the signal band of interest.

In this case, at least one of the non-linear signals is preferably delayed to affect input signals at instants after the immediately next. In conventional noise shaping feedback circuits as in the above referenced prior art, correction is always effected on the immediately next sample to the sample giving rise to the fed back error; in a third aspect of the invention, there is provided delayed noise shaping only to at least one sample which follows the said immediately next sample.

The non-linear signals which are fed back may correspond to a simulation within the signal band of interest of the output of the non-linear stage spread over several signal samples. Alternatively, they may represent the error due to the output (e.g. pulse width modulator) stage, corresponding to the difference between the simulated output samples and the input sample to the output stage. Equally, however, the non-linear outputs may correspond to linear combinations or filtered or scaled versions of these signals.

In a preferred embodiment, non-linear correction is provided also in the forward signal path, preferably responsive to at least two mutually delayed versions of the input signal; this reduces the magnitude of the feedback correction and hence improves the stability of the apparatus. Since at least two mutually delayed versions of the input signal are available, it is also preferred in this embodiment to provide means, responsive to a prospective output overload, for adjusting the value of a preceding output sample so as to avoid the overload. However, such overload avoidance can also be employed independently of the non-linearity correction of the above aspects.

BRIEF DESCRIPTION OF THE DRAWINGS

Other aspects of the invention together with preferred embodiments are as defined in the claims, or as described by way of example in the following embodiments of the invention with reference to the accompanying drawings, in which:

DETAILED DESCRIPTION OF PREFERRED EMBODIMENTS

In order to give a better understanding of the invention, the structure of a device which does not embody the invention will first be discussed with reference to FIG. 1. This device is not to be taken as indicating any particular prior proposal, nor does it necessarily form part of the state of the art.

Figure 1:
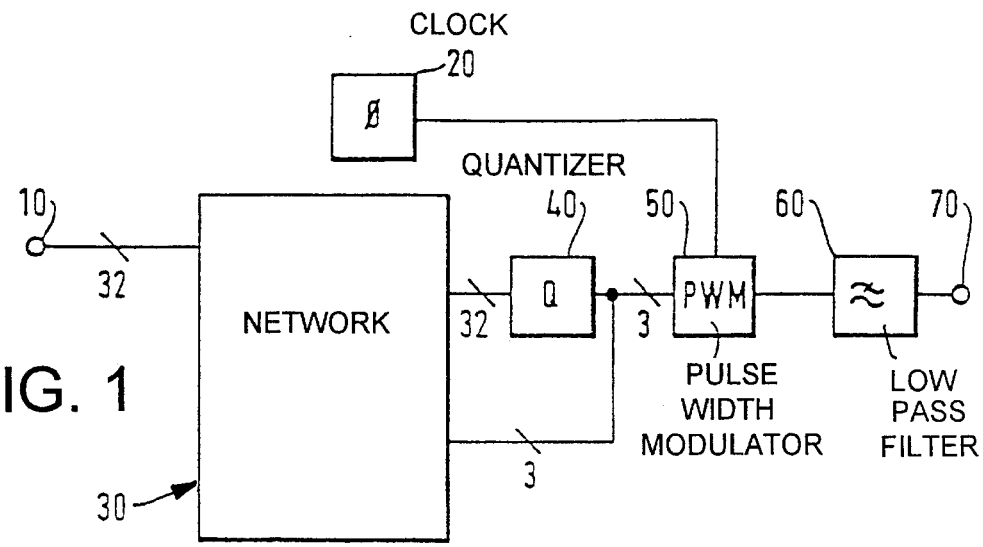
FIG. 1 shows schematically the general arrangement of a digital to analogue convertor which does not embody the invention.

Referring to FIG. 1, a digital input 10 receives a 32 bit wide data bus carrying a digital signal. The bus is clocked at a given sampling rate by a clock 20. For example, for an audio signal having a band width of 20 kilohertz, the oversampling ratio may be 64 and the sampling rate is therefore 2.56 megahertz (at least). The signal is fed to a network 30 where it is modified to take account of the quantizer noise, and the modified signal is supplied to a quantizer 40 having (usually) a linear staircase characteristic and generating accordingly a three bit output sample corresponding to each 32 bit input sample.

The output of the quantizer 40 is fed back to the network 30 to affect subsequent input samples. The three bit output of the quantizer 40 is also fed to a pulse width modulator 50 which generates, for each sample, a pulse having a fixed amplitude, and a width which corresponds to the three bit output of the quantizer. The output of the quantizer 50 is therefore a train of pulses at 2.56 megahertz each pulse having a width (and consequently a power or energy) proportional to the corresponding sample output from the quantizer 40. The analogue output line from the pulse width modulator 50 is fed to an analogue low pass filter 60 with a stop band above a threshold frequency somewhere above the audio band (eg 20 kilohertz). The low pass filter 60 integrates or averages the pulses output from the pulse width modulator 50 to provide an analogue output signal at an output port 70 which is proportional to the digital signal received to the input port 10.

Referring to FIG. 2, the network 32 may take a number of forms. In FIG. 2A the network 30 comprises a first node 31 which the quantizer error is derived by subtracting the quantizer output from its input. Since the two signals have different numbers of bits, a multiplication circuit 31A (essentially an "invense quantizer" $Q^{-1}$) is provided to match the numerical range of the quantizer output to the corresponding numerical range of the quantizer input. Where the quantizer and output are both binary and the quantizer output levels are a subset of the input levels, it is merely necessary that the three quantizer bits should be arranged to correspond to the highest order three bits of the quantizer input signal, and the multiplier 31A therefore merely comprises a circuit for appending 29 lower order bits to the quantizer output signal. In the following embodiments, the multiplier 31A will not be referred to further, for clarity, but will be assumed to be present.

The network 30 further comprises a second node 32 at which the quantizer error sample thus derived is added to the signal from the input 10; a delay stage 33 is present between the nodes 31 and 32 because instantaneous feedback is not physically practical, so the error sample must affect the next input sample.

Figure 2A:
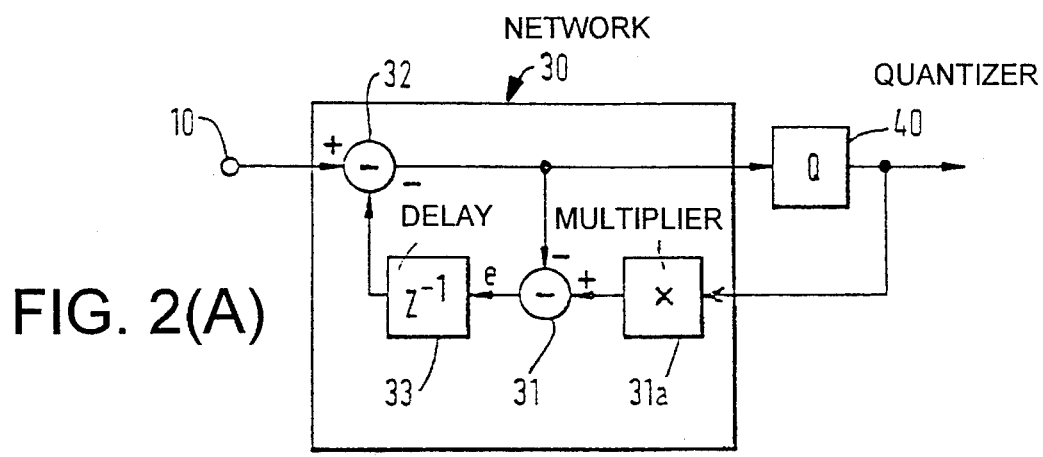
FIG. 2A shows the feedback network employed in FIG. 1 in greater detail.
Figure 2B:
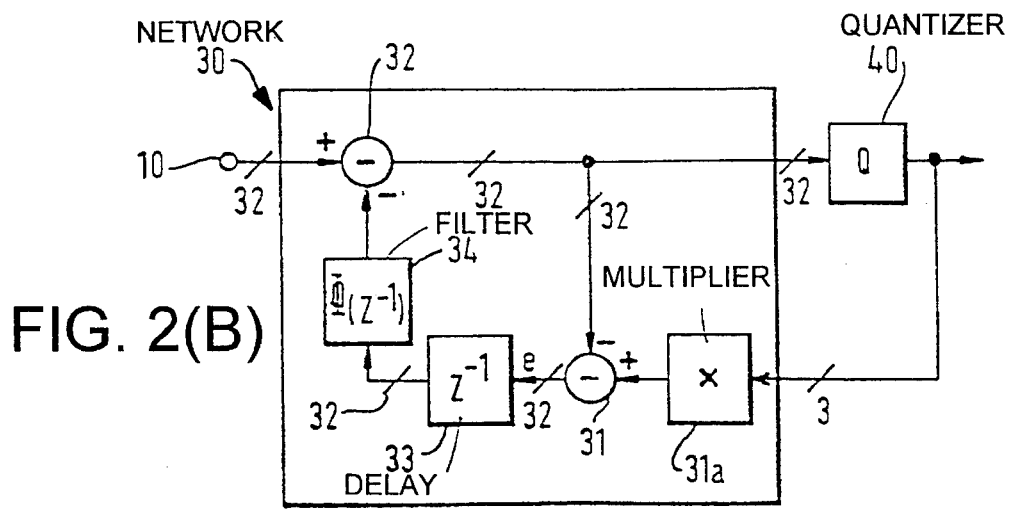
FIGS. 2B–2F show alternative arrangements of noise shaping feedback which could be used in the arrangement of FIG. 1.

Referring to FIG. 2B, a noise shaping filter 34 may be provided filtering the quantizer error signal supplied to the node 32. The effect of the filter 34 may be viewed in several ways; it can be seen as a prediction filter reducing the effects of the delay 33 inherent in the feedback oath at least over a certain band of frequency (including the audio band or other signal band of interest). It can be shown that the quantizer error now appears at the output of the quantizer with its signal spectrum shaded by a filter $\psi$ $(z^{-1})=1-z^{-1}\Phi$ $(z^{-1})$. which, for completeness, simplifies to $1-Z^{-1}$ in the simple case of FIG. 2A.

Figure 2C:
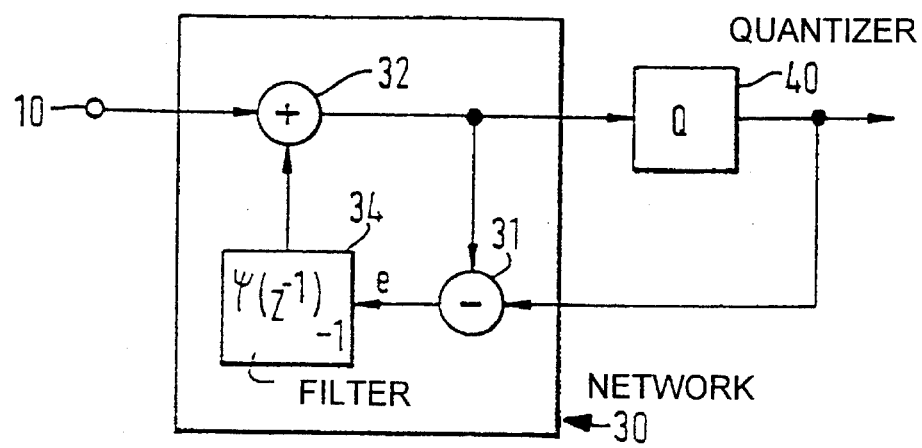
Figure 3:
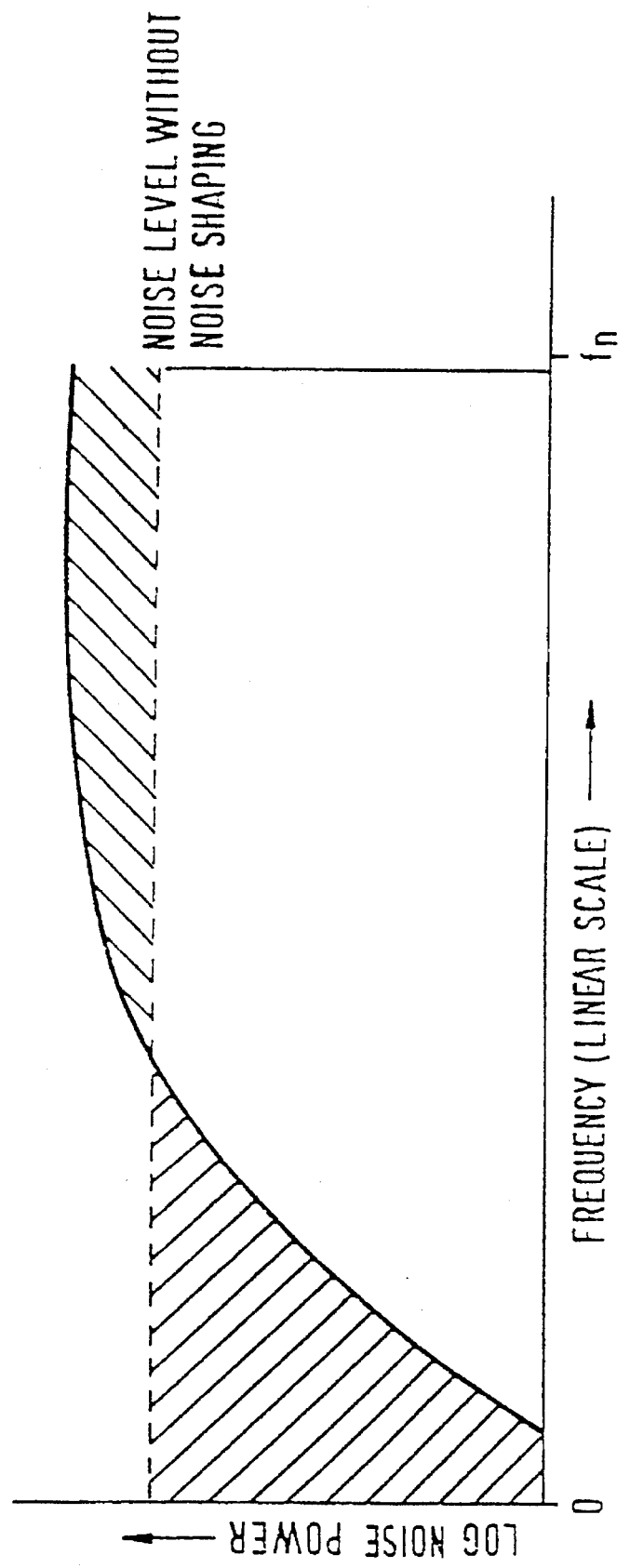
FIG. 3 shows schematically, on log power/linear frequency axes, the effects of the noise shaping of FIGS. 2A–F.

Referring to FIG. 2C, FIG. 2B can be re-drawn to include the delay 33 within the filter 34, which is generally referred to as the noise shaping filter. It can be shown (see "Optimal noise shaping and dither of digital signals", Gerzon and Craven, presented at the 87th Audio Engineering Society Convention 1989 October 18–21, pre-print available from the Audio Engineering Society) that the quantization noise can be reduced within parts of the noise spectrum but only at the cost of increased amplitude in others. The criterion proposed in that reference is illustrated in FIG. 3; essentially the spectral response curve of the noise shaping filter 34 of FIG. 2C can be varied to reduce the (log) noise power at given frequencies, but the total area under the curve remains constant. That reference also discloses that the preferred noise shaping filter is a minimum phase filter, to minimize the total integral log noise power.

Figure 2D:
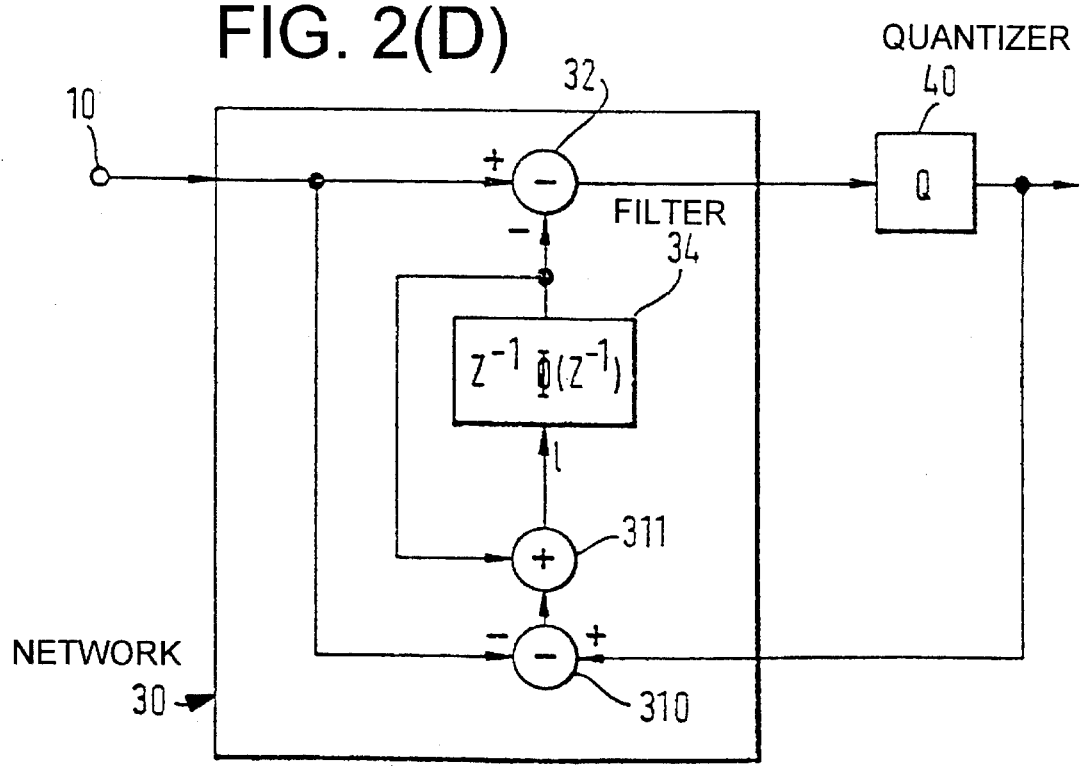

Referring to FIG. 2D, the network shown in FIG. 2B can be topologically transformed to the form shown. The node 31 is replaced by a pair of nodes 310 and 311; at the node 310, the difference between the quantizer output and the input signal is formed and at the node 311 the value of the (previous) output of the filter 34 is added, so that by comparison with FIG. 2B it will be seen that the output of the node 311 is the quantizer error signal corresponding to the output of the node 31 in FIG. 2B.

Figure 2E:
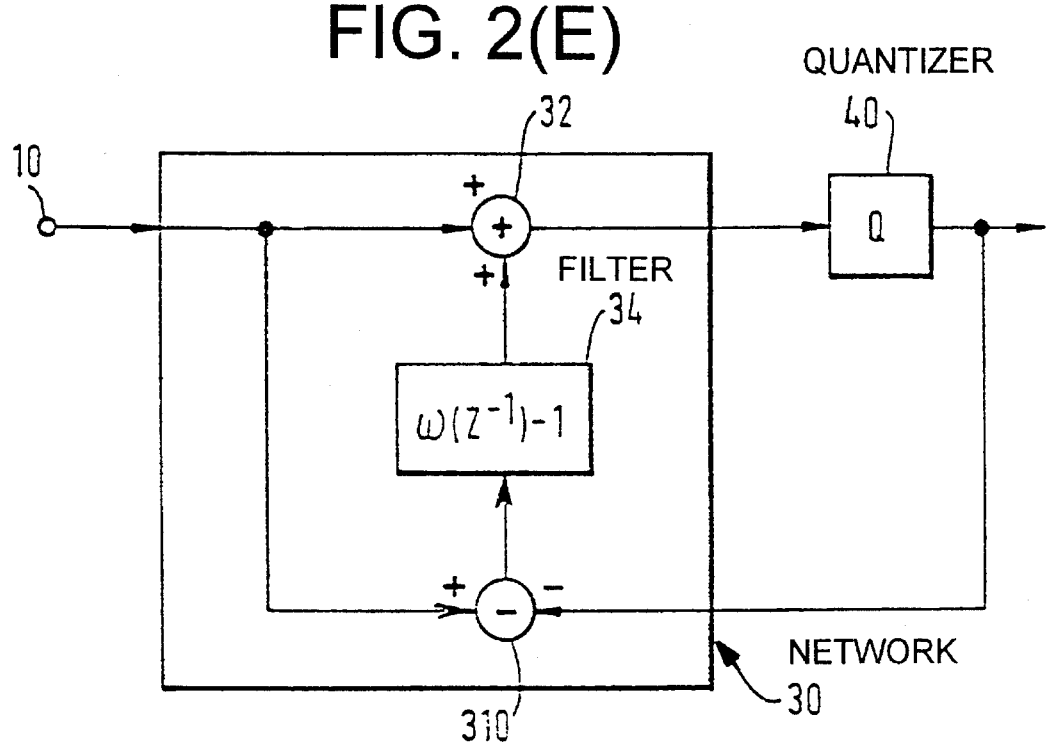
Figure 2F:
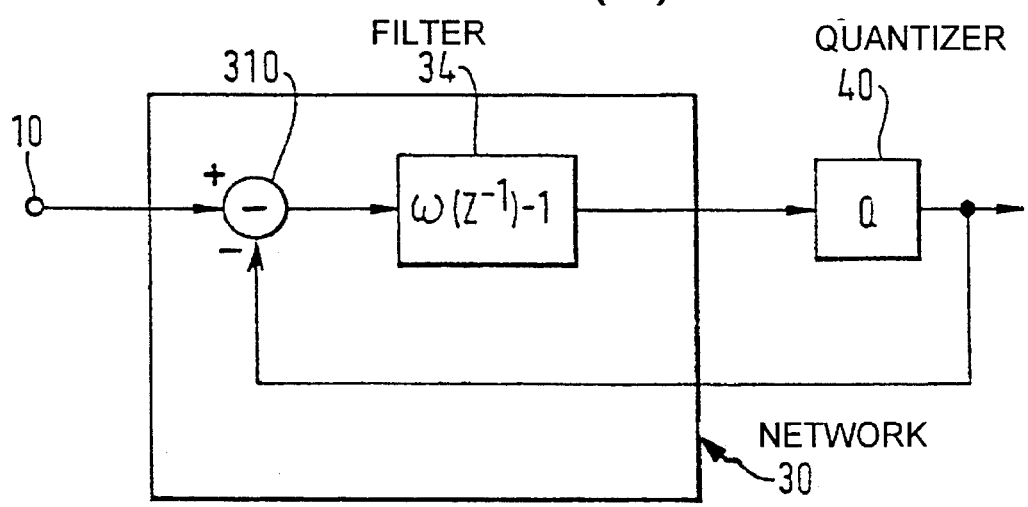

Referring to FIG. 2E, the feedback path and node 311 may of course be considered to form part of the filter 34, and if the filter transfer characteristic is denoted $W(Z^{-1})-1$, $W(Z^{-1})=1/\psi$ $(Z^{-1})$ Referring to FIG. 2F, if the path between the input 10 and the node 32 is omitted (together with that node), the network 30 need only comprise the node 310 at which the difference between the quantizer output and the input signal is formed, and the filter 34 between the node 310 and the quantizer 40. The path of the quantizer error through the modulator is unchanged, but the overall gain of the modulator on the input signal is no longer unity; the deviation will however often be insignificant within the signal frequency range. It will be seen that this structure resembles a feedback amplifier and by analogy with feedback theory, quantizer errors are reduced by a factor $W(Z^{-1})$.

The different structures of FIG. 2B to FIG. 2F are by way of example only. It can be shown that these and any other noise shaping networks 30 which employ linear filtering of the quantizer error signal and preserve unity gain (ignoring the quantizer) can be reduced to the forms of FIGS. 2B and 2E. Selection of a particular structure is determined by considerations such as the rounding errors due to successive multiplications or divisions, the number of delay stages and the overall delay. The essential feature of the network 30 is that it receives an input signal and a signal derived from the output of the quantizer (or otherwise representative of the quantizer error), and processes the input signal to reduce the effects of quantizer error within the band width of the signal. Whether or not the quantizer error is explicitly generated is a matter of convenience.

The above referenced Gerzon and Craven paper teaches, at theorem 3 thereof, the relationship between the power gain of the minimum phase noise shaping filter $\psi$, starting from the power gain as a function of frequency which it is desired to apply to the noise (i.e. with which it is desired to weight the noise); the desired power gain is, as discussed, very low in the audio band and generally avoids large peaks out of the audio band.

From this, it follows that the filter W employed in the structure of FIGS. 2E and 2F is simply a scaled version of this noise weighting function. The filter $W(z^{-1})$ may therefore be referred to as a noise-weighting filter, and the filter $\psi$ as a noise shaping filter.

Figure 4A:
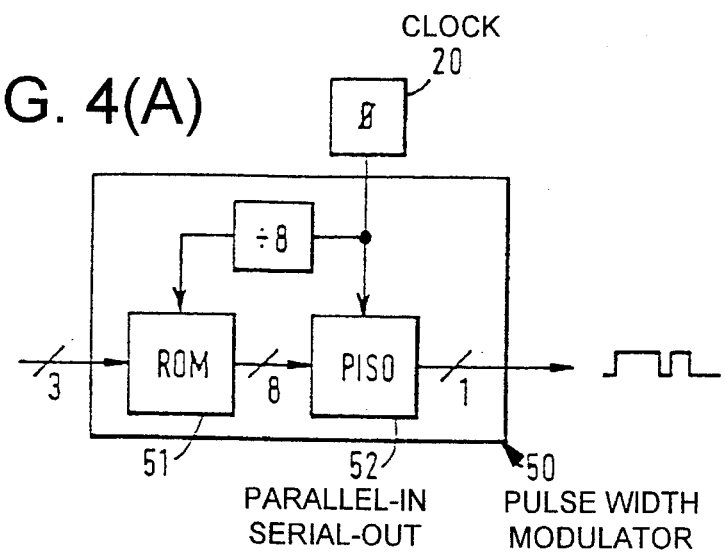
FIGS. 4A–4C shows schematically alternative arrangements of the pulse width modulator of FIG. 1.

Referring to FIG. 4, the pulse width modulator 50 will now be discussed in greater detail. The term "pulse width modulator" is here used broadly to denote any device delivering a constant amplitude output signal with variable pulse timing and includes, for example, so-called pulse length (PLM) and pulse edge PEM) modulation devices. FIG. 4A shows a first arrangement in which the three bit output of the quantizer 40 is fed to the address lines of a ROM 51.

Each word stored in the ROM is of a length equivalent to the largest number which can be represented by the quantizer output; in this case, three bits can represent up to seven different levels, so the ROM word length must be at least seven bits (and is conveniently eight bits). The contents of each ROM location comprise a word having a string of 1's equivalent in length to the number represented by the bits of the quantizer output, as shown in Table 1.

TABLE 1

| Level | Q Output | ROM output |
|---|---|---|
|  | 000 | 00000000 |
| −3 | 001 | 00000001 |
| −2 | 010 | 00000011 |
| −1 | 011 | 00000111 |
| 0 | 100 | 00001111 |
| +1 | 101 | 00011111 |
| +2 | 110 | 00111111 |
| +3 | 111 | 01111111 |

Figure 5A:
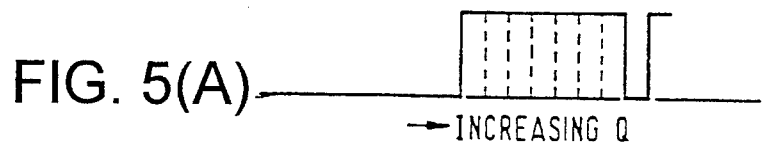
FIGS. 5A–5D shows schematically the output wave forms produced by the modulators of FIGS. 4A–C.

When the quantizer outputs a three bit number to the address lines of the ROM 51, the corresponding stored word is generated at the data output lines of the ROM 51 which are supplied to a parallel-in-serial-out convertor (or shift register) 52 which supplies a corresponding pulse comprising a contiguous train of positive bits, the pulse length thereby being proportional to the quantizer output. FIG. 5A illustrates the corresponding output of the parallel to serial convertor 52. For convenience, each pulse is separated by a blank clock period, so the output of the parallel to serial convertor is clocked at eight times the sample rate.

Figure 6A:
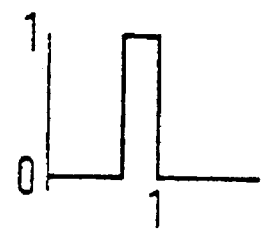
FIGS. 6A–6E shows schematically the manner in which the outputs of FIG. 5 give rise to an error.
Figure 6B:
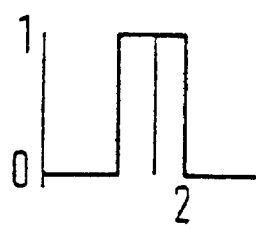
Figure 6C:
Figure 6D:
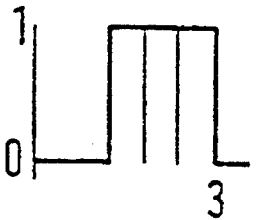

However, such a system is inherently non-linear. Referring to FIG. 6A, if a pulse of length one clock period represents a given level (say 1) and a pulse of length two clock periods represents 1+1=2, as shown in FIG. 6B, then one would predict by linear extra-polation that, in a linear system, the level 3 would be represented by the pulse shown in FIG. 6C. In fact, the level 3 is represented by the pulse shown in FIG. 6D, and the result of subtracting the two is an error pulse signal shown in FIG. 6E which is bipolar.

One effect of this non-linearity, in the arrangement of FIG. 4A, table 1, and FIG. 5A is a phase modulation of high frequency information; if, for example, a relatively high frequency signal has an amplitude of 1 quantizer level it will cause a rapid transition of pulse length between successive pulses output from the pulse width modulator 50.

However, if a relatively low frequency signal component of large amplitude is also present, the length of pulses output by the pulse width modulator 50 will increase gradually over time and consequently the position in time of the transitions (which carry the high frequency signal information) will gradually shift. In other words, the high frequency signal will suffer phase modulation in the output of the pulse width modulator 50.

Figure 4B:
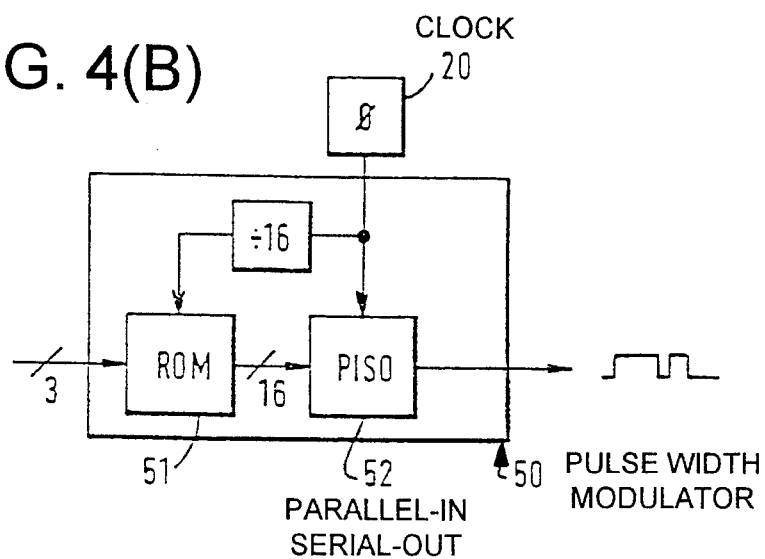

An alternative type of pulse width modulator 50 which evercomes this phase modulation is shown in FIG. 4B. The arrangement is similar, except that the ROM 51 stores 16 bit words (or, at any rate, words of a length greater than 14 bits), and the parallel-in serial-out device 52 consequently has a 16 bit length; consequently, the parallel-in-serial-out device 52 must be clocked at 16 times the digital sample rate.

TABLE 2

| Level | Q Output | ROM output |
|-------|----------|------------|
|       | 000      | 0000000000000000 |
| −3    | 001      | 0000000110000000 |
| −2    | 010      | 0000001111000000 |
| −1    | 011      | 0000011111100000 |
| 0     | 100      | 0000111111110000 |
| +1    | 101      | 0001111111111000 |
| +2    | 110      | 0011111111111100 |
| +3    | 111      | 0111111111111110 |

Figure 5B:
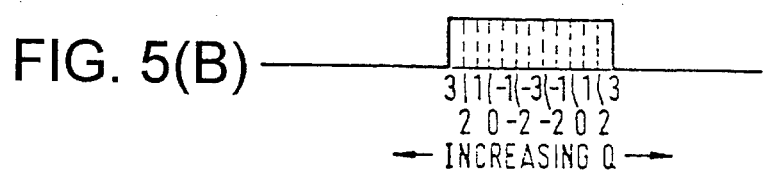

The contents of the ROM 51 are as shown in table 2, which by inspection comprises a symmetrical version of the eight bit words of table 1, so that the edges of the pulses generated by the pulse width modulator 50 are always symmetrically distributed about a fixed pulse center time, and an increase in the level of the quantizer output leads to a shift of both edges of the pulse symmetrically about the central time as shown in FIG. 5B. This eliminates the first order phase modulation due to the circuit of FIG. 4A, but leaves a remaining second-order amplitude modulation of smaller value, since the spectrum of a pulse is related to its width and consequently varies in dependence upon the quantizer output. However, the higher clock rate necessary and the finer time divisions involved are harder to achieve in practice for high precision applications.

Figure 4C:
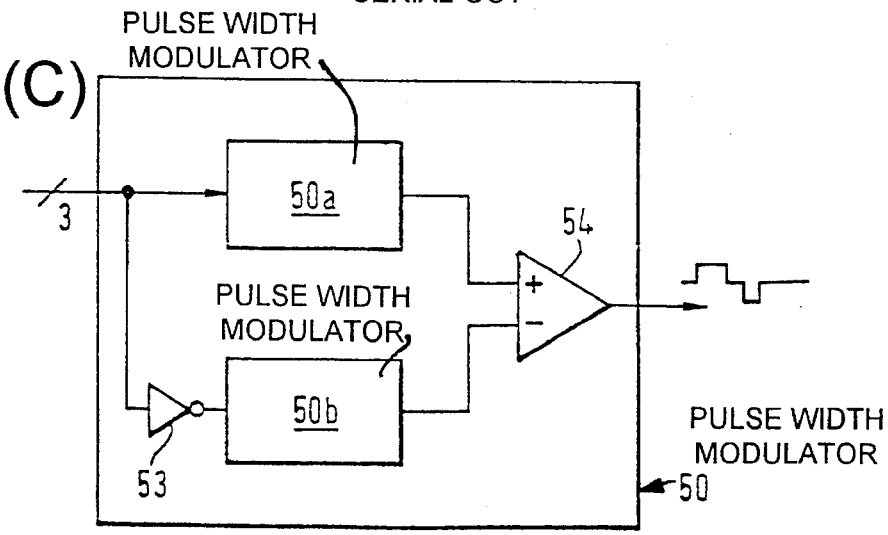

One arrangement of the pulse width modulator 50 which eliminates second order distortion is shown in FIG. 4C, and comprises a pair of circuits 50A, 50B each of the type shown in FIG. 4A, the signal from the quantizer being fed to the second circuit via a negative multiplier (e.g. 2's complementer) 53.

Figure 5C:
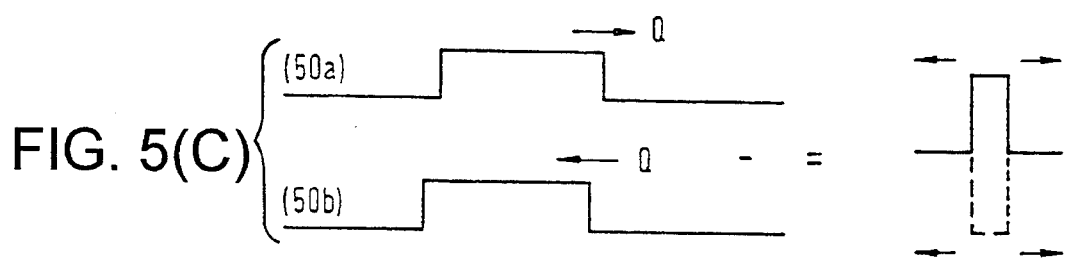

The output of the first pulse width modulator 50A is therefore a pulse whose length increases with increasing quantizer output levels, and that of the second pulse width modulator 50B is a pulse train with pulse width which decreases with increasing quantizer output level, as shown in FIG. 5C. The output of the differential amplifier 54 is therefore a pulse sequence which provides pulses which are symmetrical about a center time point, and are of positive polarity and increasing width for positive going, increasing quantizer output levels and negative polarity and increasing width for negative quantizer output levels. Consequently, the phase modulation of the circuit of FIG. 4A is eliminated and a bipolar output is obtained.

Figure 5D:
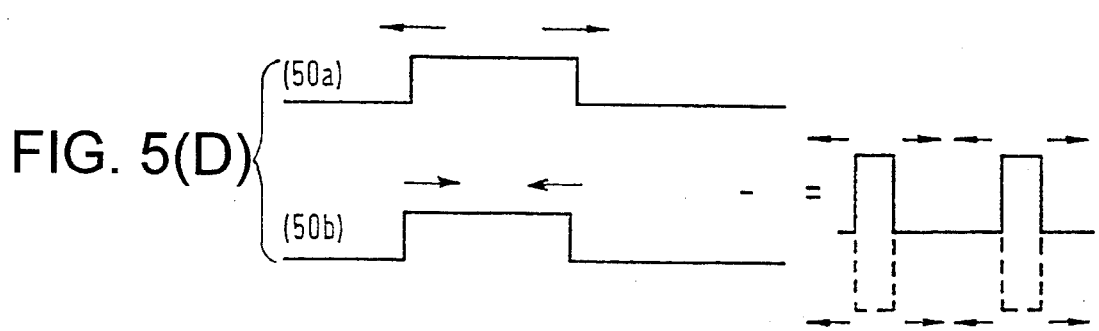

Alternatively, the two pulse width modulators 50A, 50B could be of the type shown in FIG. 4B, in which case the corresponding modulator outputs are shown in FIG. 5D.

It is of course possible to omit the negative multiplier 53 by merely providing that the ROM, 51B of the second pulse width modulator, 50B contains words which are the complementary to those of the first ROM 51A. Equally, counter circuits can be employed instead of ROM circuits and serial to parallel converters to provide the required pulse lengths.

Using a modulator of the type shown in FIG. 4C and 5D, the amplitude modulation can be shown to be only 0.01% in the worse case for a 64× oversampled system, which corresponds to noise in the 14th bit, and for many applications this is acceptable.

However, we have discovered a problem hitherto ignored in the prior art. The problem is that because the quantizer noise, which will have been shaped by the noise shaping filter 34 to lie substantially out of the signal band of interest, is still present at the input to the pulse width modulator 50 the non-linearity of the pulse width modulator 50 will give rise to intermodulation between the quantizer noise and the signal, and to an even greater extent between different frequency components of the quantizer noise, some of which will lie within the signal band, in other words, the non linear stage following the quantizer effectively re-introduces quantizer noise back into the signal band. Even high order noise shading filtering which shifts quantizer noise completely out of the signal band suffers this distortion; reducing noise amplitude within the signal band leads to increased amplitudes outside the signal band as shown in FIG. 3 and consequently can increase the inter modulation noise generated by the pulse width modulator.

FIRST EMBODIMENT—DIGITAL TO ANALOGUE CONVERTOR

To eliminate this problem, in this embodiment, we employ feedback corresponding to the output of the pulse width modulator. However, it will be apparent that in the circuit of FIG. 1 this is not directly possible. Since the signal representation used by the pulse width modulator 50 is fundamentally different to that used in the preceding circuit, errors illustrated in FIG. 6 do not occur at sampling instants of the preceding circuit, but instead at sub-divisions between sampling instants. Accordingly, instead of employing an actual feedback path from the output of the pulse width modulator 50, in this embodiment of the invention a corresponding signal representing, over the audio band, the error generated by the pulse width modulator but at a plurality of sampling intervals, rather than at one point lying between intervals, is employed to correct the signal input to the pulse width modulator 50.

It is possible to predict what the error output by the pulse width modulator will be from a sample or samples to the input to the pulse width modulator. Because the signal output by the quantizer 40 and input to the modulator 50 is crudely represented by only a few bits, the correction for the pulse width modulator 50 cannot be effected at the quantized signal, and is fed back instead to the unquantized signal, prior to the quantizer 40 for correction. Although one previous proposal (not forming part of the state of the art) has suggested modifying the input to a pulse width modulator to overcome the distortion produced in its output, none has suggested doing so using feedback (in other words, correcting a given input sample to the pulse width modulator in dependence upon the distortion in the output pulses which correspond to preceding input pulses).

Because the pulse width modulator 50 produces a non linear distortion, linear feedback between the input and the pulse width modulator 50 and the input to the quantizer 40 cannot represent the error at the output of the pulse width modulator 50. Accordingly, in this embodiment of the invention, the network 30 includes at least two non-linear stages, the non-linearity being arranged to simulate that of the pulse width modulator 50. The effect in the audio band is thus just that of an identical modulator in the feedback path, which is equivalent to feedback from the modulator output itself.

Referring to FIG. 7, the nature of the non-linearity will now be explained. FIG. 7A shows a bipolar error pulse of the same general type as that shown in FIG. 6E, arising from a given pulse width modulator output. The error pulse occurs in between two quantizer sampling instants $X_i$, $X_{i+1}$, and is of a much shorter time duration than the time between those sampling instants.

Figure 7A:
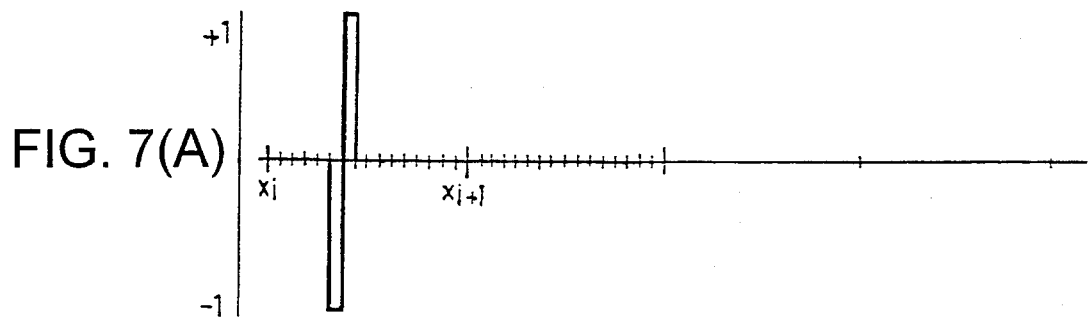
FIGS. 7A–7F illustrates the manner in which, according to one embodiment of the invention, the error of FIG. 6 may be represented for correction.
Figure 7B:
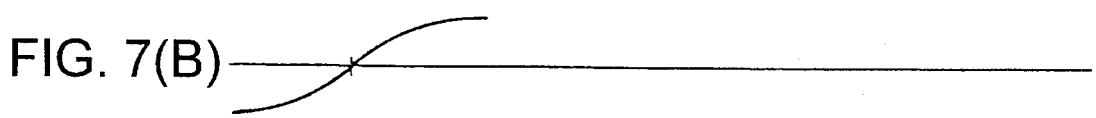

However, when the error pulse is filtered by the low pass filter 60, only those components lying within the signal band of interest will remain; this will lead to a much gentler transition shown in FIG. 7B. This implies that it is possible to feed back that portion of the pulse width modulator error which lies within the signal band of interest by providing, at sampling points $X_i$ and $X_{i+1}$, the lower amplitude pulses shown in FIG. 7C.

One method which can be employed to derive the required pulse amplitudes at sampling points is "moment analysis"; in this context, the zeroth moment is the signal amplitude integrated over time; the first moment is the integral over time of the signal amplitude weighted by a linear function of time; and in general the n-th moment is $\int t^n f(t) dt$.

In this context, if the lower order moments of two signals match, it is likely that their low frequency components likewise match. What is required is to select a sequence of pulses at sampling instants which match the spectrum of the error pulse FIG. 7A over the signal band width of interest.

Alternatively, pulses can be selected which match the pulse width modulator output (in the audio frequency band) rather than the error pulse.

Referring to FIGS. 7A, 7C, 7D and 7E, all four signals shown have symmetrical positive and negative amplitudes and consequently have a zeroth moment of zero. Assuming the width of each of the positive and negative pulses in FIG. 7A is 1/16 the sampling interval between $X_i$ and $X_{i+1}$, the first order moment of FIG. 7C matches that of FIG. 7A if the pulse amplitudes are selected as 1/32, and those of FIGS. D and E if the pulse amplitudes are selected as 1/16. With these values, the second moment of FIG. 7C approximately matches that of FIG. 7A. However, the second moments of FIGS. 7D and 7E have progressively greater errors. In general, an error occuring between sampling instants can be better represented as corresponding impulses at sampling instants both before and after the error.

Figure 7C:
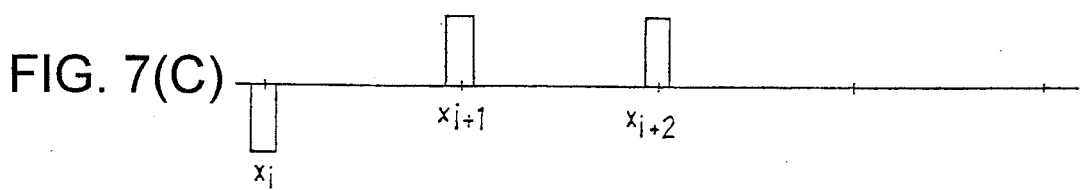
Figure 7D:
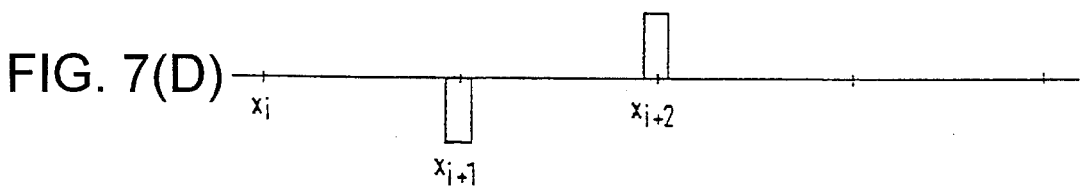
Figure 7E:
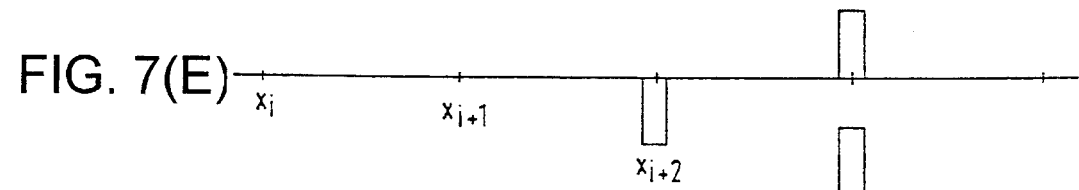
Figure 7F:
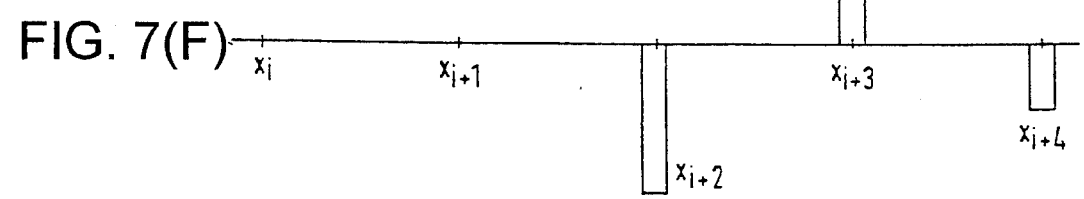

However, referring to FIG. 7F, it is possible to simulate the pulse of FIG. 7A with a train of pulses occuring at sampling instants after the error to a desired degree of accuracy by adding further pulses; the pulses in FIG. 7F match the error pulse in FIG. 7A over zeroth, first and second moments where the coefficients are approximately −5/32, 8/32, and −3/32.

It will be apparent from consideration of FIG. 6 that the position in time between sampling instants $X_i$ and $X_{i+1}$ of the error pulse will however vary depending upon the value of the signal input to the pulse width modulator 50 giving rise to a corresponding output pulse edge position. Accordingly, for each separate pulse width modulator input (and corresponding pulse width modulator output error pulse) a different pulse representation signal of the type shown in FIGS. 7C–7F is required, and as the modulator error pulses are not linearly related, the correction signal sequences are not linearly related either.

Figure 6E:
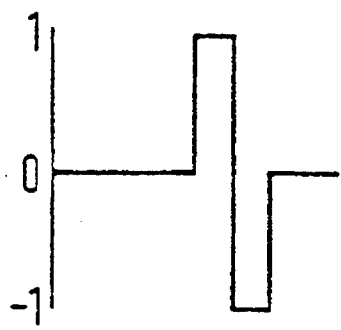
Figure 8:
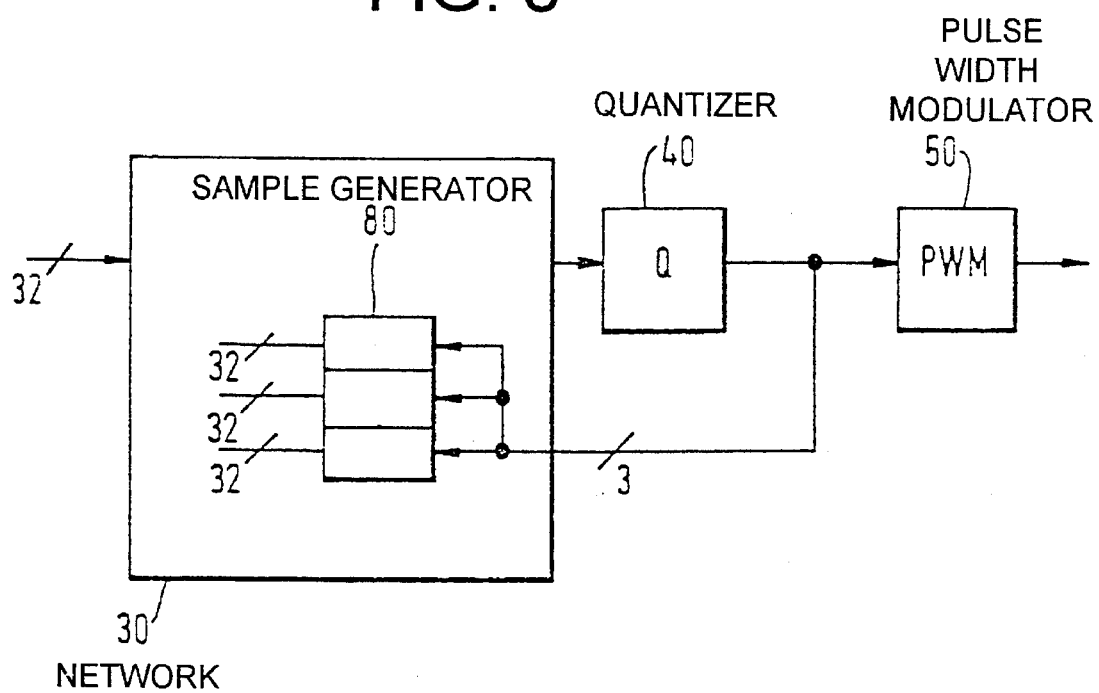
FIG. 8 corresponds to part of FIG. 1 and illustrates an analogue to digital convertor according to a first embodiment of the invention.

Referring to FIG. 8, in this embodiment, the network 30 of the apparatus of FIG. 1 therefore includes a sample generating circuit 80 for receiving a signal derived from the output of the quantizer 40 (and consequently related to the signal to the input to the pulse width modulator 50), and to generate in response to each sample of that signal at least two output samples the values of which are non-linearly related to the input sample, which are fed back to affect different signal input samples to compensate for the non-linearity of the pulse width modulator 50. At least two pulses are generally required to correct the pulse width modulator, because its output error is, as shown in FIGS. 6E and 7A, bipolar, and occurs between sample instants.

A more rigorous method of deriving the amplitudes of the pulses to be generated and fed back by the means 80 will now be discussed with reference to FIG. 9A. The pulse width modulator 50 is controlled to output only a discrete number of different pulse lengths corresponding to the number of different levels of the quantizer 40, and each different pulse length has a corresponding error pulse E of the general type shown in FIG. 7A but at a different point in time between sampling instants. For each of the pulse width modulator output pulse lengths, the error pulse is calculated. If the pulse width modulator 50 also includes analogue distortions, these (and any other analogue distortions present in the following circuitry) may be measured, for example on an oscilloscope, so that the error pulse representation shown in FIG. 7A is physically accurate.

Next, the spectral amplitude and phase components of the pulse at a set of frequencies across the signal band width are obtained, by calculating the Fourier integral of the pulse at each frequency. This provides a set of complex numbers, one for each frequency. Next, for a predetermined number of sampling instants, a set of pulse amplitudes are derived to minimize the difference over the set of frequencies, between the spectral responses of the set of pulses and the error pulse. The set of pulse amplitudes yielding the minimum difference, and consequently representing the closest match to that error pulse E over the signal band of interest is stored for subsequent use. The process is repeated for each error pulse corresponding to each pulse width modulator input or quantizer output, so that the result is a plurality of stored pulse sequences, one for each quantizer 40 output level. The pulse sequence generator 80 can consequently comprise a plurality of look up tables, one for each output impulse in the sequence, realized for example as ROM devices, to the address lines of each of which the quantizer output (or the pulse width modulator input) is connected, generating corresponding high precision (32 bit/pulse amplitudes at their data output lines, which are subsequently delayed by different numbers of sampling instants to provide a fed back pulse sequence of the type shown in FIGS. 7C–F.

Figure 10A:
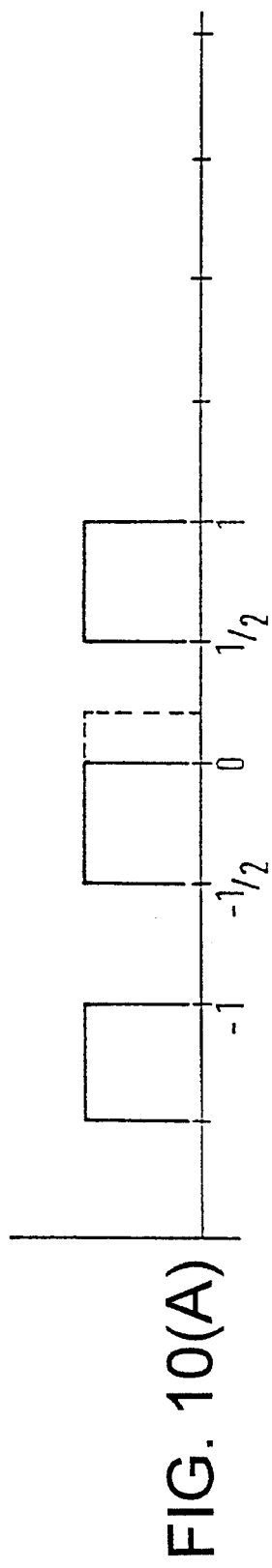
FIGS. 10A–10C show shows schematically a further example of a pulse representation of the kind illustrated in FIG. 7.
Figure 10B:
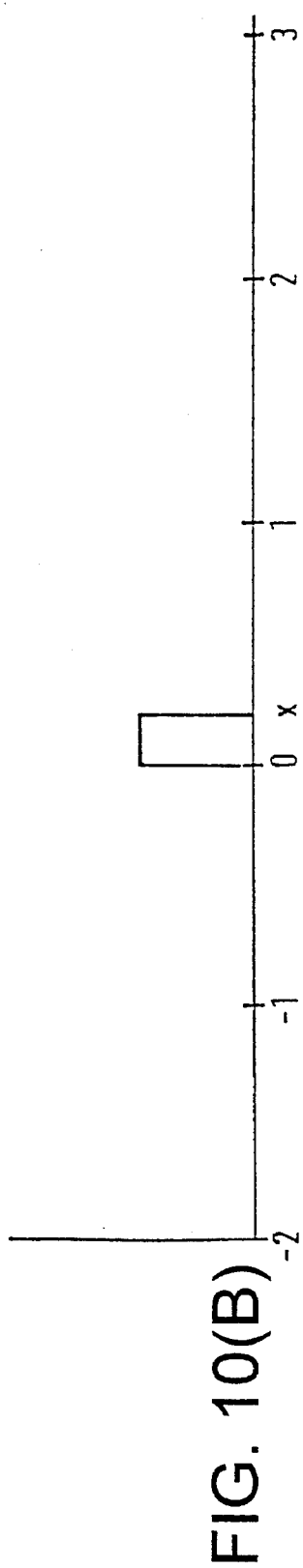
Figure 10C:
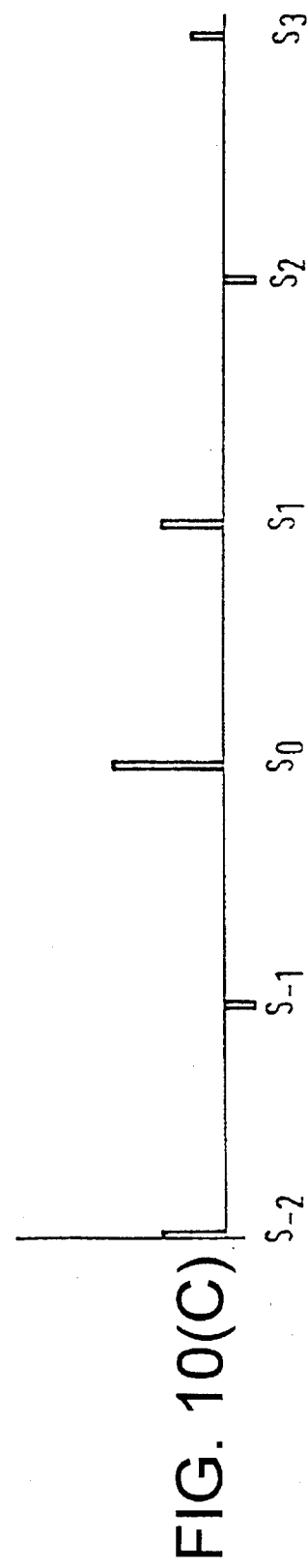

One particular example of pulses selected to match the PWM output may now be illustrated; considering for simplicity the single pulse edge modulator of FIG. 4A, and FIG. 5A, with an input of zero the pulse width modulator 50 produces a square wave output with a mark: space ratio of 1:1, as shown in FIG. 10A. When the modulator has an input X ($-\frac{1}{2}<X<\frac{1}{2}$), the falling edge occurs at Lime X. Relative to the square wave, this causes an output which is a rectangular pulse Ro,x of unit height shown in FIG. 10B, with a rising edge at t=o and a falling edge at t=x. The pulse has a Fourier integral at a given frequency (angular frequency) w given by:

$$F_E = \int_{-\alpha}^{+\alpha} R_{o,x}(t) e^{iwt} dt = 1/iw(e^{iwx} - 1)$$

It is desired to simulate the effects of this pulse by a sequence of sampled pulses $S_{-m}, \ldots S_{-1}, S_{-o}, S_1, \ldots, S_n$. A small number of sampling instants are generally sufficient; in this case m=n=3. The corresponding Fourier integral at the same angular frequency w of this pulse sequence is given by:

$$F_s = \Sigma_k{}^n{}_{=-m} S_k e^{iwk}$$

Twenty frequency values, distributed along a Chebyshev curve over the frequency range o to $w_{max}$ are selected;

$$w_r = w_{max} \cos((r-\tfrac{1}{2})\pi/40), r=1 \ldots \ldots \ldots 20$$

with $w_{max}$ at one eighth the sample rate, or n/8 times the signal range of interest, (where n is the oversampling ratio), and the pulse amplitudes are determined so as to minimize the sum of squares:

$$\sum_{r=1}^{P} wr |F_s(W_r) - F_e(W_r)|^2$$

which is a linear least squares problem which can be solved by a number of standard mathematical numerical methods (eg Normal Equations, Gram/Smidt Orthogonalisations, Householder transformations, Givens Rotations). In the extreme case X=½ (which is the largest possible error) the seven co-efficients $S_{-3} \ldots S_3$ have values;
−0.00167358, 0.01392784, −0.06035764, 0.44550219, 0.11979604, −0.01926685, 0.00207181

With these values the error between the pulse sequence $S_{-3} \ldots S_3$ and the PWM output waveform to which they correspond is on the order of 10 in the signal band. The above values may be compared with;
0,0,0,−0.5,0,0,0
which would represent a pulse width modulator exhibiting no non-linearity.

The range 0-$w_{max}$ over which the pulse sequence is matched to the PWM output pulse may be slightly larger than the signal band of interest; for example 1.5–2 octaves in excess thereof, but can be equal to the signal band.

A similar methodology can be employed for any other type of non-linear distorted output produced, for example, by the modulation signals shown in FIGS. 5B–D.

Other methods of deriving the amplitudes of the pulses may be employed; for example, it may be desirable to employ more correction pulses than are necessary for correction within the audio band, so as perform some out of band correction and thus avoid potential instability problems.

Also, since the "past time" correction impulses $S_{-1}$, $S_{-2}$ etc are progressively less accurately applied to the input signal (since they are applied to following samples rather than previous samples, via increasing more truncated noise shaping) the process of deriving the pulses may take this into account; in this case, the Fourier integral $F_s$ for each pulse $S_k$ where k is negative may be multiplied by the frequency response of the noise shaping feedback through which that pulse is applied to the input signal, thus taking account of the lower correction accuracy for such "past time" pulses where apparatus of the form of FIG. 12 is employed.

The above sequence simulates the PWM output pulse itself; the "moment analysis" method previously described provides a sequence of pulses corresponding to the error between these and the input to the quantizer, and hence the $S_o$ pulse differs in the two cases by the value of the input signal.

Figure 11A:
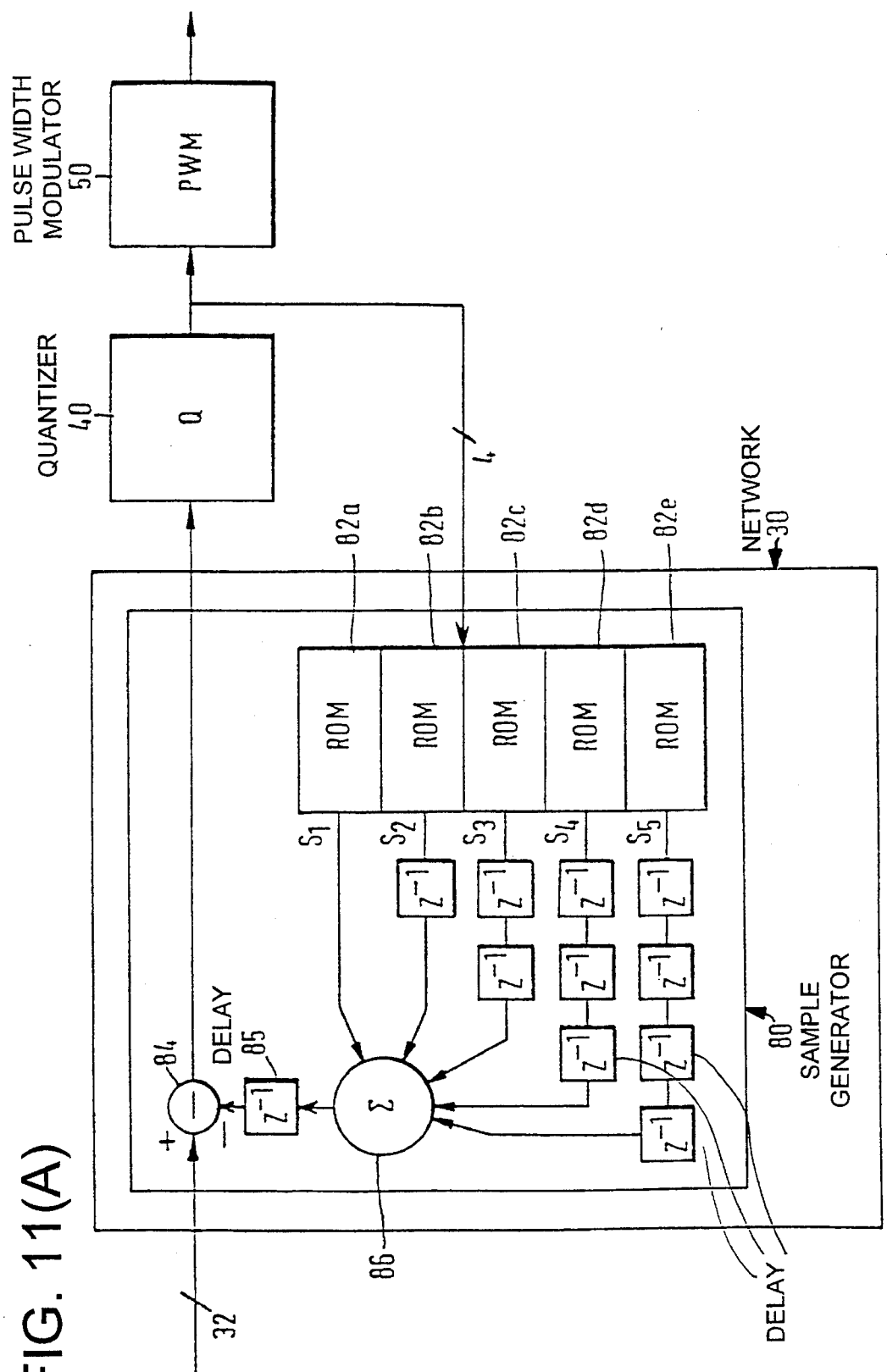
FIGS. 11A–11C illustrate alternative arrangements of a first type of digital to analogue convertor in the first embodiment of the invention shown in FIG. 8.

Referring to FIG. 11A, all the correction pulses may be derived for sampling instants $S_1, S_2, S_3, S_4, S_5$ which follow the error pulse (in other words, the pulse amplitudes are calculated to compensate the error generated in one sample passing through the pulse width modulator 30 by varying the magnitude of successive samples).

The non-linear correction signal generator 80 may therefore comprise a look-up table device (eg a Read-Only Memory or ROM) storing a set of look-up tables 82A–82E each addressed by the word fed back from the output of quantizer 40, each generating a corresponding multi-bit feedback sample $S_1, S_2, S_3, S_4, S_5$ on its data lines.

Figure 9A:
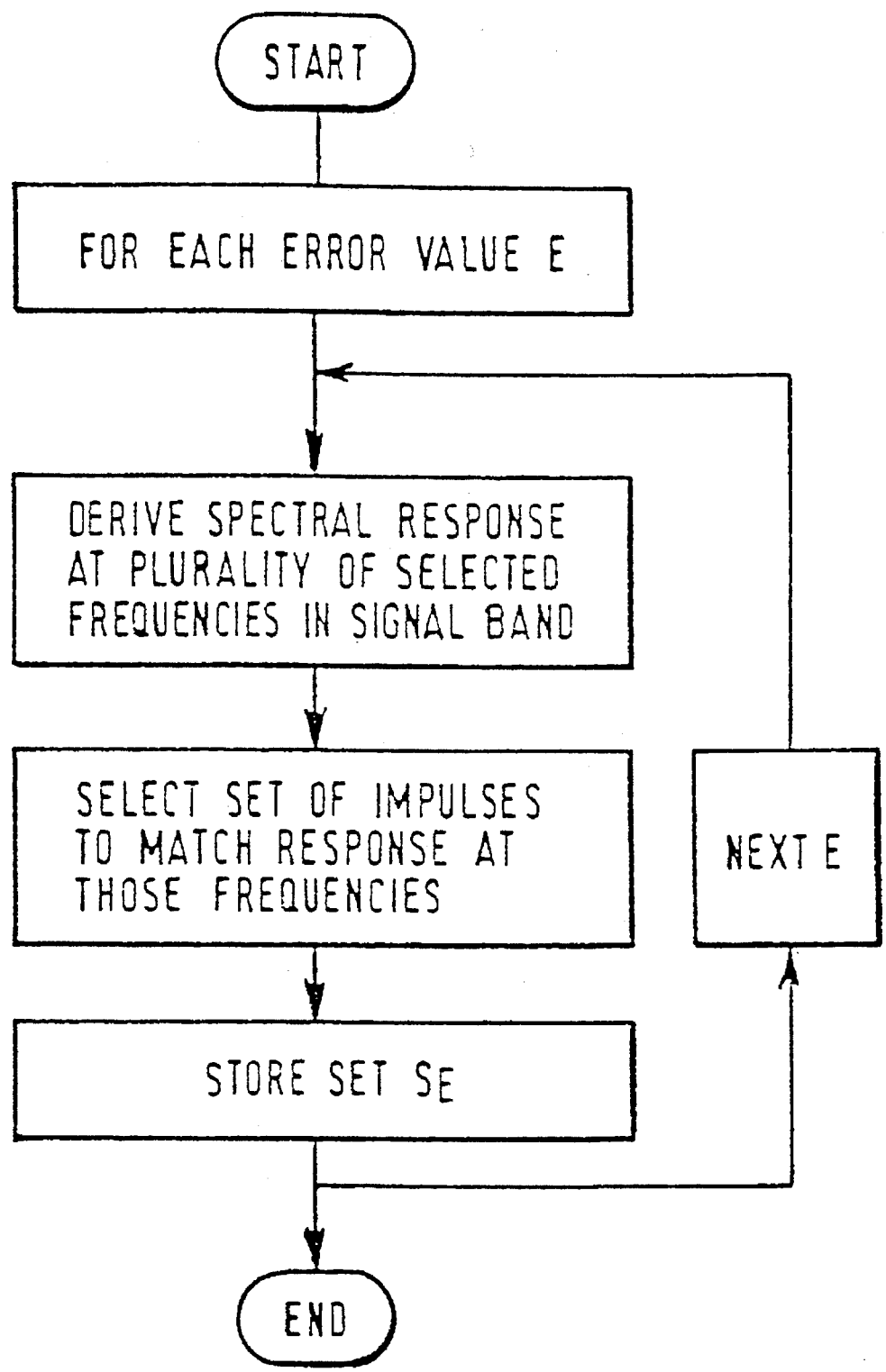
FIG. 9A shows schematically a method of deriving the representation according to FIG. 7 for use in the arrangement of FIG. 8.

Each of the look-up tables 82A–82E contains a sequence of values of impulse amplitudes for a particular sampling instant following the error pulse, calculated generally according to FIG. 9A or derived from some other method.

The first impulse value $S_1$ is the correction pulse amplitude for the next sampling instant, and consequently is fed back and subtracted from the incoming digital signal at a subtraction node 84.

Because feedback is not instantaneous, the inevitable one sample delay 85 is required. The value $S_2$ from the second ROM 82B corresponds to the error pulse to be added to the next sampling instant, and is therefore delayed and fed back (via a summing node 86 and delay 85) to be subtracted from the next sample at the subtraction node 84.

Similarly, the numbers $S_3$ $S_4$ and $S_5$ from the ROMS 82C–82E are likewise fed back by corresponding numbers of delay stages to be subtracted from later occurring input samples. The correction subtracted from a given input sample at the node 84 therefore corresponds to the amplitude $S_1$ generated in response to the error in the pulse width modulator output corresponding to the preceding input sample, the amplitude $S_2$ of the modulator error corresponding to the sample before that, the amplitude $S_3$ corresponding to the modulator error generated in response to the sample before that, and so on.

Figure 11B:
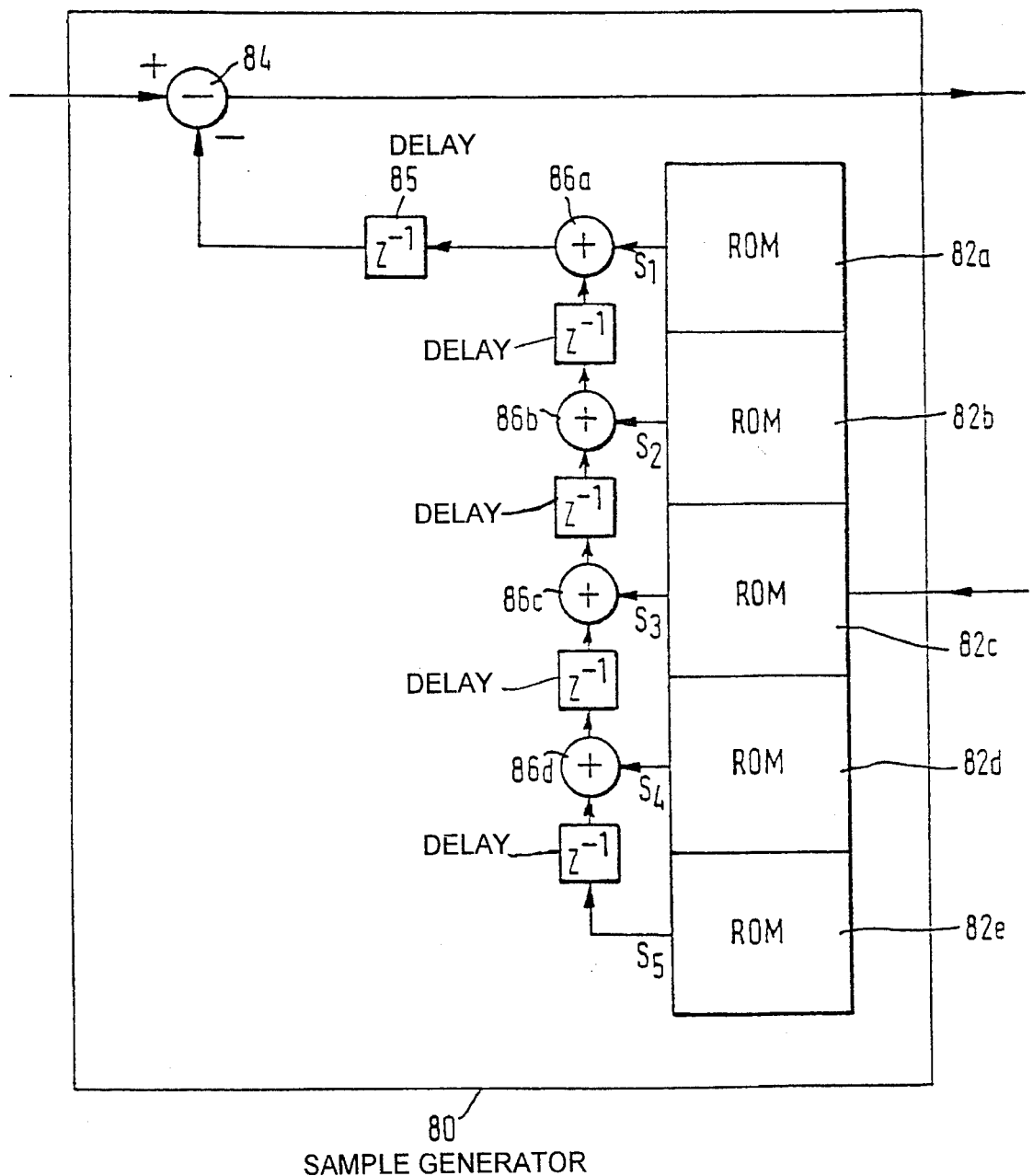

Referring to FIG. 11B, the summing node may be replaced by cascaded adders 86A–86D, and the separate delay paths by a single delay chain.

Figure 11C:
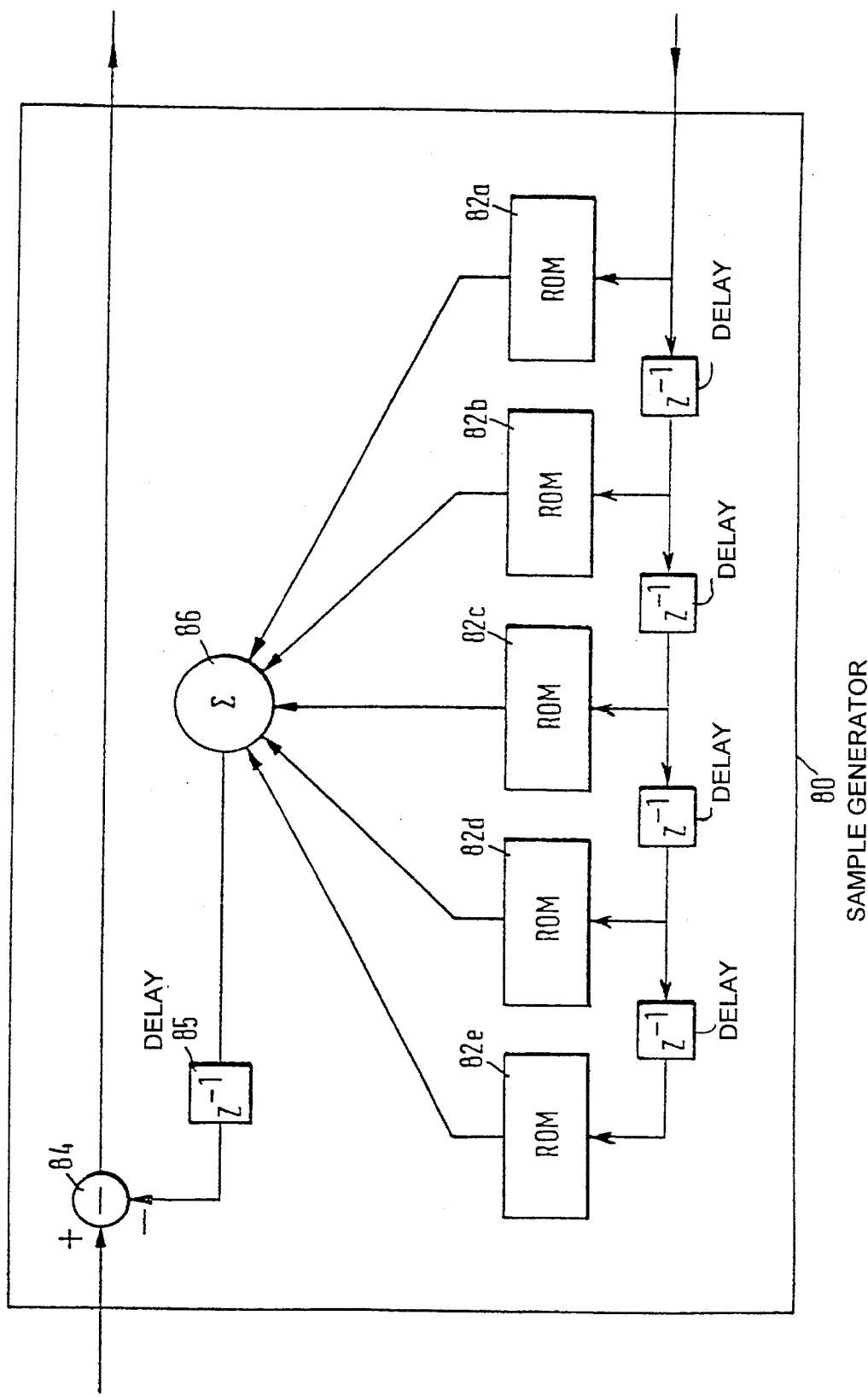

Referring to FIG. 11C, it is equally possible to rearrange the look-up tables 82A–82E as a plurality of separate ROMS connected to the taps of a delay line and summed at a summing node 86. The similarity to a conventional filter structure will be apparent, but since the contents of the look-up tables 82A–82E are necessarily non-linear, the network 80 does not behave as a linear filter except under the rare circumstance where the quantizer output level remains constant over time.

From the adore examples, many other specific arrangements of the network 80 will be apparent to the skilled man; the components cannot be interchanged as freely as in a linear system, however, without re-calculating the contents of the look-up tables to execute different non-linear functions (for example, the difference between the error pulses to be output at successive instants).

In the above described embodiments, therefore, the correction for the PWM non-linearity is effected by calculating an audio band simulation of the PWM output pulse for each sample, the simulation comprising only sample pulses occurring later than the sample giving rise to the PWM output. A plurality of such later simulated pulse samples are provided from a non-linear function generator (e.g. ROM), differentially delayed by either a preceding or a following delay chain, and thus adding to corresponding input samples occurring after that which gave rise to the PWM output sample.

Viewed in another light, each input sample is modified by the addition of a plurality of differentially delayed samples representing portions of a corresponding plurality of preceding PWM output samples, provided by the non-linear generator (e.g. ROM).

The same effect could be achieved by positioning the delay chain in the forward signal path and adding the samples between delay stages.

The above described embodiments of FIGS. 11A–11C are effective where the contents of the look-up tables 82A–82E are calculated, as in FIGS. 7E and 7F, to compensate the error pulse by affecting subsequent input values only. It will be recalled that the correction of the type shown in FIG. 7C in which the error pulse is calculated to be corrected on both earlier and subsequent input samples, in general gives a better correction for an equal number of correction samples. Consequently, this would be preferable since it would lead either to fewer delay and calculation stages, or to greater accuracy for an equal number thereof than the embodiments of FIGS. 11A–11C.

Unfortunately, it is not physically possible to effect a correction upon input samples which have already passed through the quantizer 40, and pulse width modulator 50, and are hence no longer available. This problem is solved, in a preferred embodiment to the invention, by executing the correction upon later input samples, but rather than directly subtracting the correction pulses (that is, $S_{-i}$) as above they are first filtered by a prediction filter which compensates the effect of this necessary delay in the correction over the signal band of interest; in other words, the pulse width modulator correction samples $S_{-i}$ are noise shaped whilst being employed to adjust subsequent input sample values. In principle any of the various noise shading topologies shown in FIGS. 2B–F could be employed, but because the different correction pulses $S_{-1}$, $S_{-2}$ etc are to be applied to samples following that for which they were derived by different numbers of sampling instants, they require different prediction filters to compensate accordingly for the corresponding different delays.

Figure 12A:
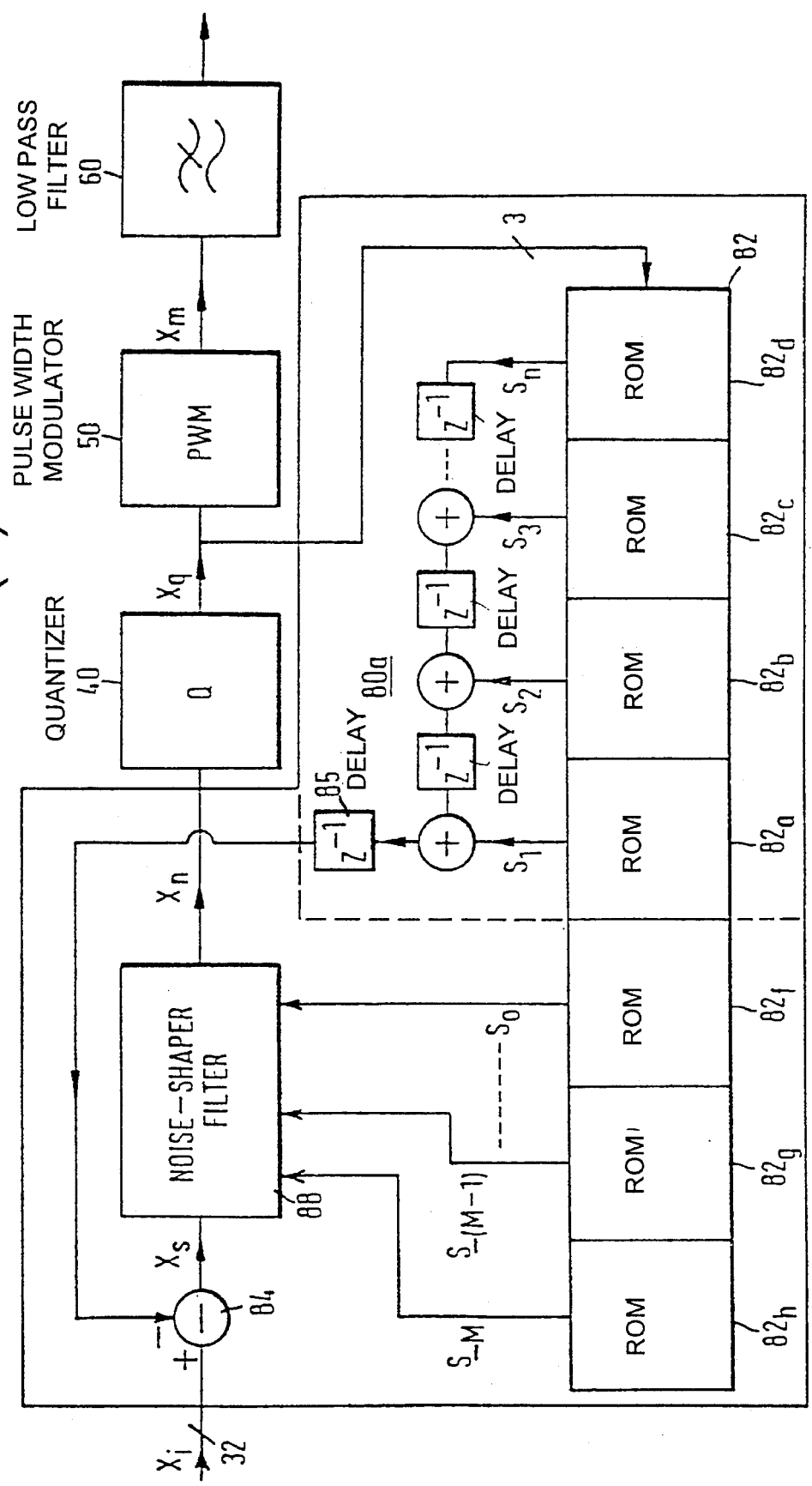
FIG. 12A shows schematically the arrangement of a second example of a digital to analogue convertor according to the first embodiment of the invention of FIG. 8.

Referring to FIG. 12A, in such an embodiment, the feedback network 30 includes a first network 80A (of the type shown in FIG. 11B, except that the subtraction node 84 has been displaced to the left of the diagram) in which the values of those correction pulses $S_1, S_2, S_3 \ldots S_n$ calculated to effect future input samples are delayed, combined, fed back and subtracted at the node 84. The values of the impulses ($S_0$, $S_{-1}$, $S_{-2}$, $S_{-m}$) which correspond to the input sample giving rise to the error ($S_0$), and preceding input samples ($S_{-i}$) are also stored in corresponding look-up tables 82F–82H addressed by the quantizer output or pulse modulator input) and are fed through a noise shaping filter network 88 to modify the input samples. As shown, the noise shaper filter 88 is positioned in the signal path (in the manner of FIG. 2F) to ensure that the fed back signal representing the pulse width modulator error is shaped to compensate the delay necessitated by the impossibility of directly correcting past input samples.

It will equally be apparent that although, notionally, the non-linear feedback structure for compensating the pulse width modulator non-linearity could form a separate feedback network to the filter 34 employed to shape the quantizer noise, this would in practice lead to substantial duplication of components and is unecessary. However, it is not immediately apparent how to combine the two since the conventional noise shaping filter corrects the quantizer output error for each sample, insofar as is possible on the next whereas in this embodiment, samples $S_{-m}$ need to be delayed by several instants before being applied to correct input sampler.

By inspection of FIG. 7A and 7C, and reconsideration of the moment analysis discussed above, it will be apparent that where source pulses are applied earlier (i.e. to more delayed input samples) the overall pulse amplitudes are lower than where, as in FIG. 7F, all correction is applied in future time. Consequently, the amplitude of the fed back pulses can be kept low and this is advantageous in preventing inadvertant overloading of the quantizer 40 (which can take place if the sum of the input sample and the correction exceeds the highest or lowest level of the quantizer) and hence reducing quantizer distortion.

Considering the noise shading filter 88 as a plurality of filters, each filtering one of the correction samples $S_0$, $S_{-1}$ . . . $S_{-m}$, the impulse response the first ($S_0$) is of the same type as in conventional noise shaping filters. There is an unavoidable unit delay in the feedback network, which the filters all attempt to compensate. In addition the later filters for $S_{-1}$ etc attempt to compensate progressively longer delays in as these samples should have been added.

Because of this, the correction applied through each of these filters cannot be complete; the initial part of the low frequency component of an error (that is, between the moment of its occurrence and the delayed time when the correction commences) goes uncorrected. Thus, considering each delayed pulse $S_{-1}$, $S_{-2}$ to be filtered by a delayed noise weighting filter W1, W2 etc, the impulse response of each such delayed noise weighting filter preferably therefore corresponds to that of the noise weighting filter W but with the first term (for W1) or first i terms (for Wi) truncated to 0, since this is the best noise shaping which can be achieved. For comparison, if a conventional noise shaping filter with a delay of one sample gives 18 bits of error reduction over the signal band, noise shaped correction delayed three stages can give approximately 15 bits of error reduction. Delayed noise shaping filtering, as in this embodiment of the invention, does not correct as fully as conventional noise shaping filtering applied to the next sample, but where, as at present, other advantages are gained from delaying the correction the penalty for doing so may be acceptable. It will be apparent that the technique could be applied to other circumstances where a linear or non-linear fed back signal is for some reason to correct a subsequent sample other than the next.

Figure 13:
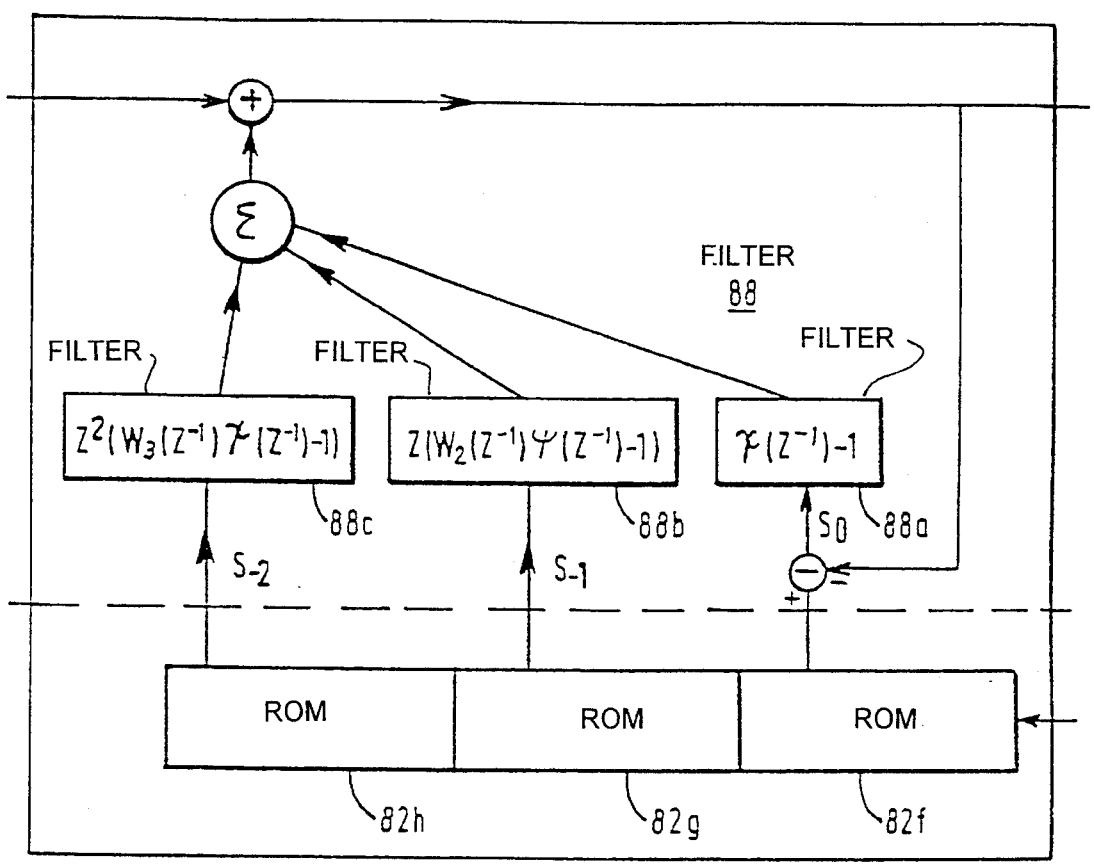
FIG. 13 shows in greater detail one possible arrangement of the noise shaping filter in FIG. 12.

Referring to FIG. 13, the filter 88 may comprise a plurality of separate filters 88A, 88B, 88C each receiving a respective sample $S_O$, $S_{-1}$, $S_{-2}$ from corresponding look-up table 82F, 82G, 82H. The filter 88A is filtering the sample $S_0$ and is consequently to affect the value of the very next input sample after the one that gave rise to that value of $S_0$; the noise shaping is therefore to compensate for a single sample delay and may consequently be the same as is required in the prior art filter of FIG. 2C. The above referenced Gerzon and Craven paper demonstrates that a particularly desirable filler is minimum phase, and the derivation of a minimum phase filter to a desired frequency characteristic is known in the art.

The filters 88B and 88C are arranged in this embodiment to be delayed and scaled versions of the filter of 88A. The scaling filters W2, W3 are given by respective truncation terms of the response of the noise weighting filter $W(Z^{-1})$ the inverse of the noise shaping filter $\psi(Z^{-1})$ which is consequently also minimum phase and causal, and comprises a low pass filter passing at least the signal band width of interest. An example of the typical form of an impulse response of this filter is the sequence:
1, 2.619, 5.707, 10.664, 18.033, 28.311, 41.942:

The above impulse response terms are denoted $w_i$ (i=0, 1, ...) and the scaling filters W1, W2, .... WN comprise:

$$\sum_{i=0}^{N-1} W_i z^{-i}$$

Thus, the effect of combining the responses of the scaling filter and the filter $\psi$ (=1/W), and subtracting unity is to truncate the initial N terms of the impulse response of the noise weighting filter W applied to the pulse, to leave a response $$\sum_{i=N} W_i z^{-i}$$

The initial delay corresponding to N leading zeroes in the impulse response is cancelled by a term $Z^N$ in each filter 88b, 88c. Thus, each filter 88b, 88c, applies noise shaping which corresponds to weighting the signal by the later part of the impulse response of filter $\psi$ applied to the $(S_o-X)$ term.

An almost geometric increase with a ratio of about 3 between successive w terms is commonly found in fourth order filters appropriate to this embodiment although the ratio can be reduced by adopting higher order filters.

Figure 14:
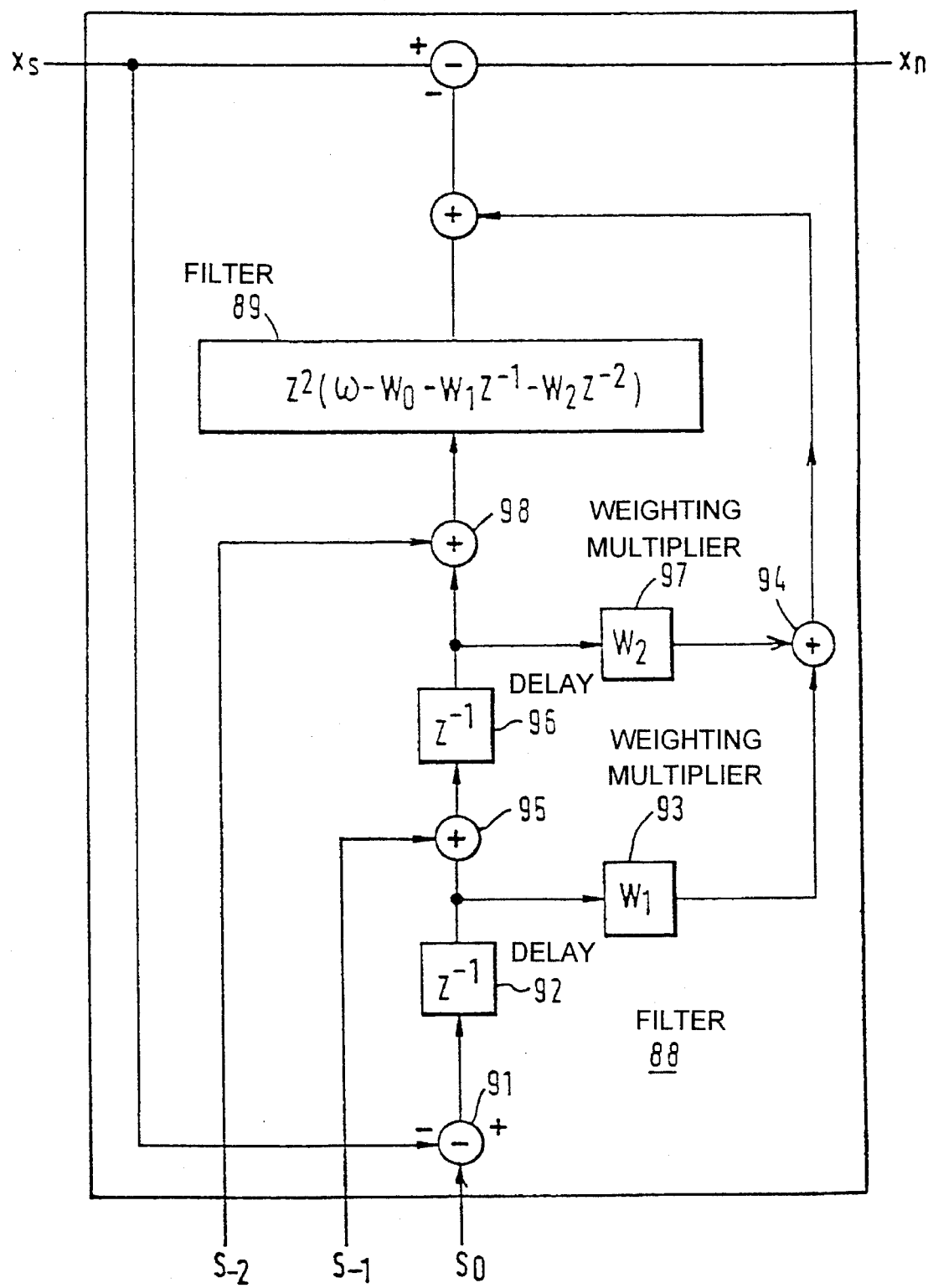
FIG. 14 illustrates an alternative arrangement to FIG. 13.

The filter network 88 of FIG. 13 can be simplified, as shown in FIG. 14, to include only one filter 89 of any complexity; this simplifies construction and is consequently preferred. Further, this structure has the general characteristic of an integrator; suppression of noise within the signal band of interest is achieved by feedback action depending upon the high gain of the filter in the band; this is also less sensitive to the effects of truncated or short coefficients than the structure of FIG. 13 which includes subtraction of signals having similar values.

In FIG. 12A, the correction inpulses $S_1, S_2, S_3$ . . . assigned to correct future input samples are added directly to those samples at the subtractor 84, whereas those assigned to past samples are delayed and filtered. In the simple case shown in FIG. 7C for example, the $S_1$ impulse therefore applies "perfect" correction whereas the $S_{-1}$ impulse can be corrected to an accuracy of about $2^{-16}$ within the audio band, depending upon the accuracy of the noise shaping filter 88. However, it may be preferable to apply equivalent filtering to each impulse; the embodiment shown in FIG. 12B achieves this by delaying each impulse $S_m$ by $2m$ delay stages and adding it to the equivalent impulse $S_{-m}$ to generate a corresponding output $S'_{-m}$. Each such combined correction impulse may also comprise further values delayed by intervening number of stages 1, 2, ... m—1.

As discussed above, when, according to one aspect of this invention, feedback is applied through a noise shaping filter to a sample later in time than the very next input samples (as in the prior art), the effectiveness of the noise shaping deteriorates according to the delay within the feedback path.

Figure 9B:
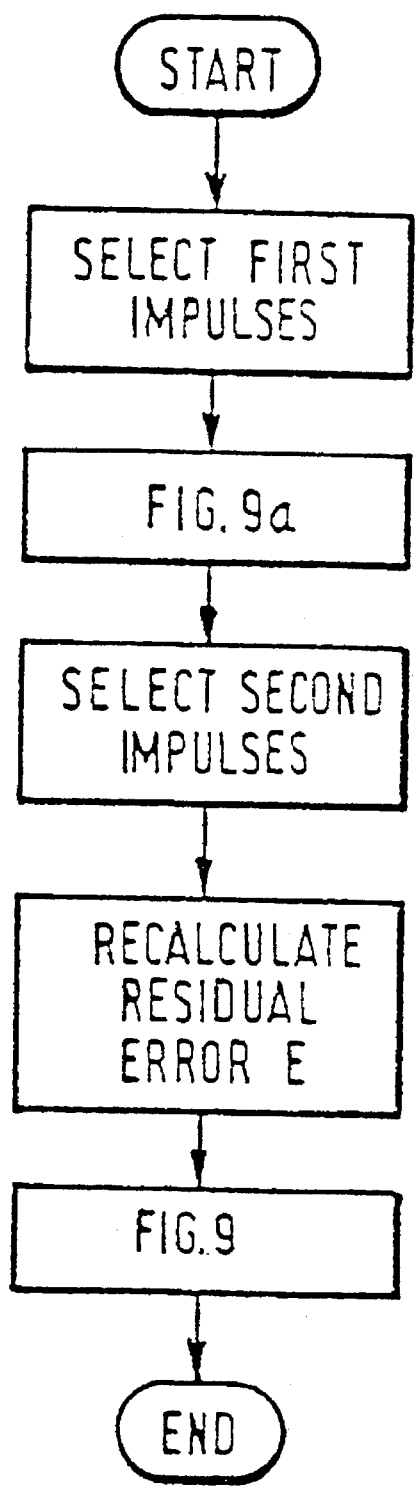
FIG. 9B shows schematically a second method of deriving the representation according to FIG. 7.

Accordingly, in this embodiment, as shown in FIG. 9B, it is preferred to derive the magnitudes of the correction impulses S stored in the look-up tables by a sequential process; first, the pulse $S_0$ (or a group of pulses around $S_0$) is selected and magnitude derived so as to match the spectrum of the error E caused by the pulse width modulator within the audio band as discussed with reference to FIG. 9A.

Next, a second group of pulses $S_{-1}, S_1, S_{-2}, S_2$ etc is selected which will be applied, via noise weighting filters, to subsequent input samples. The values of the second group of pulses are derived, as shown in FIG. 9B, to minimize the re-calculated error E which corresponds to that portion of the original pulse width modulator error which has not been corrected by the first group of pulses; this is achieved by, at each frequency, deriving the spectrum of the error and then subtracting therefrom the derived spectrum of the first group of pulses. This process may be repeated with further groups of correction impulses to be added to yet further delayed samples.

Figure 15:
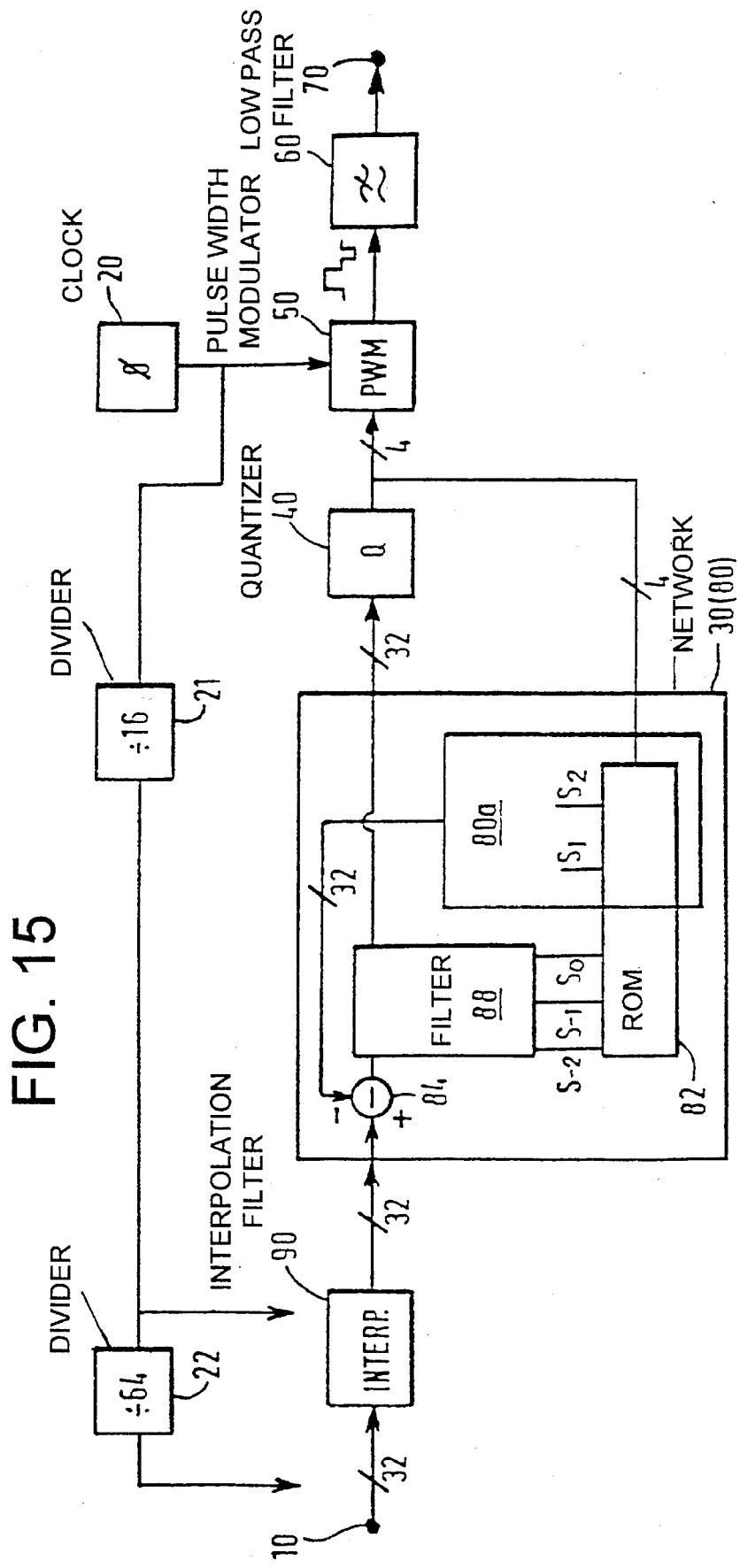
FIG. 15 illustrates an example of a digital to analogue convertor as shown in FIG. 12 incorporating the arrangement of FIG. 14.

Referring to FIG. 15, one example of a digital to analogue convertor for high quality audio applications will now be described. A parallel digital signal sampled at in excess of the Nyquist frequency for audio (for example, sampled at 48 kilohertz) arrives at a parallel input port 10 clocked at a corresponding clock rate of 48 kilohertz, and is routed to an interpolation filter 90 which generates a corresponding parallel output at an oversampled rate of 64×48=3.072 megahertz. The operation of the interpolation filter is conventional; the 63 samples interpolated between each pair of input samples have intervening amplitude levels determined by interpolation from 2 or more input samples.

The parallel 32 bit output is fed to the quantizer 40 via the filtering network 30 (comprising the non-linear correction network 80) discussed in greater detail below. The quantizer 40 generates a four bit digital output representing one of 16 quantizer levels in response to the 32 bit number placed on its address lines. The 16 output levels are evenly spaced between −7.5 to −7.5 about zero. A simple quantizer 40 consists of a connection to only the 4 most significant bits, the others being discarded.

The four bit quantizer output is supplied to a pulse width modulator 50 of the type shown in FIG. 4C comprising first and second modulators 50A, 50B each modulating a single edge, and a differential amplifier producing therefrom a bipolar output sequence as shown in FIG. 5C. Consequently, the pulse width modulator 50 needs to be clocked at sixteen times the rate of the quantizer 40, or 16×64×48 kilohertz= 48.96 megahertz (which approaches the currently realizable limits of clock rate for reliable operation using current CMOS technology). The clock therefore comprises a crystal oscillator 20 operating at this frequency, which is divided successively by 16 and 64 by respective flip-flop pulse divider circuits 21, 22 and employed to clock the oversampled and input data streams respectively.

The output line from the pulse width modulator 50 is supplied to the analogue filter 60 which is arranged to exhibit a smooth pass band to above 24 kilohertz and thereafter exhibiting a relatively gentle transition over 1–2 octaves to provide an analogue output signal.

The four bit digital output of the quantizer 40 is fed to the feedback network 30, which is generally of the form shown within FIG. 12A. Specifically, the quantizer output is fed to the address lines of 5 read-only memories (ROMS) preferably provided as a single device 82 producing, in response to a four bit address, five 32 bit output samples $S_2, S_1, S_0, S_{-1}, S_{-2}$. These are calculated to provide a five impulse sample point approximation to each different quantizer output and associated pulse width modulated error value. The "future time" correction samples $S_2$ and $S_1$ are delayed and combined as shown in FIGS. 11A–11C, and a combined correction term is subtracted from a digital sample from the interpolation filter 90 at a subtraction node 84. The remaining three samples $S_0$, $S_{-1}$, $S_{-2}$ are filtered and combined with the thus corrected signal by a filter 88 of the form shown in FIG. 14, and the result is supplied to the quantizer 40.

The filtering network 88 is substantially as shown in FIG. 14. The signal $S_o$ is fed to a subtractor 91 at which the digital input signal $X_s$ from the subtracter 84 is subtracted, and then fed via a delay stage 92 through a weighting multiplier 93 to a summing node 94. The output of the delay stage 92 is added to the signal $S_{-1}$ at a further summing node 95 and the sum is fed by a delay stage 96 through a further multiplier 97 to the summing node 94. The weighting multipliers 93, 97 are found to give relatively small corrections compared to that derived from the filter 89, and consequently the weighting multipliers 93, 97 may multiply by coefficients expressed as a relatively snort number of bits (in this case 5), and each multiplier 93, 97 therefore comprises means for executing bit shifts and add/subtract operations (multiplication by 5 bit coefficient can be expanded as no more than 2 such add/subtract operations). The output of the delay stage 96 is added, at a summing node 98, to the signal $S_{-2}$ from the ROM 82 and the result is filtered by the filter 89. The filtered output is then added to the signal from the summing node 94, and the total subtracted from the signal $X_s$.

Figure 16:
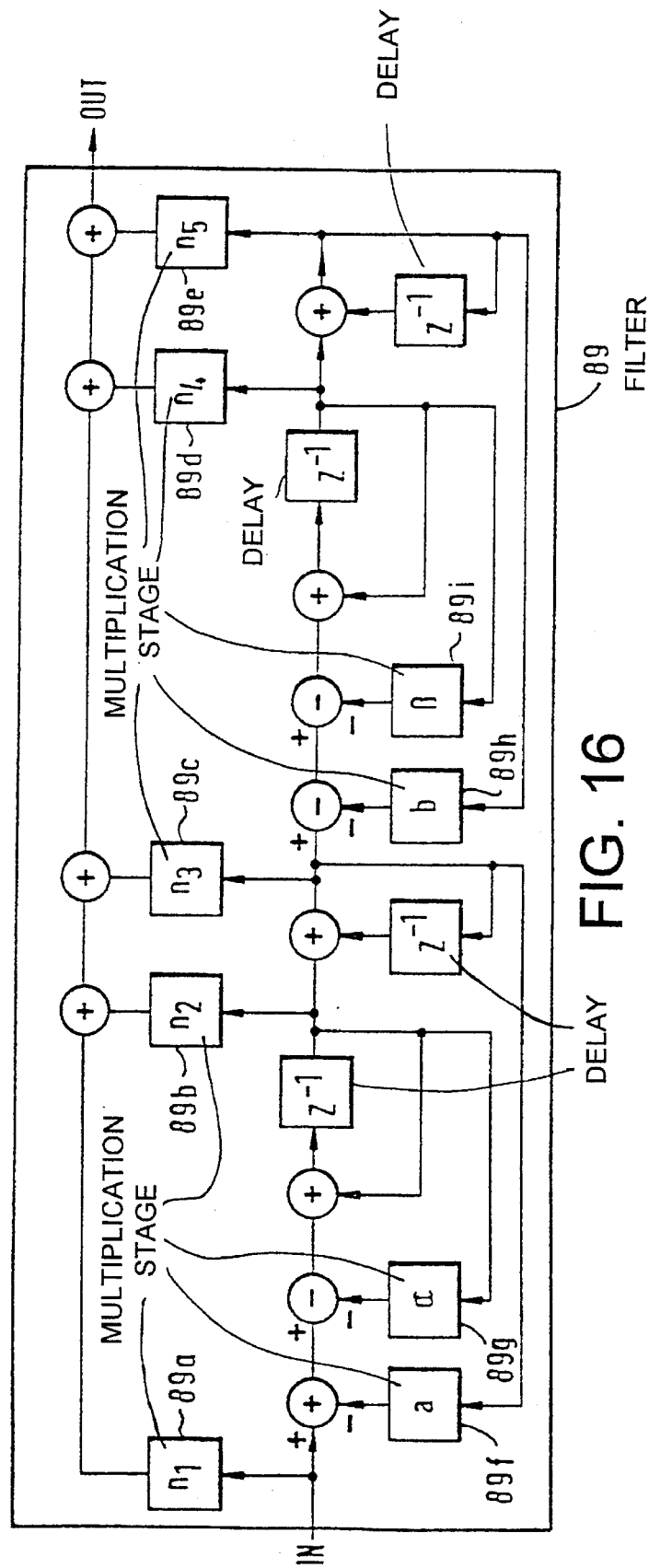
FIG. 16 shows in greater detail one example of a filter within the arrangement of FIG. 14.

Referring to FIG. 16, the filter 89 should have a high gain at lower frequencies, and this can be achieved using short word-length coefficients using a structure for example as shown in FIG. 16. This structure is derived by considering the filter 89 to be of the form $Z^2(W-W0-W1\ z^{-1}-W2\ z^{-2})$ or, in general, $z^m(W(z^{-1})-W_{m+1}(z^{-1}))$, where W is the response of a minimum phase filler the inverse of the desired noise spectrum to be produced. The filter 89 is recursive with the same order as W with the numerator having the same or greater order than the denominator. By factorising the denominator into second order sections and recasting as polynomials in $(Z^{-1}-1)$, a high gain at low frequencies with short word length coefficients can be obtained.

The structure in FIG. 16 is therefore fourth-order with two second order sections, and involves 9 multiplications and 12 additions on each sample. The multiplication stages 89A–89I each provide a five bit multiplication, and comprise means for shifting and adding/subtracting; as above, each multiplication will require no more than two add/subtract operations. Consequently, the filter 89 can be implemented using only four delay stages and forty add/subtract stages, with associated bit shifts.

The input signal received at the input 10 is preferably constrained to lie within the inner (+/–) four quantizer levels of the quantizer 40 (the outer most levels of which correspond to the highest and lowest numbers which can be represented with 32 bits). This allows the error signals to be added by the network 30 to have amplitudes up to +/– 3 quantizer levels without overloading the quantizer 40. It can be shown that the probability of quantizer overload under these circumstances is extremely small.

The contents of each of the five look-up tables in the ROM 82 comprise sixteen 32 bit digital words (one for each quantizer output level) derived by the method described above with reference to FIG. 9 to comprise an accurate representation of an error over the audio frequency range (0–24 kilohertz) and about 1.5 octaves thereafter to $10^{-8}$.

The noise shaping filter is designed with 0.25 dB audio band ripple, and 1 dB wide band ripple. The transition band width was 4.25 octaves. Noise density over the audio band is reduced, from its unfiltered level, by 18.08 bits and increased consequently at high frequencies by 1.92 bits.

The noise performance of the digital to analogue convertor described above with reference to FIG. 15 is therefore:

| | |
|---|---|
| modulator (8 bitclocks pk-pk) | 3 bits |
| √n advantage from 64× oversampling | 3 bits |
| noise shaping advantage | 18 bits |
| Total | 24 bits |

Figure 12B:
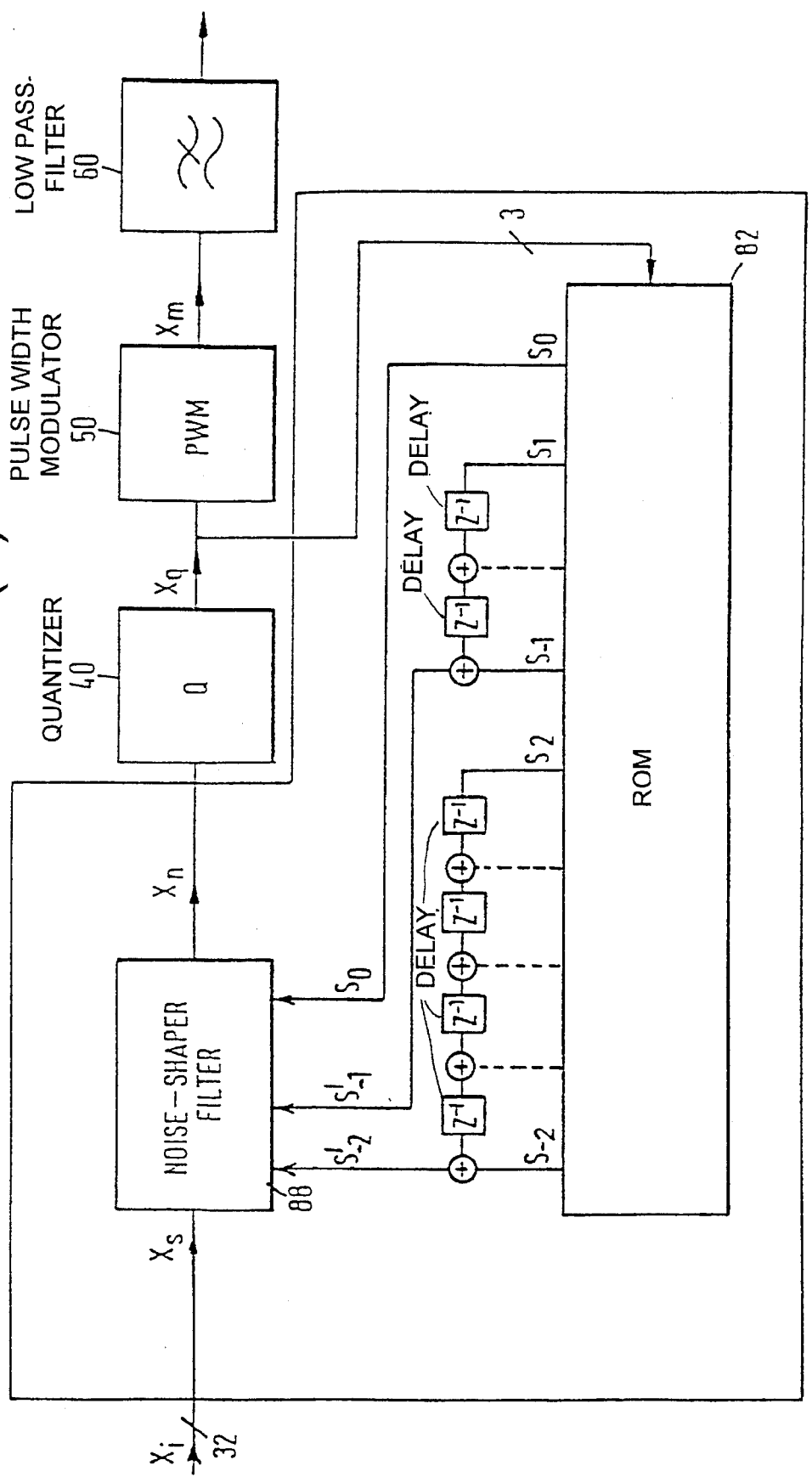
FIG. 12B shows schematically the arrangement of an alternative example of a digital to analogue convertor.

The noise introduced by intermodulation to the pulse width modulator 50 is reduced very substantially from about $2^{-13}$; it could be reduced by up to fifteen bits by adopting the structure of FIG. 12B and would thus be approximately 28 bits below the maximum modulator output; well below the other sources of noise present (for example quantizer noise).

Allowing for analogue inperfections, it is therefore reasonable to estimate that the digital to analogue convertor of FIG. 15 as described above should exhibit an accuracy of at least 22 bits.

Variations

In particular applications various parameters of the above example may be modified to optimize the convertor performance.

Clock Rate

By doubling the clock rate to 98 megahertz a one bit improvement in the signal to noise ratio could be obtained. The range of different PWM output levels, and hence quantizer levels, is doubled but only the same number is required for the feedback noise so the range is improved. However, at present, 49 megahertz is the highest commercially available clock rate.

Oversampling Ratio

If the oversampling ratio, at the same clock rate, is reduced, there are more possible PWM levels and hence a finer quantizer resolution (ie more levels) is available. But the noise shaping is considerably less effective, and the performance tends to converge towards that of a simple digital pulse width modulator. Equally, however, to avoid overloading the quantizer it is desirable to maintain at least a minimum number of quantizer levels greater than two, to allow for the amplitude of the (high frequency) fed back noise from the network 30, and this tends to act against the use of higher oversampling ratios for a given clock rate.

Pulse Modulation Type

The single edge modulation proposed above has the advantage that the clock rate required is (number of quantizer levels/ ×(oversampling ratio) ×(Nyquist frequency of input signal). Use of a pulse modulator which modulates both pulse edges, of the type discussed with reference to table 2 and FIG. 5B, requires a clock rate double this and consequently, for the same maximum physically available clock rate, half the oversampling ratio for the number of quantizer levels.

It would be preferable from the point of view of accuracy to employ a differential output stage of the type shown in FIG. 4C since this may reduce analogue errors.

If the circuit of FIG. 4C is employed, the final output of the modulator 50 includes only odd-order non-linearities as the differential stage has cancelled even order non-linearities. However, for perfect cancellation, very good analogue matching between the two modulators 50A, 50B would be required; it is precisely to avoid the need for high precision analogue matching that oversampling digital to analogue convertors are employed.

Figure 17:
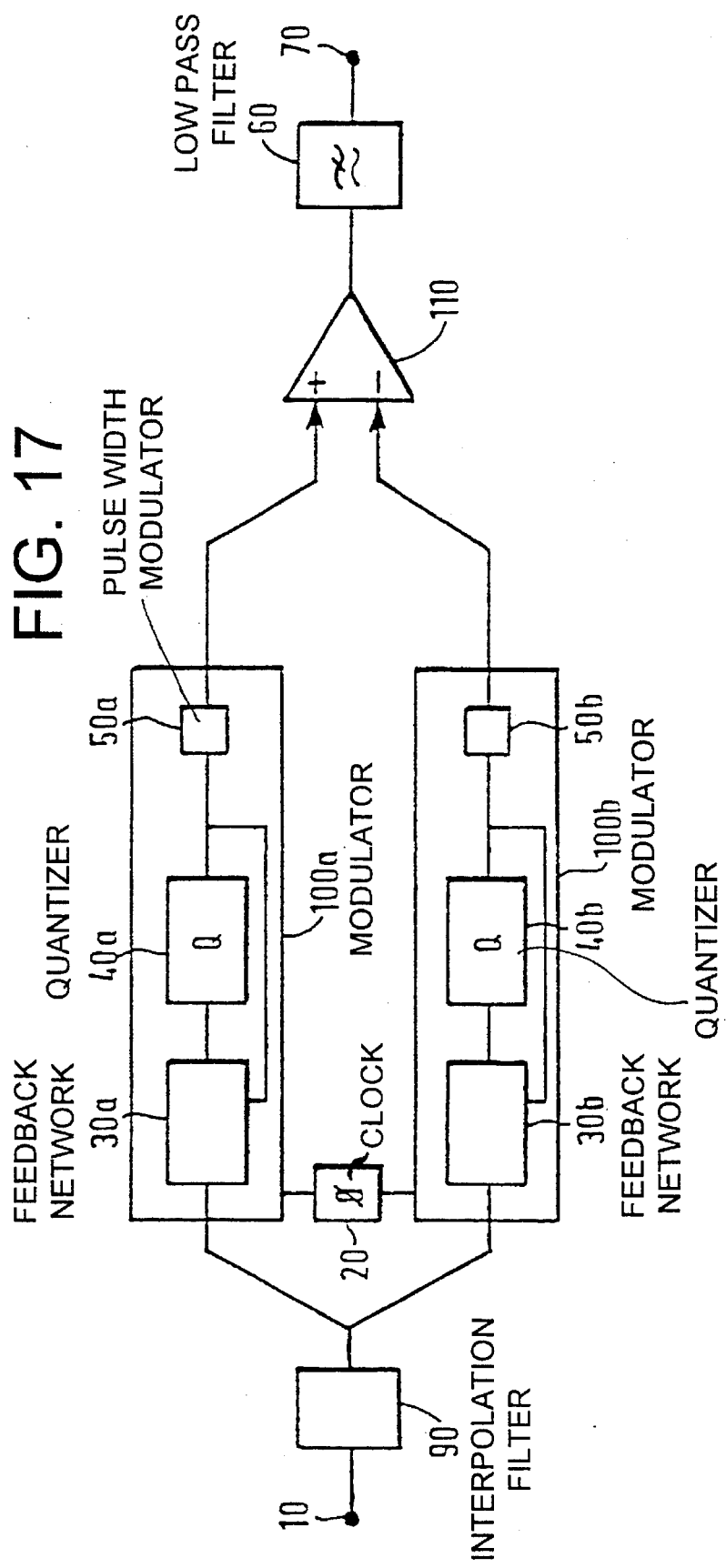
FIG. 17 shows schematically a digital to analogue convertor according to a second embodiment of the invention.

One way of overcoming this problem is, referring to FIG. 17, to provide a pair of modulators 100A, 100B each comprising respective quantizers 40A, 40B (identical in each case), pulse width modulators 50A, 50B (giving pulses of complementary lengths) and non-linear feedback networks 30A, 30B (each specifically arranged to compensate the non-linearity of its associated pulse width modulator 50A, 50B). The outputs of the two pulse width modulators 50A, 50B are then combined in a differential stage 110 and the resulting signal is low pass filtered for output. Because each pulse width modulator 50A, 50B is compensated by corresponding non-linear feedback correction, the matching between the two pulse width modulators 50A, 50B is less critical then with the arrangement of FIG. 4C.

An alternative type of pulse edge modulation provides pulses the front edge of which is modulated in a first direction (e.g. forward in time for a rising signal value) and the rear edge of which is modulated in the reverse direction with the next signal sample. This has the advantage of permitting, for a given bit-clock rate, twice as much information to be carried by each output pulse and consequently, since the pulse width modulator bit timing is the speed limiting step, this permits either more quantizer levels or a higher oversampling ratio. This makes this type of modulation attractive for use in a digital power amplifier, as described later.

Peak Modulation

The peak modulation (that is, the extent to which the input signal is allowed to occupy the total range of the quantizer) determines the final signal to noise ratio. However, the effectiveness of the noise shaping depends upon the availability of part of the quantizer range for adding fed back noise to the input signal. For a digital to analogue converter, of the above type, the signal is constrained to lie within 40–60% of the quantizer range; other applications, such as digital power amplifiers need higher levels of signal modulation.

Noise Shaping

Higher order noise shaping filters allow greater reductions of noise within the signal band. However, it is generally desirable that the noise shaping filter should take account of the characteristics of the analogue filter 60, since it may be undesirable to allow high levels of ultrasonic signal, for example, to appear at the analogue output 70. For high digital audio performance, a fifth order noise shaping filter should give a suitably high performance.

Second Embodiment—Mash Digital to Analogue Convertor

Figure 18:
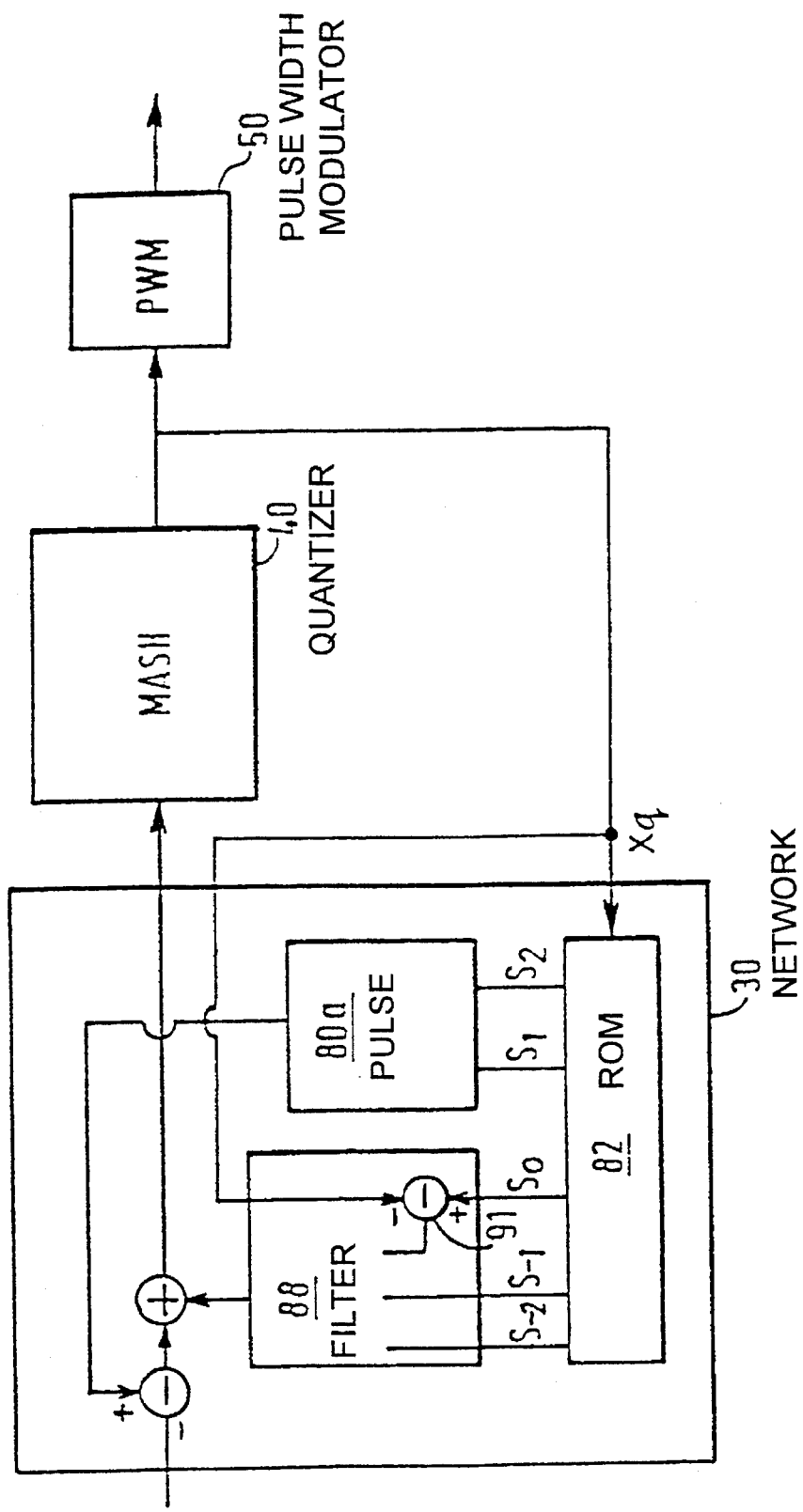
FIG. 18 shows schematically a digital to analogue convertor according to a third embodiment of the invention.

Referring to FIG. 18, the quantizer 40 may be substituted by other types of quantizer; the multistage noise shading or MASH quantizer described in, for example, the above referenced paper by Matsuya et al (and specifically FIG. 6 thereof) may be employed instead of a linear staircase type quantizer as described above. Such a quantizer however includes noise shaping of its output quantization error already. It may therefore be preferable to adapt the structure of the filter 88 from the form shown in FIG. 14 so that the node 91 is connected to the signal supplied to the modulator input. This modification provides that the network 30 does not filter the quantizer noise but only the noise or non-linearity due to the pulse width modulator 50; this is desirable since the quantizer noise is, as stated above, reduced within the MASH quantizer itself.

Other Aspects of Digital to Analogue Conversion

Figure 19:
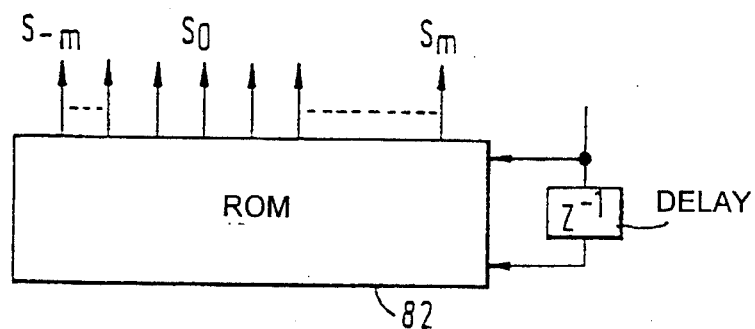
FIG. 19 shows components of the arrangement of FIG. 12 for use in compensating non-linearity which is time dependent.

In a further optional embodiment, shown in FIG. 19, the look-up table 82 receives at its input address line a signal comprising both the present and the just previous inputs to the pulse width modulator 50. The size of each look-up table is therefore increased; for sixteen quantizer levels, 16×16= 256 entries for each look up table are required.

This is advantagous in that it is to be expected that the exact shape and timing of pulse transitions will be slightly affected by previous ones (although generally only the immediately preceding sample will have a significant effect).

Figure 20:
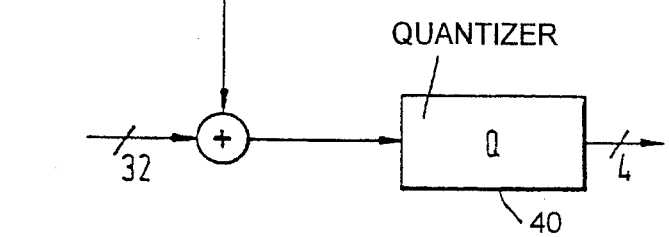
FIG. 20 shows schematically an addition to the digital to analogue convertor of the proceeding embodiments to reduce quantizer lock up.

Referring to FIG. 20 it is known that noise shaping feedback around a quantizer can produce lock-up or limit-cycle effects, sometimes resulting in an audible noise signal. A solution proposed in the prior art to overcome this problem is to provide a generator 120 generating an essentially random (distributed about zero) number of a magnitude corresponding to +/–½ or +/– 1 quantizer level, which is added to the quantizer input signal. However, a certain amount of noise is unavoidably thereby added to the signal, and correspondingly a higher performance noise shading filter is required.

The non-linear signal generator 82 described above comprises a plurality of look up tables. However, it will be appreciated that if desired a digital calculator such as a digital signal processing device could be provided to calculate the non-linear functions corresponding to each received sample instead.

Alternatively, a digital calculator (for example a digital signal processing device such as the DSP 32 available from AT&T or the TMS 320C30 device available from Texas Instruments) may be provided connected to the look up tables, which comprise random access or programmable read-only memories. The digital signal processor device is connectable to an input which in turn is connectable to a point in the circuit following the pulse width modulator and any other non-linear components of the circuit, and is arranged to measure the actual error or non-linearity produced by the circuit. Subsequently, the digital processor is arranged to derive the values of the contents of the Look up tables 82 by the method of FIG. 9A or FIG. 9B, and programs the look up tables accordingly. Accordingly, it may cause the generation of a digital test input signal to be applied to the digital input 10. This embodiment of the invention is particularly advantageous where it is desired to avoid close matching of the analogue output stages; any non-linearity is caused by, for example, finite transition times in the pulse width modulator can be taken account of prior to use of the convertor. Equally, the input to the digital signal processor could be taken from a point in the analogue circuit following the convertor, so that the convertor compensates not only its own non-linearity but that of succeeding circuitry.

Alternatively, the look up tables 82 may as above be programmable but the convertor may comprise instead a programming port for programming the look up tables 82 and in the process of manufacturing the converters, a stage of testing the non-linearity of the converter, calculating the required corrections for the look up tables, and programming the look up tables via the port may be provided.

Third Embodiment—Analogue to Digital Convertor

One application of the invention in analogue to digital conversion will now be described with reference to FIG. 21. One method of providing a high accuracy analogue to digital convertor disclosed in the above referenced Larson et al papers is to convert an analogue input signal to a digital output signal through a relatively low precision analogue to digital convertor, and then re-convert the digital output back to an analogue signal to provide a measure of the error in digitising the analogue signal which is employed to modify successive analogue input values to reduce the error.

Figure 21:
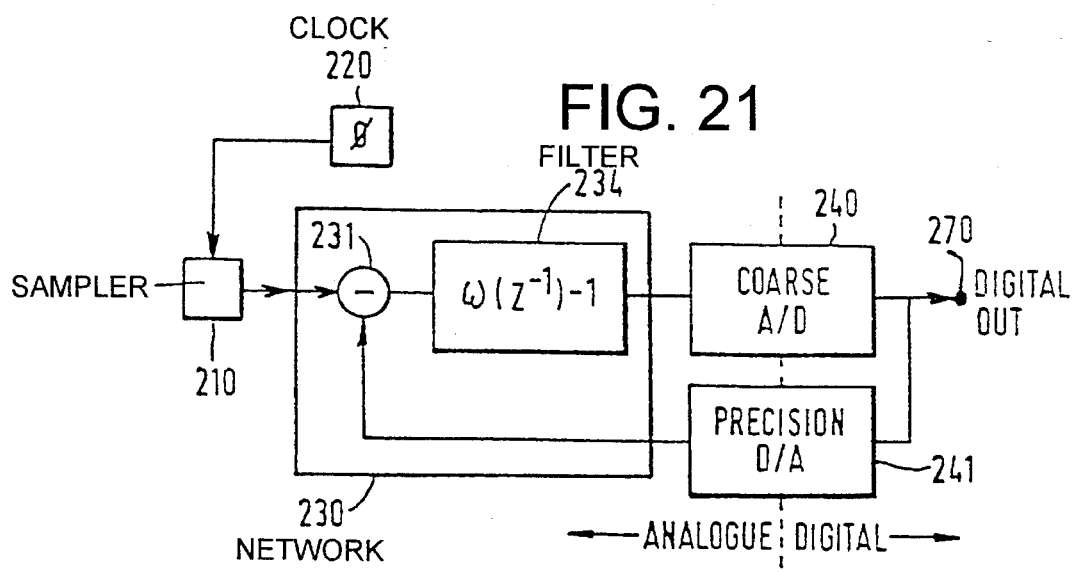
FIG. 21 shows schematically an analogue to digital convertor not embodying the invention.

FIG. 21 accordingly shows an analogue input comprising a sampler 210 producing a respective output series of analogue samples at an oversampled rate of, for example, 64×48 kilohertz=3.072 megahertz. The sampled analogue signal is fed to a feedback network 30 which may resemble any one of the networks shown in FIGS. 2A to 2F but is shown corresponding to FIG. 2F.

The network 230 includes a subtraction node 231 followed by a noise weighting filter 234 implemented for example as a switched capacitor filter, and the output of the filter 234 is supplied to a coarse analogue to digital convertor 240 which produces a corresponding quantized digital output at an output node 270. The digital output is then fed back via a high precision digital to analogue convertor 241 to be subtracted from the input signal at the node 231.

Figure 22:
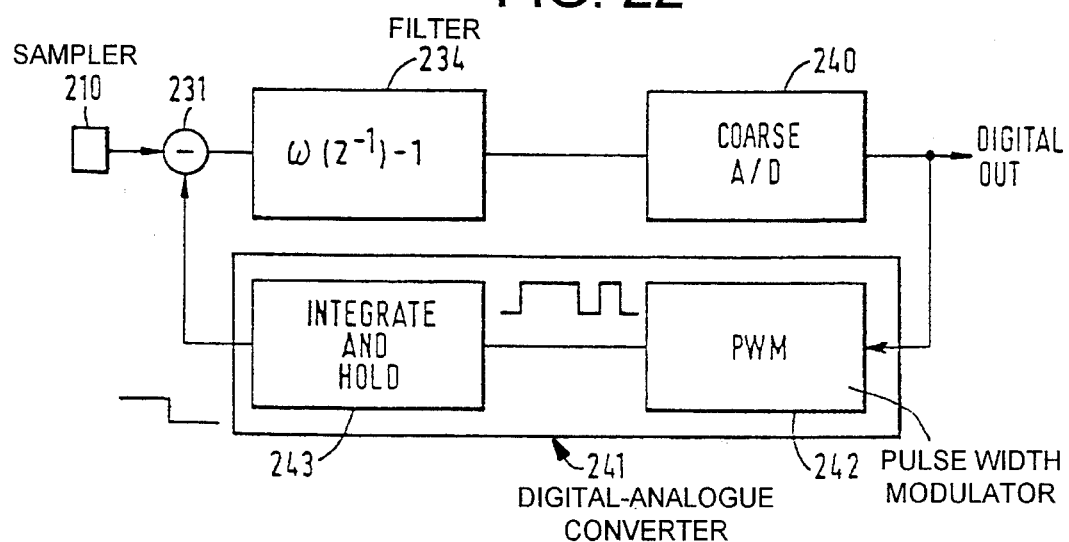
FIG. 22 shows schematically a corresponding analogue to digital convertor according to a further embodiment of the invention.

In this embodiment of the invention, the digital to analogue convertor 241 comprises a pulse width (or other pulse edge or length type) modulator 242 receiving the coarsely digitized digital signal and generating a pulse of a corresponding length. In the example shown in FIG. 22, the pulse width modulator 242 is followed by an integrator 243 which accumulates the output of the pulse width modulator 242 during each (oversampled) sampling interval and supplies a corresponding analogue output sample proportional to the digital output sample at the end of each sampling interval to be subtracted from the next analogue input sample at the node 231. This arrangement gives a substantially linear output.

Figure 23:
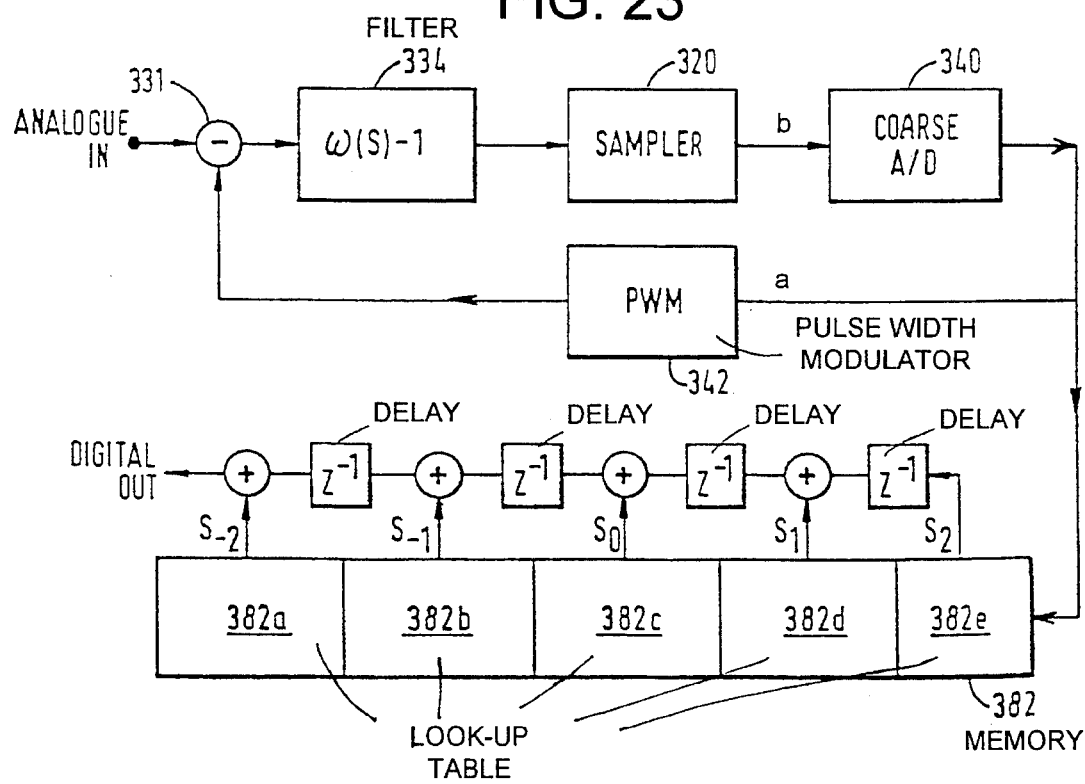
FIG. 23 shows a preferred type of analogue to digital convertor according to a further embodiment of the invention.

An alternative arrangement shown in FIG. 23 enables the use of a continuous time analogue filter 334. A continuous analogue input signal passes through the subtraction node 331 and is sampled (at the oversampling rate) by a sampler 320 and the corresponding sampled analogue signal ("b") is digitized as before by a coarse analogue to digital convertor 340. The digital output is fed back ("a") through a pulse width modulator 342 to the subtraction node. The frequency response of the continuous time filter 334 is such that the transfer function between the points a and b is substantially the same as that of the filter 234 in the above example, and that the response at the frequency of the sampler 320 and its harmonics is small (to attenuate the substantial harmonics at this frequency due to the pulse width modulator 342).

The effect of the feedback in FIG. 23 is essentially to substantially equalize the pulse modulator output with the analogue input. If the digital input to the pulse width modulator 342 corresponded exactly to its output, this would ensure that the digital output of the coarse analogue to digital convertor 340 was correspondingly close to the analogue input. However, as discussed above, at length, the output of the pulse width modulator 342 is a non-linear distorted version of its input. One solution to this problem would be to provide feedback around the pulse width modulator 342 exactly as discussed above with reference to embodiment 1. However, this is unnecessarily complex; all that is in fact necessary is to provide a plurality of non-linear outputs $S_{-2}$, $S_{-1}$, $S_0$, $S_1$, $S_2$ via corresponding look-up tables 382A, 382E provided in a memory 382, which correspond over the audio band to the digital word to the output including corrections over several samples exactly as discussed with reference to embodiment 1 above. The combined, appropriately delayed, output of the look-up tables 382A–382E provides the corrected digital output word, which may subsequently be filtered and decimated back to the desired sample rate. Alternatively, if the contents of the look-up tables are differently calculated, the outputs may represent a correction value to be subtracted from the word output by the coarse A/D convertor 340.

The pulse width modulation described above, in which a pulse width modulator receives a digital input signal and generates a pulse of a corresponding length, has been described in terms of a sampler 320 executing uniform sampling—that is, each digital sample is separated from the next by a constant sampling interval. When a pulse is generated, the position of the pulse edges depends upon the value of the input sample at the sampling instant; this differs from the time at which the pulse edges occur by the length of the pulse (which is itself variable). For this reason, the above noted non-linearity in the output of the pulse width modulator occurs.

However, an analogue pulse width modulator such as a class D amplifier is often provided by generating a sawtooth wave format the pulse repetition frequency, and switching a comparator when the sawtooth crosses the input wave form. In this case, the edges of the pulses exactly correspond in time to the signal level which the pulse represents and consequently the above type of non-linearity does not occur. Thus, the pulse width modulator is sampling at irregular intervals (skew sampling); in this context, referred to as "natural sampling". However, because discrete time systems tend by their nature to involve uniform sampling, hitherto this method of reducing pulse width modulator non-linearity in digital to analogue or analogue to digital convertors could not be employed.

Figure 24:
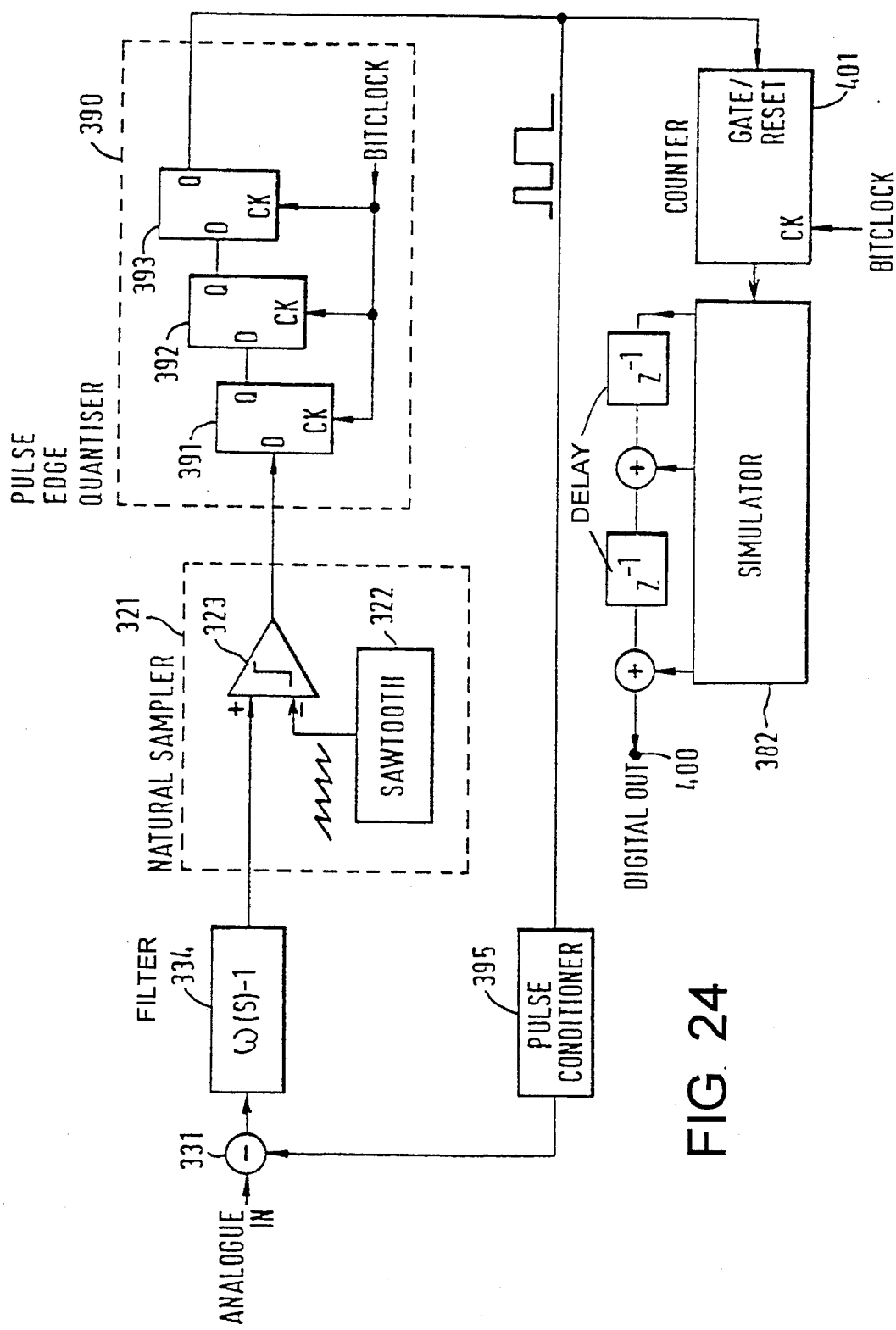
FIG. 24 shows an alternative type of analogue to digital converter according to a further embodiment of the invention.

Referring to FIG. 24, the circuit of FIG. 23 is modified in an alternative example as follows. The analogue signal filtered through the continuous time sample filter 334 is passed to a "natural sampler" and pulse-width modulator 321, comprising a sawtooth generator 322 (for example, an analogue integrator) generating a sawtooth analogue wave form at a frequency corresponding to the sample rate of the digital circuit including and following the non-linear stage 382. The sawtooth wave form and the analogue signal from the continuous time filter 334 are fed to the terminals of a comparator 323, which consequently generates a pulsed output in which the pulses are of lengths corresponding to the input signal level. The continuously variable pulse lengths produced by the sampler 321 are converted to quantized lengths by a pulse edge quantizer circuit 390 which comprises in this instance a flip-flop circuit comprising a plurality of D type flip-flops 391, 392, 393 cascaded and clocked at the bit clock rate (in other words, the digital sample rate multiplied by the maximum number of levels in the input to the simulator 382. The pulse edge quantizer 390 in this embodiment is replacing the coarse analogue to digital convertor 340, and can therefore effect a relatively crude quantization of the pulse edges; the quantization does not affect the linearity of the natural sampling employed by the sampler 321.

The output of the pulse edge quantizer 390 therefore comprises a pulse wave form at the digital output sample rate, the edges lying at one of a predetermined small number of time positions defined by the coarseness of the pulse edge quantizer 390. Since this signal is an analogue representation of the signal which will be generated at the digital output 400, it need not be re-converted to an analogue signal within the feedback loop to the subtractor 331. However, a circuit 395 for scaling the magnitude of the pulse and other pulse shaping or conditioning is provided in the path.

The quantized pulse signal from the pulse edge quantizer 390 is converted to a multi-bit digital output by a counter circuit 401, clocked at the bit clock rate, enabled at the pulse start and disabled at the pulse end. The pulse length counted by the counter 401 is then supplied, at the digital sample rate, to the non-linear convertor 382 as discussed in FIG. 23. The effect of the counter 401 in converting from pulse modulation to a digital output is to reintroduce the non-linear distortion which occurs within the circuit of FIG. 23, since the counter 401 is effectively a pulse-width modulator in reverse. It is therefore necessary to provide a correction circuit 382 comprising a plurality of look up tables, as before, addressed by the output of the counter 401.

Fourth Embodiment—Digital to Analogue Convertor

Figure 25:
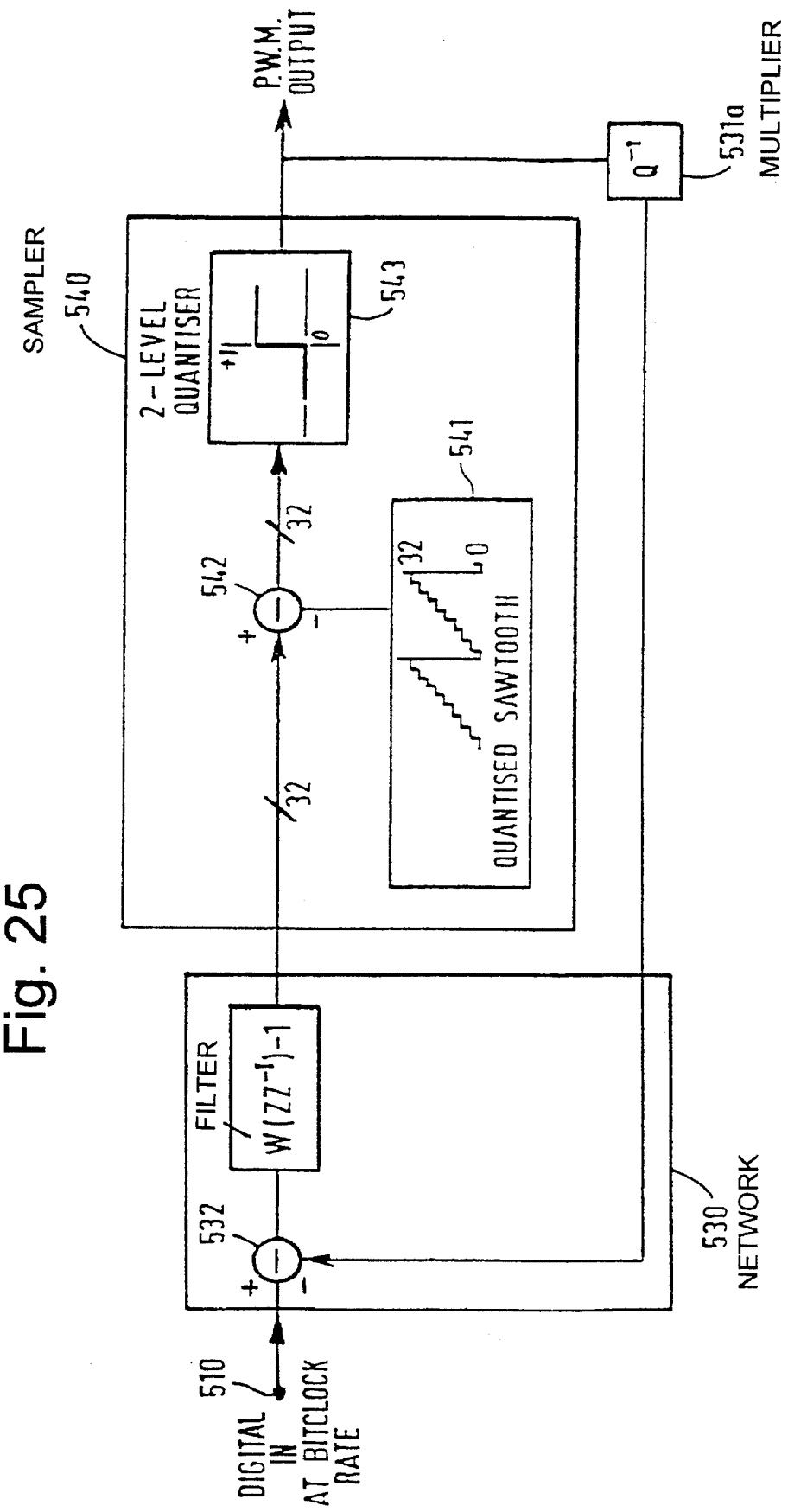
FIG. 25 shows elements of a digital to analogue converter according to a further embodiment of the invention.

Referring to FIG. 25, the circuit of FIG. 23 could be adapted to provide a digital to analogue convertor.

A digital signal, at an oversampled rate, is supplied to a multi-bit digital input port 510 clocked at the bit clock rate. For example, a 32 bit digital input word, oversampled 16 times, representing an audio signal with a Nyquist frequency 48 kilohertz, would be clocked at 32×16×48=24.576 megahertz. The signal is supplied, via a network 530, to a circuit 540 acting as a digital natural sampler, which comprises a digital sawtooth generator 541, comprising a counter circuit counting in quantized steps each comprising a plurality of bits, the output of which is subtracted at a subtraction node 542 from the signal filtered by the network 530.

When the level of the input signal exceeds the count from the counter 541 a pulse is initiated. The pulse continues until the counter 541 resets, at the end of 32 bit periods. If signed binary is employed, the pulse may be generated merely by examining the sign bit at the output of the subtractor 542; alternatively, a two level quantizer 543 may be provided with the threshold between the quantizer levels occurring at a zero input.

It will therefore be seen that the circuit 540 acts both as a sampler and a pulse width modulator; since the sampling is approximately "natural" sampling, the output pulse width modulated wave form (which is fed to a subsequent analogue filter 60) has substantially less non-linearity than the quantizer and pulse width modulator arrangement of FIG. 1. In a preferred example, the pulse width modulated output is fed back, via an inverse quantizer or multiplier 531A, to reduce the quantization noise to the network 530 which in this example is of the form shown in FIG. 2F (although other noise shaping structures discussed above could be substituted), and has a similar frequency response to the continuous time filter 334 of FIG. 23. The notation "zz" refers to a delay at the bit-clock rate.

Where relatively low oversampling and bit rates are employed, the arrangement of FIG. 25 therefore provides a linear digital to analogue convertor; as compared to the circuit of FIG. 12, it does however require for the same oversampling ratio and number of bits that the noise shaping and quantizer circuits 530, 540 are all clocked at the bit clock rate; in the arrangement of FIG. 12, only the pulse width modulator requires such a high rate.

Fifth Embodiment—Digital Power Amplifier

Figure 26:
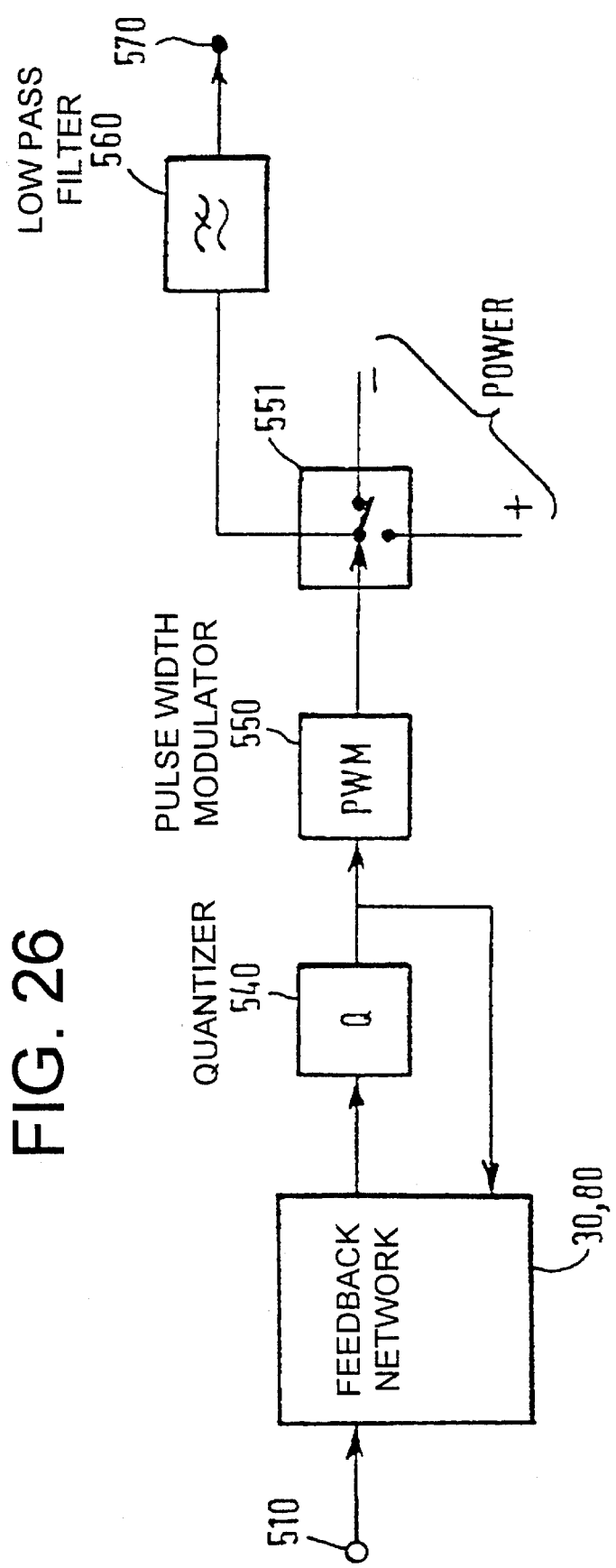
FIG. 26 shows schematically a digital power amplifier according to a further embodiment of the invention.

Referring to FIG. 26, in a digital power amplifier, a digital audio signal is received at a digital input 510 and fed to a quantizer 540 via a non-linear feedback network 30, 80 of the type discussed above with reference to the first embodiment.

The output of the quantizer 540 is then fed to a pulse width modulator 550. The output of the pulse width modulator 550 is supplied to the control terminal of a solid state switch 551 positioned in a high power line from a power source to an analogue low pass filter 560 connected to the high power analogue output terminal 570. In order to avoid radio frequency emissions and other undesirable effects, it is desirable to switch the switch 551 at as low a frequency as possible. This requires the use of a lower oversampling ratio, but at a lower oversampling ratio the noise shaping is less able to reduce quantizer noise.

For a typical digital power amplifier, the input signal is therefore oversampled with a ratio 8–16. The quantizer 540 may have a higher number of levels, and hence greater precision, or alternatively, the noise shaping within the network 30 may include a filter of high order (for example 8–16) which effectively reduces the quantizer noise within the audio band at the cost of a major increase outside the audio band. The switching device 551 could be a thyristor or triad device or a MOSFET device, and such devices have a finite rise and fall time which can give rise to an error occurring between digital sample instants if edges of two adjacent pulses interact. In this embodiment, the non-linear feedback 80 within the network 30 may therefore be calculated to correct the error due to the switch 551 as well as that of the pulse width modulator 550, as discussed with reference to FIG. 19.

The pulse modulator may alternatively be of the double- or successive-edge type in which a first sample modulates the front edge of a pulse and a second modulates the trailing edge in the opposite direction, as discussed above. In this case, the two edges of a pulse, or the edges of two pulses, can approach very closely. Therefore, in this embodiment, the non-linear correction is preferably dependent upon two or more adjacent samples as discussed with reference to FIG. 19.

Sixth Embodiment—Predictive Correction

It is not possible, as stated above, to employ feedback without delay to correct a sample at the input to a pulse width modulator for the distortion that sample produces at the output of the pulse width modulator; the correction must therefore be applied to the next and following samples.

In the structure of FIG. 1, where the pulse width modulator 50 is preceded by a quantizer 40, accurate correction cannot be applied at the input to the pulse width modulator 50 since the signal at this point is relatively coarsely quantized. Correction must instead be applied to the multiple-bit signal in the circuit prior to the quantizer 40.

Figure 27:
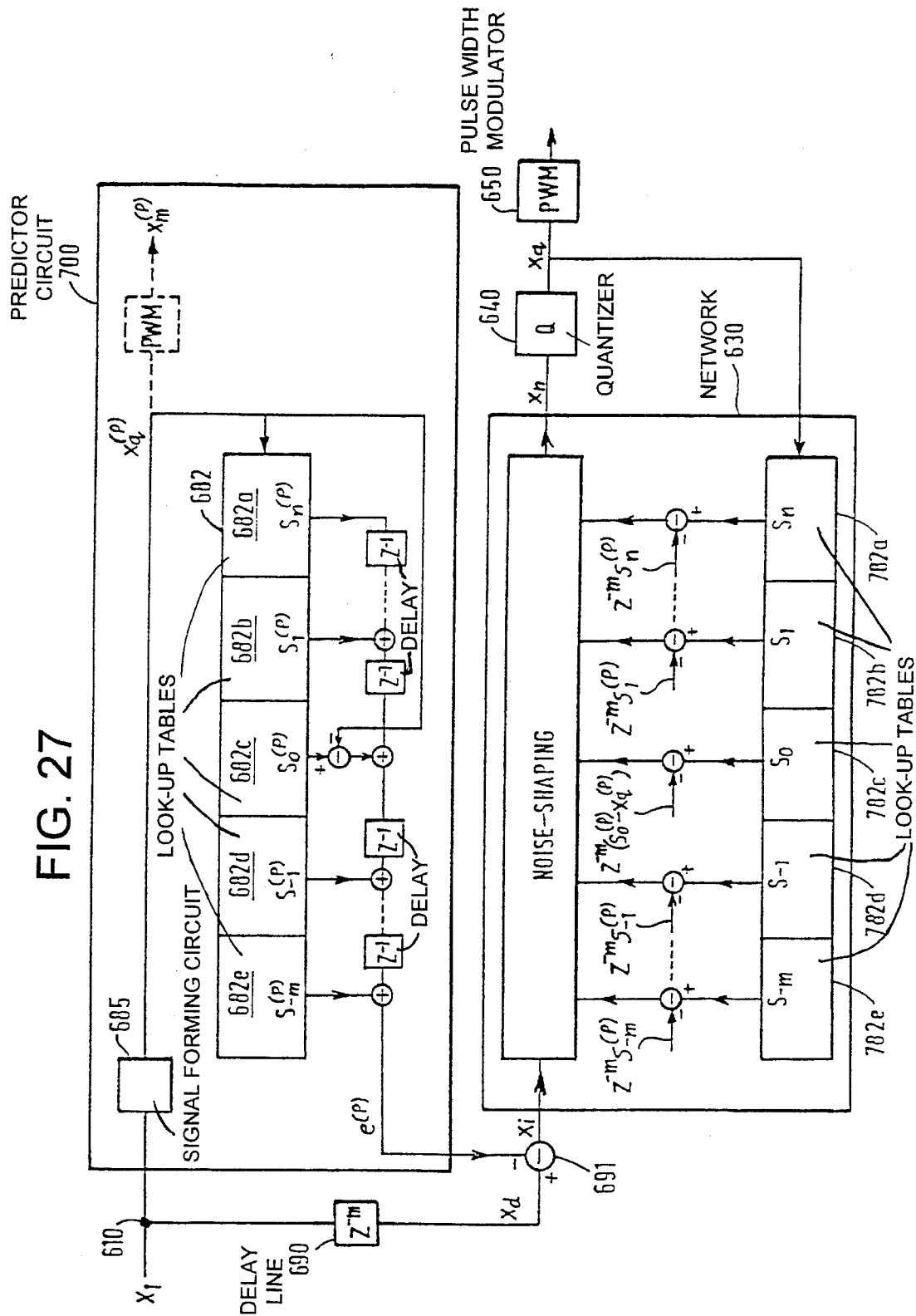
FIG. 27 shows schematically elements of a digital to analogue converter according to a yet further embodiment of the invention.

Referring to FIG. 27, the signal from a digital input 610 is supplied, via a noise shaping network 630, to a quantizer 640 the output of which is fed back to the noise shaping network 630 and forward to a pulse width modulator 650 as in FIG. 1.

Prior to being fed to the network 630, the signal is delayed m instants by a delay line 690 and from the delayed signal a correction term is subtracted at a subtractor 691. The input to the subtractor 691 is derived from a predictor circuit 700 which, in effect, generates a representation of the signal forming the input to the quantizer 640 which is employed to address a plurality of look-up tables 682A, 682B, 682C etc each of which generates a corresponding correction impulse, for example, a five pulse representation comprising a central pulse $S_0^P$ and future time and past time correction pulses $S_n^P$, $S_{-n}^P$. The signal representing the output of the quantizer is subtracted from the centre time sample $S_0^P$ so that it represents only the pulse width modulator error. The look-up table outputs are then added into successive stages of a delay line of length m+n−1, and the total error correction thus derived is subtracted at the node 691 from the signal from the delay line 690; the length of the delay line 690 is m, the number of past time correction pulses, and hence is sufficient to align the center time pulse $S_o$ with the input sample which gives rise to the error that the correction is calculated to correct.

In other words, in this embodiment of the invention, instead of correcting the effect of the pulse width modulator non-linearity on the next and following samples, the correction is applied to the same sample which will give rise to the error when it subsequently passes through the pulse modulator 650.

At first sight this would appear to remove the need for feedback correction representing the pulse modulator error altogether. However, on closer examination this is not so. The signal which is supplied to the look-up tables 682A—E as representing the output of the quantizer 640 (and hence the input to the pulse width modulator 650) was derived on the basis of the signal from the input 610. However, when the correction term is subtracted at the subtractor 691, the result may, when quantized by the quantizer 640, differ appreciably due to the noise added by the quantizer 640; for example, if the effect of the correction term is to shift the input to the quantizer 640 across one of the quantizer level thresholds, the quantizer output will no longer be in accordance with the predicted output which was used to address the look-up tables 682. In digital to analogue convertors, the quantizer is relatively coarse and hence adds noise having a substantial amplitude; the predictive correction applied by the circuit 700 and the subtractor 691 is therefore insufficient to effectively reduce the error due to the pulse width modulator 650 (although in some other applications, for example digital power amplifiers, where the quantizer noise amplitude is lower, the predictive correction may be sufficient to reduce the pulse width modulator error to an acceptable level). Accordingly, the feedback network 630 includes a plurality of non-linear look-up tables 782A, 782B, 782C, 782D, 782E addressed by the output of the quantizer 640 and outputting corresponding correction pulses, from which the magnitudes of the corresponding simulation pulses generated by the predictor look-up tables 682A–682E (delayed by m sampling intervals for time alignment) are subtracted so as to take account of the output simulation performed by the predictor. For the center time correction pulse $S_0$, the difference between the predictive center time pulse $S_0^P$ and the predictive quantizer output $X_p$ is instead subtracted, since this was the term appearing in the error signal in the subtractor 691. For convenience, the took-up table $S_0$ may instead of containing the simulated pulse amplitude instead store the corresponding difference or correction pulse $S_0-x_p$).

The differences thus formed represent the correction necessary to reduce the error remaining after the predictive correction at the subtractor 691; these are noise shaped and added back to the input signal in the manner described with reference to FIG. 12A or FIG. 12B.

The path from the input node 610 to the predictive correction pulse generator 682 includes a signal forming circuit 685 for forming the predicted quantizer output signal; accordingly, it typically includes noise shaping circuits similar to those through which the input signal will subsequently pass (640, 630), and may include also a quantizer to reduce the number of address lines.

Figure 28:
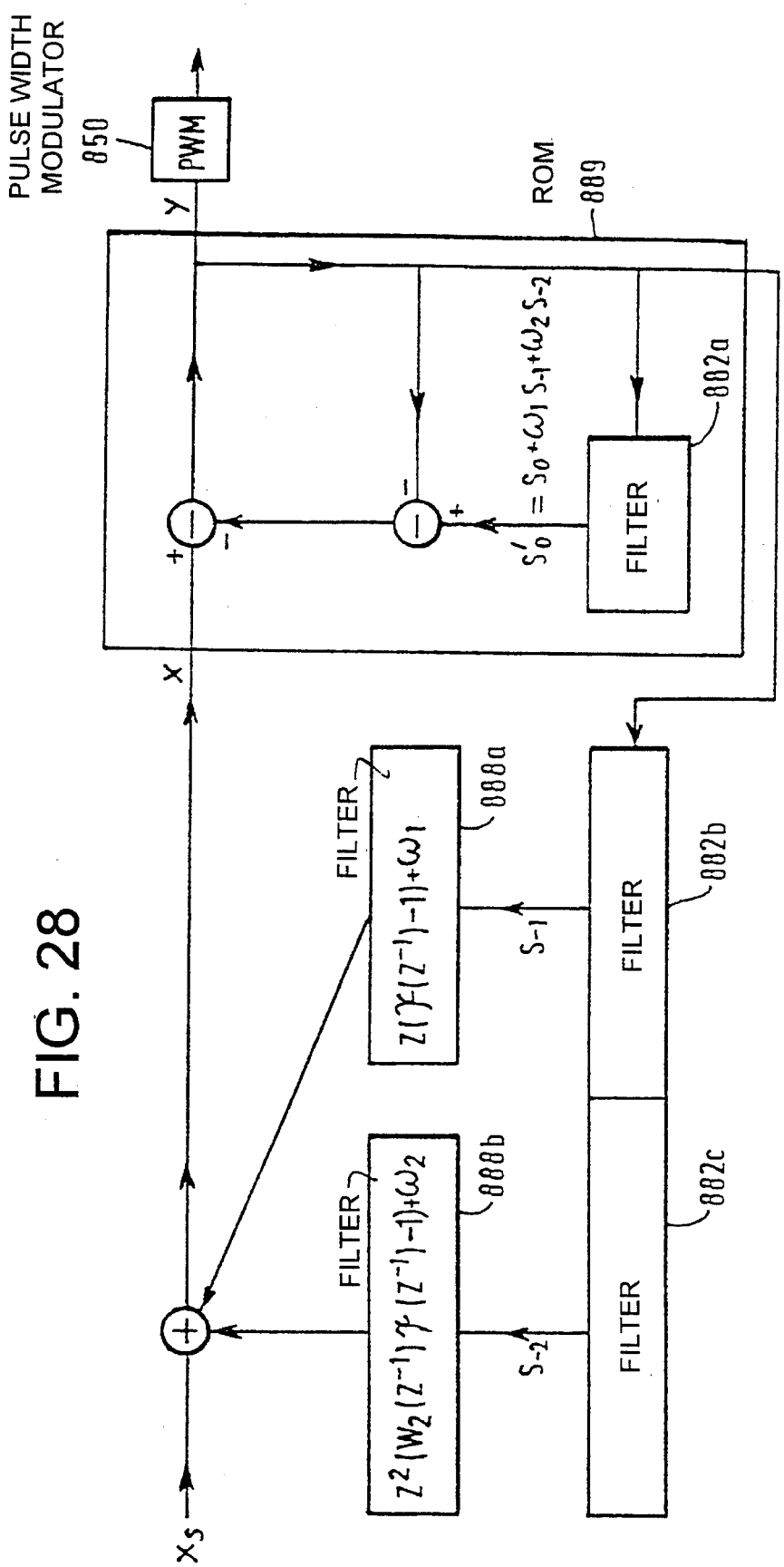
FIG. 28 shows the principle of operation of a digital to analogue converter according to a yet further embodiment of the invention.

Another embodiment of the invention which applies a predictive correction will now be disclosed. Referring to FIG. 13, and ignoring temporarily the presence of the quantizer, FIG. 28 shows the effect if the circuit of FIG. 13 is re-drawn, with all filters notionally advanced by one sample. If this is done, the filter $\psi(z^{-1})-1$ becomes unity (since there is now no delay) and the filters Wi in 88b and 88c include one further earlier term in their impulse responses so that $z(w2(z^{-1})\psi(z^{-1})-1)$ becomes $z(^{-1})-1)$ etc.

The "immediate" or delay free terms $W1S_{-1}$, $W2S_{-2}$ can then be subtracted from the filters and placed in a notional delay-free feedback loop; it will understood that this is not proposed as a practical circuit but merely as an illustration. Accordingly, the correction impulses $S_0$ and $W1\ S_{1-1}$, $W2\ S_{-2}$ which would have been added to the sample following that giving rise to the error which they are to correct, are added instead to the same sample at a subtraction node, after first having subtracted the modulator input. The remaining correction impulses $S_{-1}$ and $S_{-2}$ etc are supplied to respective noise shaping filters 888a, 888b to be added to the next and subsequent samples.

It is, however, possible to replace the circuit 889, which includes the physically impossible delay free feedback paths, with a simple look-up table since for every input X to the circuit 889, an output Y can be defined which depends only upon the input X and the filters 888b and 888c, with the delay free terms removed, are physically realisable.

Figure 29:
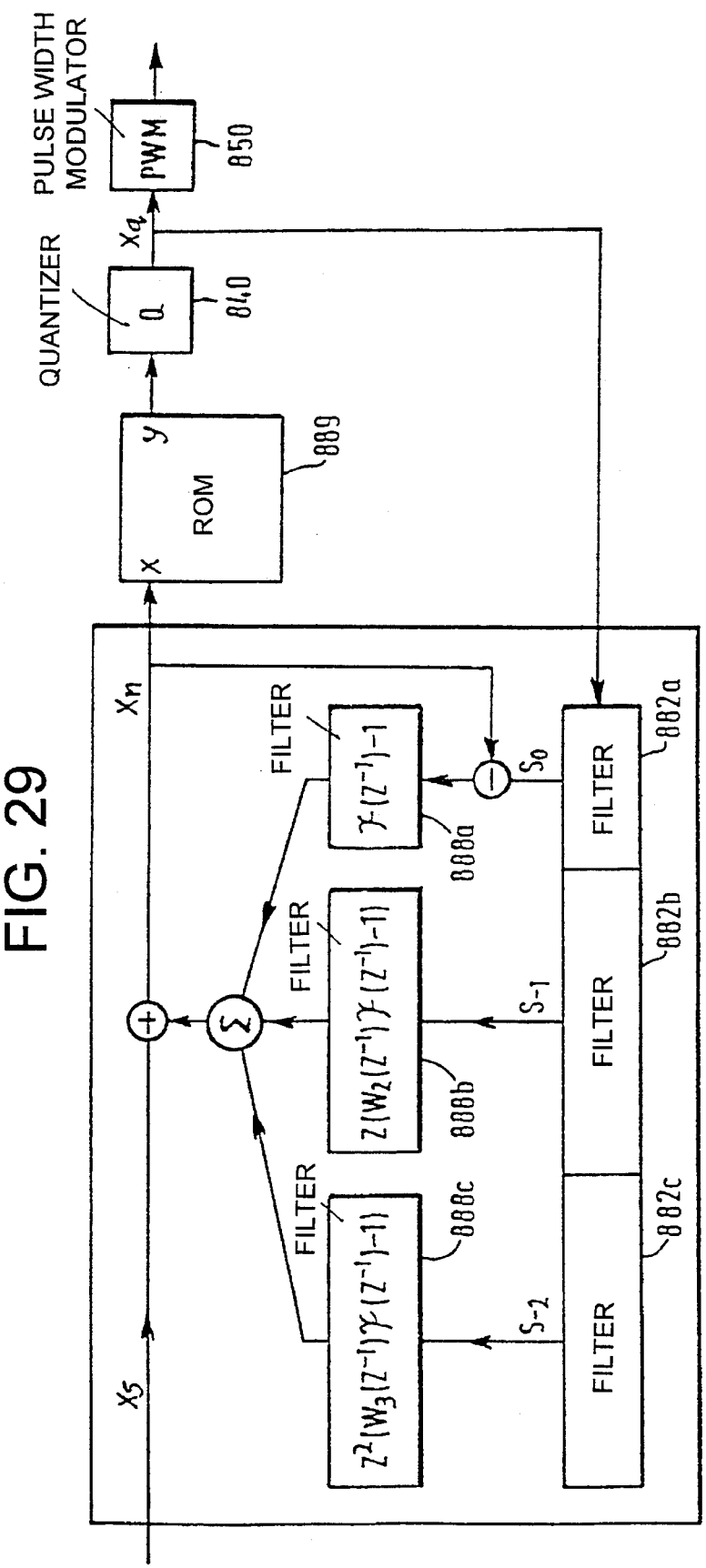
FIG. 29 shows schematically that embodiment of the invention.

Referring to FIG. 29 in this embodiment of the invention, there is therefore provided a ROM 889 which generates an output signal as a non-linear function of the digital word applied to its address lines, the output signal being supplied to the quantizer 840, the output of which is fed back to a plurality of look-up tables 882A, 882B, 882C which are noise filtered.

The filters 882A–882C are altered to take account of the processing applied by the non-linear circuit 889. The non-linear circuit 889 may be considered, together with the quantizer 840, to comprise a non-linear quantizer. Alternatively, the non-linear circuit 889 could be performed by a digital signal processing device calculating each value of the output Y from the input X using a numerical inverse interpolation method (for example the bisection method or the secant method). However, it is preferred to use a ROM since the resolution of the circuit 889 in practice needs not greatly exceed that of the quantizer 840 which follows; a relatively small ROM addressed only by the higher order bits of the input digital word may therefore be employed.

Seventh Embodiment—Quantizer Overload Reduction

In any kind of noise shaping system in which the output of a quantizer is fed back to its input and the quantizer noise is filtered so as to re-distribute it out of the signal band, there is the possibility that the signal at the input of the quantizer may exceed the outermost levels of the quantizer. Where this occurs, the quantizer response becomes non-linear and no amount of feedback or noise shaping can reduce the non-linearity.

When noise shaping is employed, the level of quantizer noise within the signal band of interest is reduced but it is increased above that band, and for the purposes of quantizer overload it is the magnitude of the noise rather than its spectral distribution which is significant. Even where, as in the example illustrated in FIG. 12, the input signal is generally restricted to lie within the inner levels of the quantizer there is a possibility that occasionally the quantizer noise when added to the signal level may temporarily overload the quantizer.

If the overload merely takes the form of allowing the quantizer itself to clip the input signal (for example, by restraining it to lie the maximum quantizer level of 7 instead of the actual level of 9), the quantizer error is increased by 2 levels. This increase to the error will be fed back through the filter shown, for example, in FIG. 2C and in a typical example filter can correspondingly generate to the input on the quantizer a perterbation of −4−+5 The next sample will therefore overload the quantizer by an even greater amount, and this will clearly lead quickly to instability.

If the quantizer is permitted to have additional levels (for which there is no pulse width modulator equivalent output) clipping may be performed after the quantizer output so that the error is not fed back.

However, without feedback the error will include components in the signal band and consequently will be noticeable. Known approaches therefore attempt to compromise between these two extremes. Clipping circuits are positioned within the noise shaping filter which provide reduced amounts of noise shaping of the clipping error, carefully controlled so as not to provoke instability.

Since, as noted above, the negative quantization error caused by the clipping leads to a positive correction to the next signal input to the quantizer which causes it to overload the quantizer even more, it follows that had a positive quantizer error been added to the preceding sample, the feedback would produce a negative correction at the next sample which would tend to reduce the signal level and could be arranged to do so to the point where no overload occurred.

Figure 30:
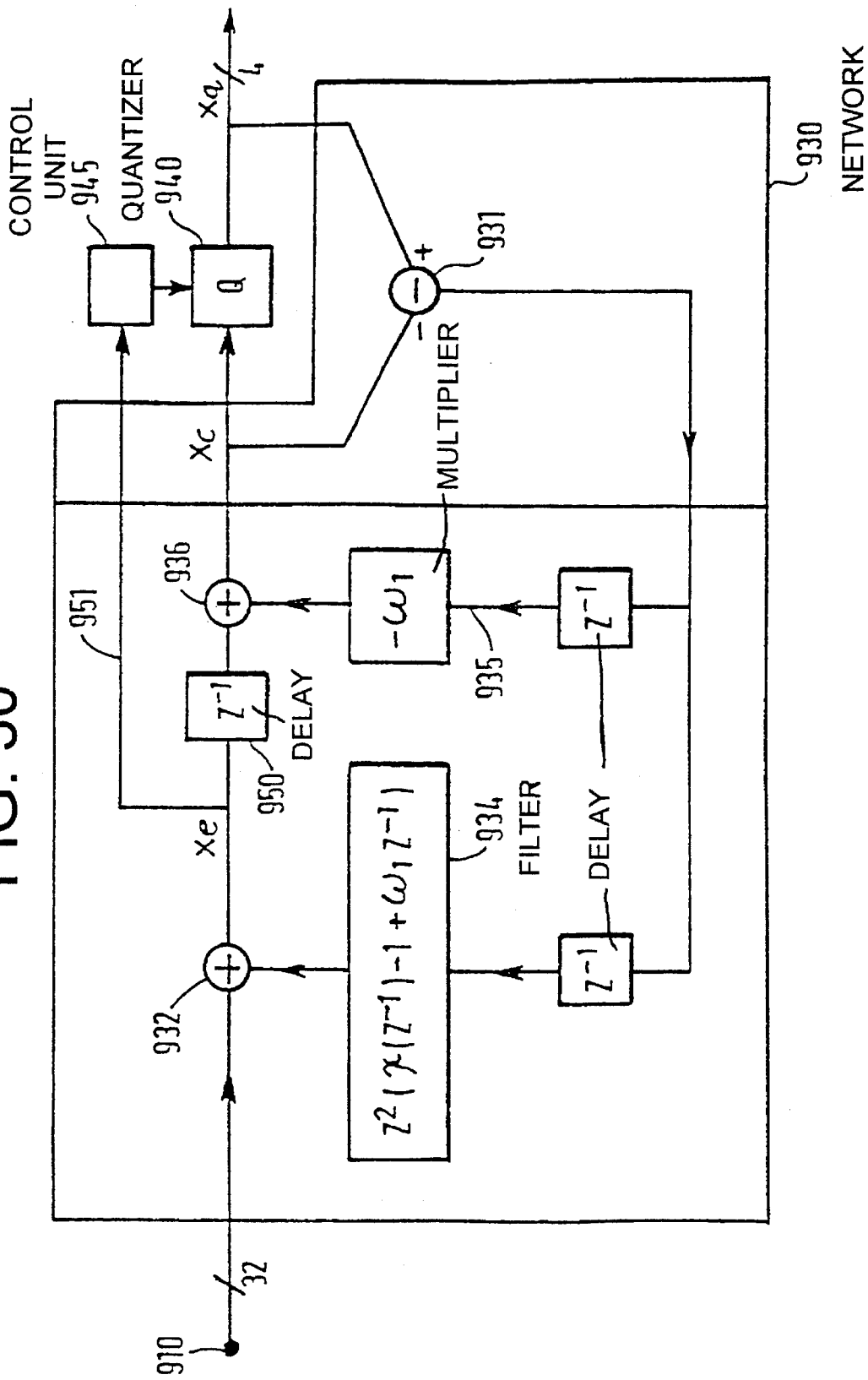
FIG. 30 shows schematically a noise shaping quantizer feedback circuit including means for preventing quantizer overload according to a further embodiment of the invention.

Referring to FIG. 30 in a quantizing system according to this embodiment of the invention, a digital signal comprising a plurality (for example 32) of bits is received at a oversampled rate at a digital input 910 and fed through a network 930 to a quantizer 940 which produces at its output a digital signal comprising a reduced number of bits (for example 4). The output signal is fed back via the network 930 to modify the subsequent quantizer inputs providing noise shaping feedback. The network 930 is similar to that shown in FIG. 2C and correspondingly comprises a subtraction node 931 forming the difference between the quantizer output signal and the sample at the quantizer input (the quantizer error). The error is fed back via a filter 934 to affect a subsequent input sample at an addition node 932.

In order to implement this embodiment of the invention, between the point (932) at which the quantizer correction is added to the signal and the quantizer 940, a delay stage 950 is provided. The signal prior to the delay stage 950 thus represents the value which will be quantized next, after the current sample at the input of the quantizer 940. A feed forward path 951 is provided around the delay 950, and connected to a control unit 945 connected to the quantizer 940. When the value of the signal received via the line 951 indicates that the sample, when received at the quantizer input, would cause the quantizer to overload in a positive direction the control unit 945 adds a corresponding positive quantizer error to the sample to be quantized (and correspondingly a negative error in the case of a negative overload) and this error propagates through the subtractor 931 back to affect the next sample to reduce the magnitude thereof and prevent the overload. The introduced error is itself shaped by the noise shaping and consequently components within the signal band are substantially reduced. It can be shown algebraically that the circuit of FIG. 30 is functionally identical to that of FIG. 2C except that the signal is delayed one sample period, under circumstances where the control unit 945 is inactive.

In order for the error generated by the control unit 945 to propagate back and affect the next sample, a first feedback path 935 (including the unavoidable one stage delay) is provided to the signal path subsequent to the delay 950. If only first order noise shaping is provided, as shown in FIG. 2A, the filter 934 and associated path and adder 932 are unnecessary. If, however, higher order noise shaping is desired (as is strongly preferred in the embodiments of the present invention) the complexity and recursive nature of the noise shaping filter means that it cannot be fed back to a point following the delay 950 for reasons discussed below. This problem is overcome by separating the filter of FIG. 2C into the form shown comprising the first part 935 within which is positioned a multiplier executing a fixed multiplication of −w1, and the filter 934 having the form $Z^2 (\psi(Z^{-1})-1+W_1Z^{-1})$.

The control unit 945 may comprise a digital computing device, in this case the flow of operations of the device is as follows.

The value of the signal from the line 951 is examined. The value of this signal alone is insufficient to determine whether the quantizer will overload, since a correction term from the previous quantizer output will be added via the line 935 and summing node 936. Accordingly, the value of the present quantizer input and outputs are subtracted and the difference is multiplied by −w1. This value is added to the sample from the line 951, representing the next sample which will appear at the input of to the quantizer 940. If this value falls within the quantizer range, the control unit 945 takes no action and the quantizer 940 operates as normal. If the value on the other hand indicates that a quantizer overload is imminent, the control unit 945 causes the quantizer 940 to add a corresponding error to the present quantizer output. The control unit 945 could add a small increment to the signal prior to the quantizer 940, or could instead influence the operation of the quantizer; the control unit 945 and the quantizer 940 could comprise a single digital processor arranged to execute a rounding routine, but it can be shown that, because of the limited number of quantizer output states, every solution which could be calculated can in fact be stored within a ROM the address lines of which are jointly responsive to the present quantizer input sample and the sample received from the line 951.

The control unit 945 is also arranged to assess whether the effect of correcting the next sample received from the line 951 would be to cause the current sample also no overload; in the event that it would, in this embodiment no attempt to correct the overload will be made.

It may also be advantageous to check several stages ahead and, in the event that correcting a just-preceding sample would cause overload, correct the sample before instead.

Figure 31:
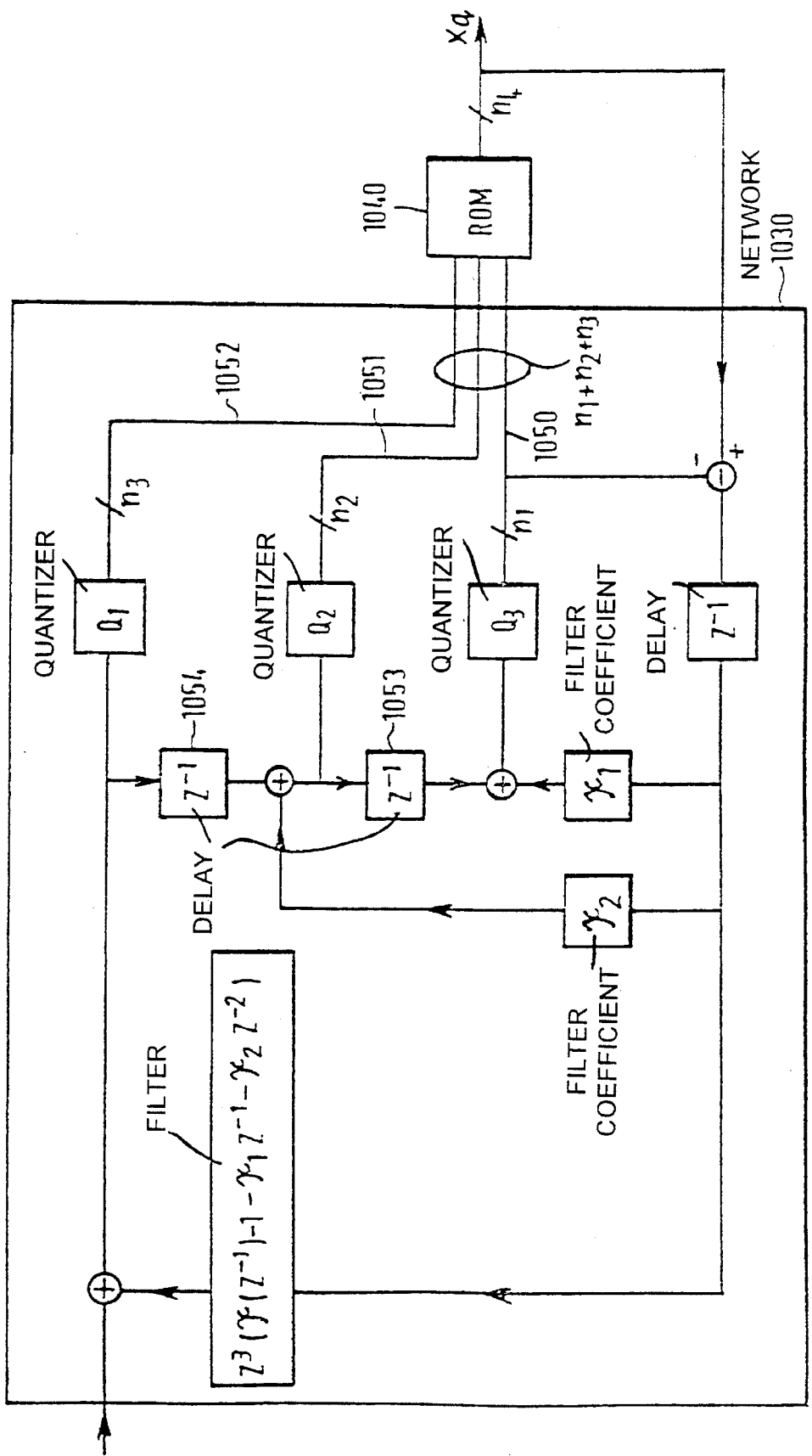
FIG. 31 shows schematically an alternative arrangement to that of FIG. 30.

FIG. 31 shows an embodiment of this type, where a single ROM 1040 is jointly responsive to three four bit input lines

1050, 1051, 1052 coupled to its address bus to produce an output corresponding to a quantized representation of samples on the first line 1050 where a compensating error is introduced if the values of the other lines 1051, 1052 indicate a prospective quantizer overload. The use of two delay stages allows correction optionally of one of two samples, which is advantageous where it is not possible to correct the immediately preceding sample without causing that sample also to overload the quantizer.

Circuits of the type shown in FIG. 1 are generally stable. However, introducing non-linearity within the feedback path as in the first embodiment of the present invention introduces a possibility that instability could occur; various means of preventing instability are available. One particularly preferred method, where the measures to avoid quantizer overload discussed with reference to FIGS. 30 and 31 are employed, is to arrange that instead of merely preventing instability in the particular case of a quantizer overload, the control unit 945 is arranged to test every sample for the possibility of instability and to ensure that this does not occur. A single ROM 1040 may act as a quantizer with avoidance of overload and circuit instability. It will be recognised, however, that the use of a control element (preferably a look up table) within a noise shaping feedback loop to prevent instability on a sample by sample basis is applicable in many other applications than those described above.

This embodiment and that of FIG. 30 are particularly advantageously employed with a 1 bit (2 level) quantizer.

Eighth Embodiment—Digital-to-Analogue Converter

Before describing the eighth embodiment, it is convenient to recap some features of earlier embodiments.

In the embodiment of FIG. 19, it is disclosed that a look-up table providing non-linear correction can be jointly responsive both to a present sample for input to the PWM and a preceding sample.

In the embodiment of FIG. 27, the pulse width modulator non-linearity is corrected on the sample which will give rise to the error when it subsequently passes through the pulse modulator, and the residual error due to the inaccuracy of the predicted correction is noise shaped. The provision of bulk delay 690 enables the apparatus to look ahead and predict subsequent PWM inputs, and to perform feed forward correction using the ROM 682.

The embodiment of FIG. 29 employs non-linear correction on a sample input to the PWM to take account of the PWM error in that same sample, by providing a look-up table 889 in the forward signal path and compensating for this in the feedback look-up tables.

In the seventh embodiment, FIG. 31 shows a single ROM in the signal oath jointly responsive to several mutually delayed input samples to quantize the input samples to avoid an overload.

As discussed above, it is not possible to effect non-linearity correction at the pulse width modulator input because the signal at that point is coarsely quantized. Nor is it directly possible to correct the signal at the quantizer input, because this does not take account of the error introduced by the quantizer. Accordingly, in the invention the correction is effected on the unquantized signal but with feedback taking account of the quantizer error. However, as discussed above, the magnitude of the quantizer error can be substantial and this can lead to instability or other problems.

In this embodiment, to avoid instability, the solution of the sixth embodiment is adopted so that as much correction as possible is performed in the forward signal path, reducing the magnitude of the feedback signal and hence the tendency to instability of the circuit.

In this embodiment, the ROM 889 in the forward path is provided with a preceding delay stage and made jointly responsive to several differentially delayed input samples. It is therefore possible to correct a sample for the error which will in future occur in the PWM output corresponding to a later sample, thus directly adding the $S_{-i}$ correction samples. However, as already noted in the sixth embodiment, such correction cannot be perfect since the delayed samples available at the feed forward correction ROM do not exactly correspond to the inputs to the PWM; they will in their turn be modified by feedback to take account of yet later occurring samples. Accordingly, as in the sixth embodiment, there is an error due to the use of prediction, and this prediction error is taken account of by providing non-linear feedback correction to subsequent samples, as in previous embodiments.

In this embodiment, by placing differential delays in the forward signal path and providing for feed forward (delay free) correction in the ROM in the forward path, the apparatus is (partially) available to correct for the error in the PWM output due to a sample by effecting the correction on samples occurring earlier in time. Because of this feed forward correction, the delayed noise shaping feedback described with reference to FIGS. 12A–12C is not directly necessary, as the correction impulses can be added directly to the signal samples. The correction added to preceding and succeeding samples is thus symmetrical, as was the case in FIG. 12B, but the symmetry is achieved by delaying the input signal rather than delaying the "future time" correction impulses as was done in FIG. 12B.

However, the "future time" corrections applied are not exact because they do not take account of samples even further into the future and the effects of adding the correction due to such samples to those within the apparatus. The difference between the predictive correction thus applied and the actual output of the pulse width modulator must therefore be fed back to correct later samples, using delayed noise shaping.

Figure 32:
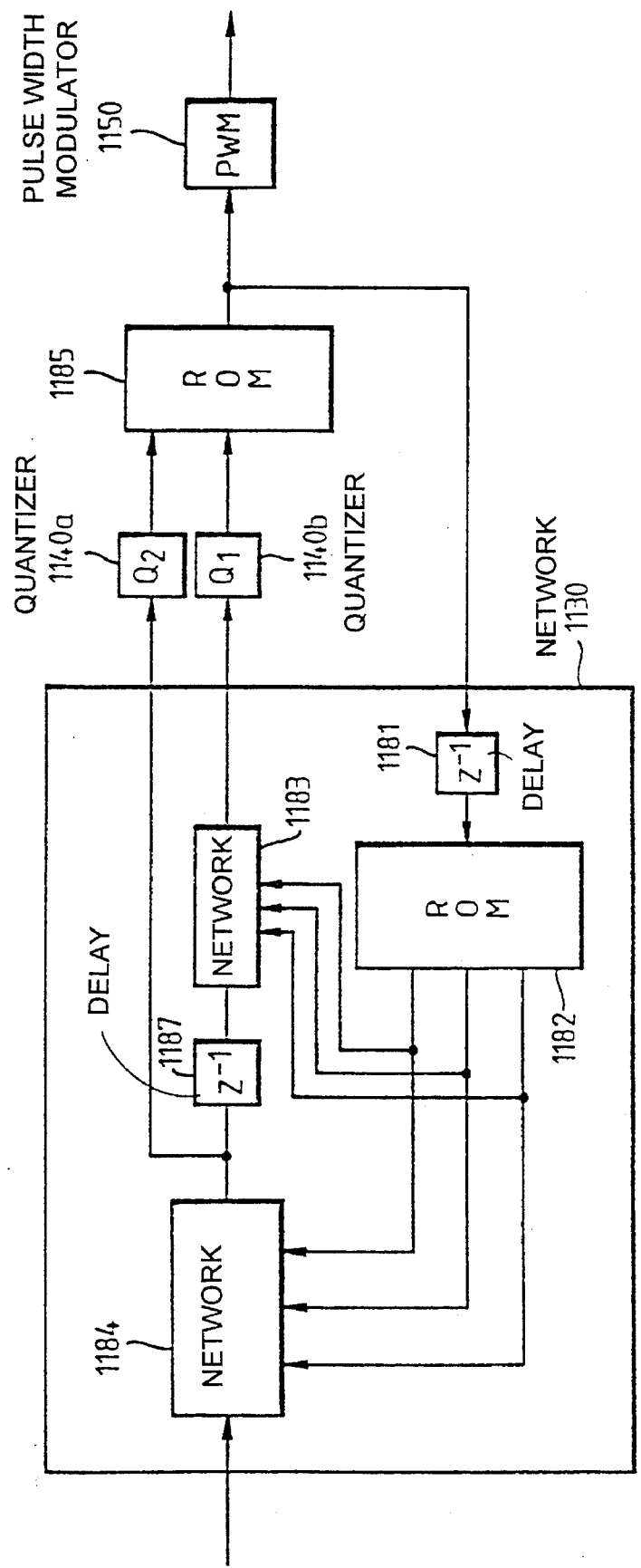
FIG. 32 shows schematically the structure of a further embodiment of the invention.

Referring to FIG. 32, in this embodiment the input to the pulse width modulator 1150 is provided from a non-linear generator 1185 comprising, in this embodiment, a look-up table ROM providing "same sample" correction like the ROM 889 in FIG. 29. To the address lines of the ROM 1185 are coupled two coarsely quantized samples supplied from the combining network 1130; the quantizers 1140A, 1140B in each line are in this embodiment merely stages at which the lower order bits of a parallel bus are truncated. For example, the ROM 1185 may be responsive to 14 address bits comprising two 7 bit quantized signals. The input to the pulse width modulator 1150 is fed back, via a unit delay 1181, to a ROM 1182 providing a plurality of outputs which are a non-linear function of the input to the pulse width modulator. The outputs of the simulator ROM 1182 are combined with the input signal in a first linear network 1184. A feed is taken forward from the output of the network 1184 to the first quantizer 1140A. The signal path passes thereafter through a one stage delay 1187 and a further linear network 1183 connected to the outputs of the simulator ROM 1182, the output of which passes to the second quantizer 1140B.

In fact, the delay 1181 could be positioned in the output paths of the ROM 1182, which could form a single device with the ROM 1185; naturally, the ROM 1182 could also be addressed from the quantizers 1140A, 1140B rather than from the ROM 1185 output. However, the arrangement shown is convenient in that it enables a compact realisation of the simulator ROM 1182 addressed by only a small number of bits (since the input to the PWM 1150 contains only a small number of levels).

As in the sixth embodiment, this embodiment effects some instantaneous correction in the ROM 1185 and the filter networks 1184, 1183 are rearranged to take account of the instantaneous correction, so that the feedback circuit provides those signal paths that the ROM 1185 does not itself provide instantaneously.

Figure 33:
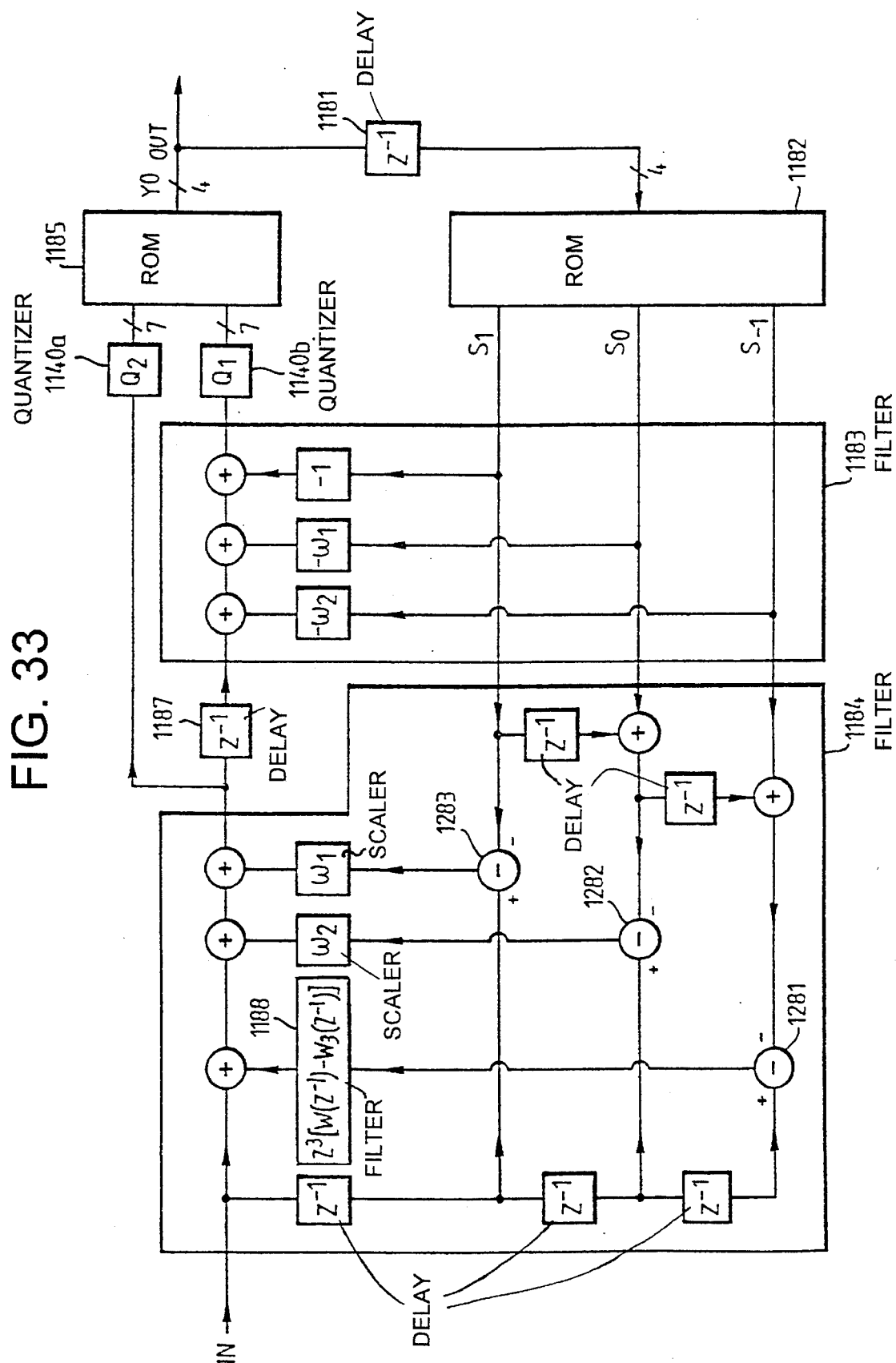
FIG. 33 shows schematically the structure of a particular example of the structure of FIG. 32.

Referring to FIG. 33, in which as previously W is the required noise weighting filter, $w_N$ is the Nth term of the impulse response of the filter, and $W_N$ is $$\text{the truncated filter comprising } \sum_{i=0}^{N-1} w_i z^{-i}$$

The impulses $S_{-1}$, $S_0$, $S_1$ simulating the audio frequency effect of the output of the pulse width modulator corresponding to the input Y thereto are fed back, weighted by the first three terms respectively of the impulse response of the noise weighting filter, and subtracted from the signal supplied to the quantizer 1140B in the network 1183. In the network 1184, the samples are differentially delayed for time alignment, summed and subtracted from the thrice delayed input signal at a subtraction mode 1281, and the difference is filtered in a filter 1188 response $Z^3[W(Z^{-1})-W_3(Z^{-1})]$, and added to the input signal prior to the delay 1187. The impulse $S_1$ is likewise subtracted from the once delayed input signal at a node 1283, scaled by a factor $w1$ and added to the input signal, and is also delayed and added to the impulse $S_0$, subtracted from a twice delayed input signal at a node 1282, scaled by factor $w_2$ and added to the input signal.

Figure 34:
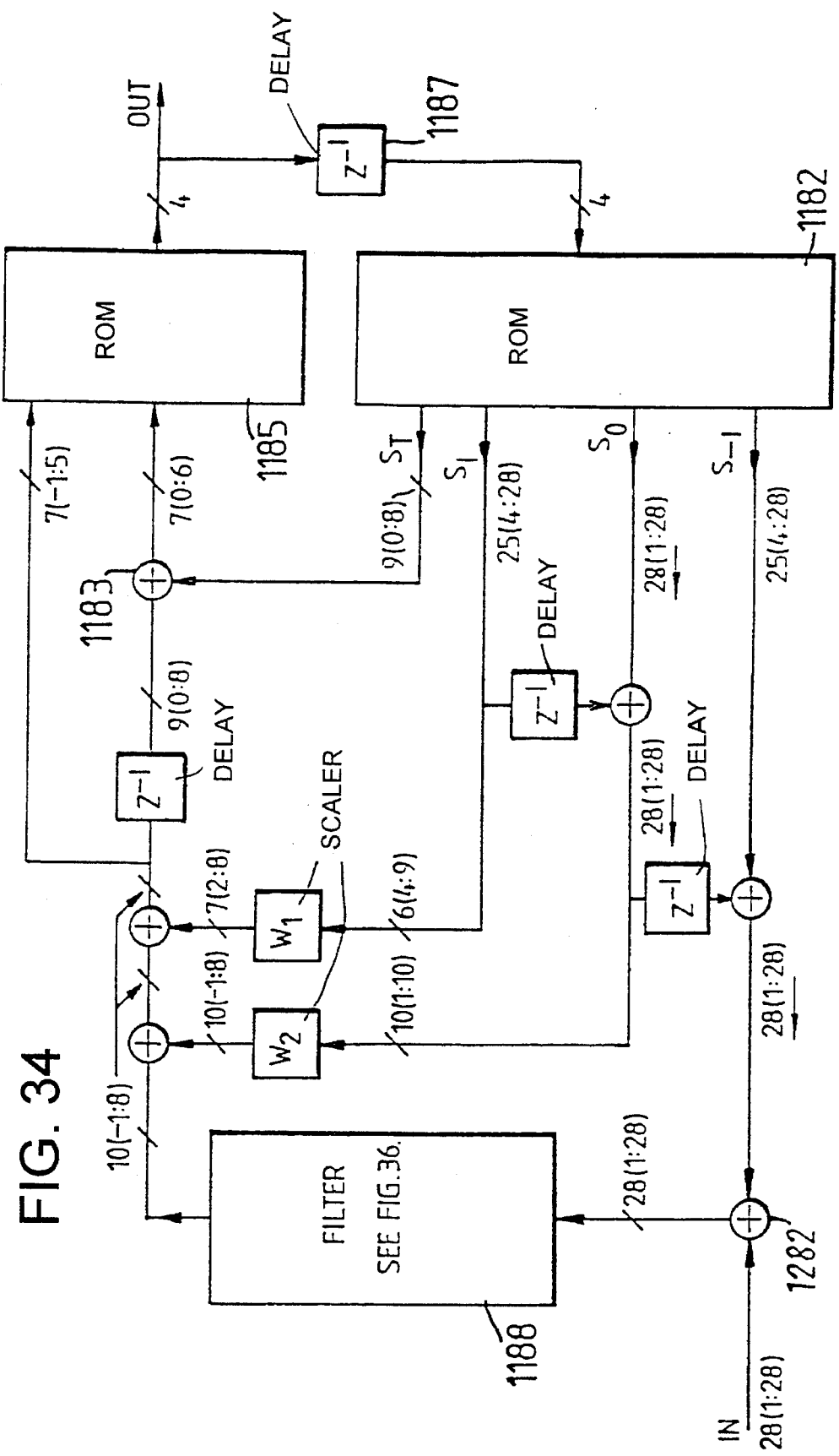
FIG. 34 shows schematically the structure of an alternative construction according to FIG. 32.

Referring to FIG. 34, the circuit of FIG. 33 may be simplified as follows. Firstly, since the network 1183 provides multiplications by constants, the ROM 1182 may contain stored values $S_r = -(S_1+w_1S_0+w_2S_{-1})$; this reduces the number of calculations necessary, since the network 1183 now comprises a single add node. The delayed input signal path to subtraction node 1281 remains, but the paths to nodes 1282 and 1283 are removed as is the direct signal path, as in the transformation between FIGS. 2E and 2F. The filter 1188 is shown in greater detail in FIG. 36. The value of $w_1$ is 2, and the value of $w_2$ is $3.875=31 \times 2^{-3}$.

Interpolator

Figure 35:
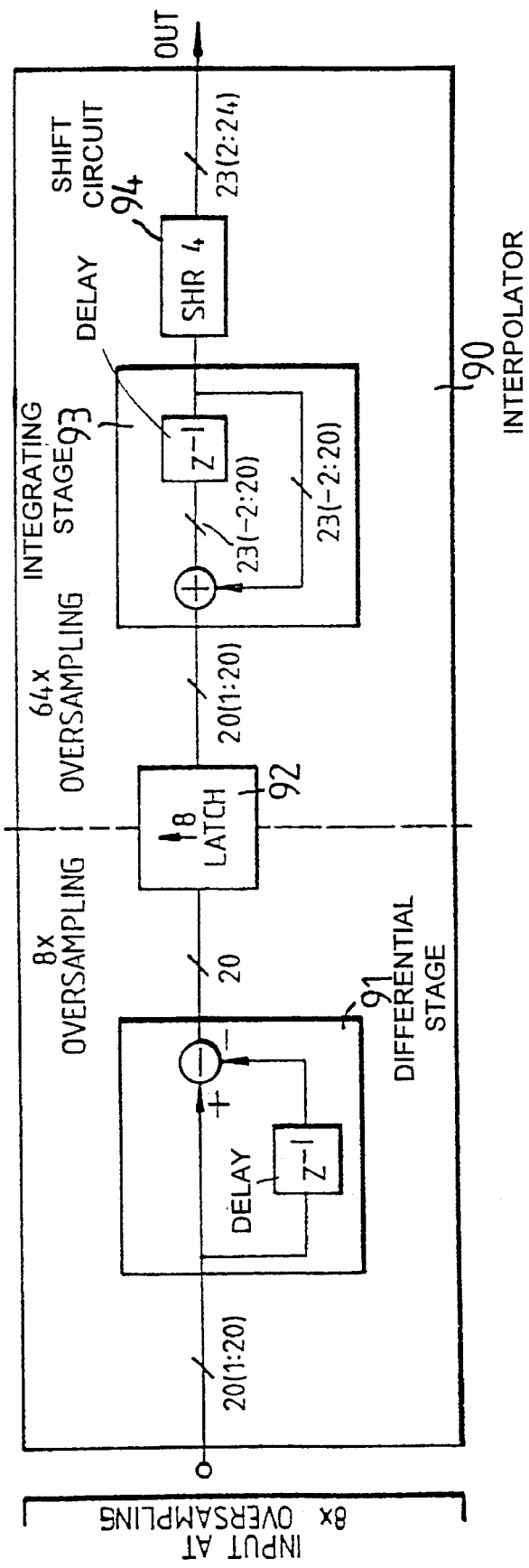
FIG. 35 shows schematically an interpolator suitable for use with the arrangement of FIG. 34.

Referring to FIG. 35, the structure of one suitable interpolator will now briefly be described; linear interpolators are of themselves well known and other circuits may well be equally suitable in other applications.

At the digital input port 10, the interpolator 90 receives an input signal at a rate 8× the Nyquist frequency for the signal (i.e. 15× the highest frequency of interest within the signal); for example, a 20 bit parallel signal with one sign bit. The input signal is differenced by a differential stage 91 comprising a unit delay in a feed forward path subtracted from the signal, and the differenced signal is latched in a 20 bit latch 92 from which it is read out at a frequency 8× that of the input sampling frequency (i.e. at an oversampling ratio of 64). The signal read cut from the latch 92 is accumulated in integrating stage 93 comprising a one delay feedback accumulator, the output of the integrator 93 being divided by 16 by a right shift circuit 94 effecting a 4 bit rightward shift by reconnecting the wires in the bus. The output of the integrator 93 is a 23 bit wide bus, since the integrator 93 is operating at 8 times the rate of the different circuit 91.

Filter

Figure 36:
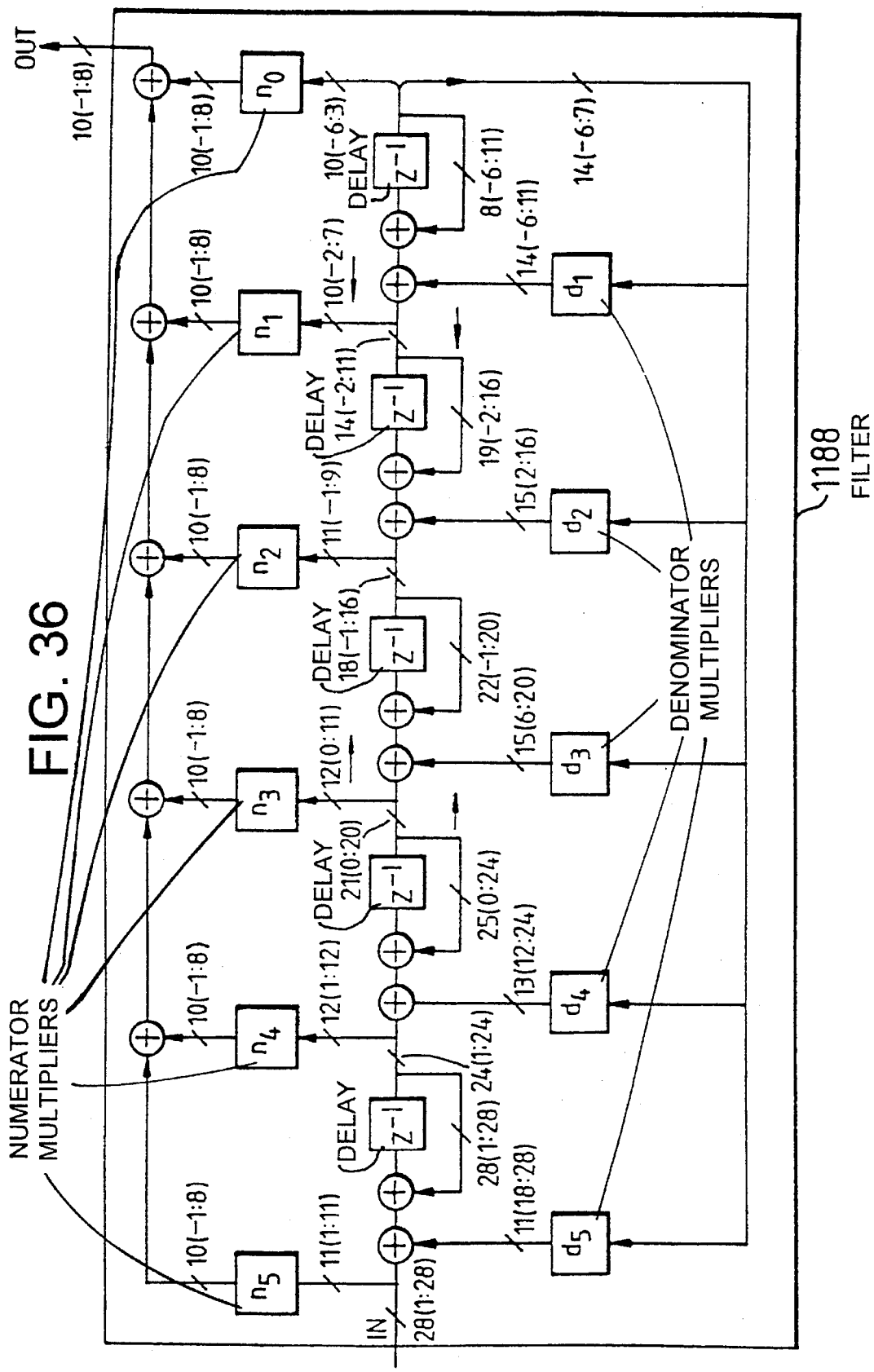
FIG. 36 shows schematically a filter forming part of the arrangement of FIG. 34.

The filter may of course be realised in a number of different structures, as is well known in the art. One suitable structure is illustrated in FIG. 36, comprising cascaded integrating sections with feed forward taps multiplied by numerator coefficients at numerator multipliers $n_0$–$n_5$, and feedback from the end of the chain of integrators through denominator multipliers $d1$–$d5$. The filter is fifth order, and the numerator and nominator coefficients are as follows:

Numerator:

$n0 = 0.038414 \approx 157 \times 2^{-12}$
$n1 = 0.478912 \approx 981 \times 2^{-11}$
$n2 = 2.19584 \approx 2249 \times 2^{-10}$
$n3 = 6.05444 \approx 3100 \times 2^{-9}$
$n4 = 11.08503 \approx 2838 \times 2^{-8}$
$n5 = 6.79145 \approx 869 \times 2^{-7}$ Denominator:

$d1 = -0.068261 \approx -280 \times 2^{-12}$
$d2 = -0.050119 \approx -657 \times 2^{-17}$
$d3 = -1.7826 \times 10^{-4} \approx -748 \times 2^{-22}$
$d4 = -4.7914 \times 10^{-6} \approx -322 \times 2^{-26}$
$d5 = -5.5668 \times 10^{-8} \approx -120 \times 2^{-31}$ The design is arranged to reduce the number of large bit number additions, and subtractions. On each bus, the number before and after the colon in the figures indicates the positions of the MSB and LSB respectively, relative to a notional binary point. A negative sign indicates a position preceding the binary point. The numbers are generally signed. At switch on, all the latches z are set to zero.

Alternative Constructions

Figure 37:
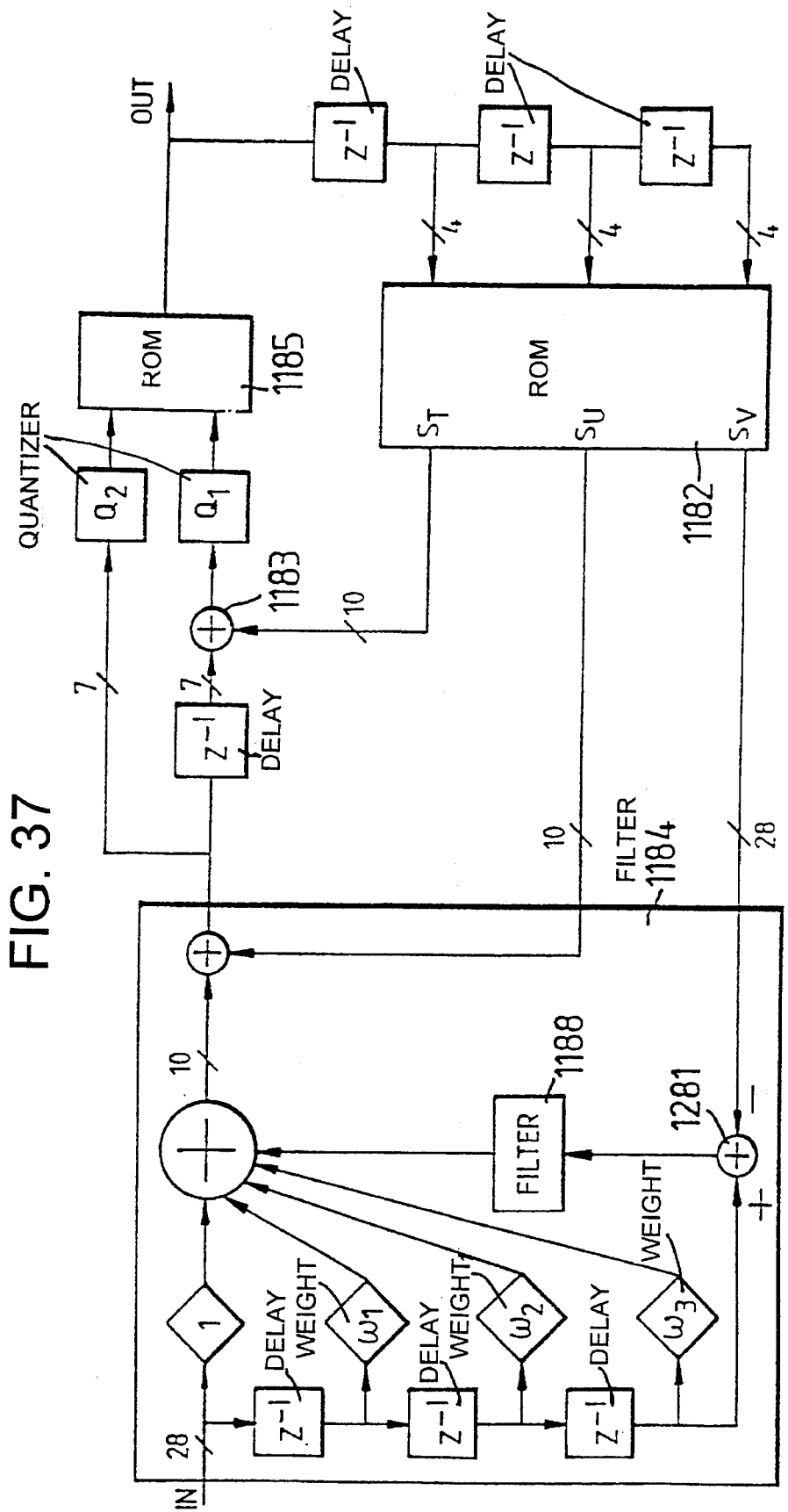
FIG. 37 shows schematically an alternative arrangement according to FIG. 32.

The embodiments of FIGS. 33 or 34 may be modified in structure without affecting their function. In FIG. 37, the delayed input signal paths of FIG. 33 are separately provided, and the filter 1188 of FIG. 36 is modified to remove the forward signal path. Further, in the manner of FIG. 11C, the time alignment delays connected to the outputs of the ROM 1182 in FIGS. 33 and 34 are repositioned at the input to the ROM 1182 and, in the manner of FIG. 19, the ROM is made jointly responsive to the plurality of mutually delayed inputs. This extends the required storage capacity of the ROM to 212 bits; ROMS of this size are readily commercially available. The output $S_T$ of the ROM comprises, as in FIG. 34, the weighted sum of the simulation pulses $S_1$, $S_0$, $S_{-1}$ generated in response to only the once delayed output of the ROM 1185 (input to the PWM). The output $S_U$ of the ROM 1182 provides the negated feedback inputs formerly at the nodes 1282 and 1283 and accounts for the removed term from filter 1188, and the output $S_V$ of the ROM 1182 comprises the negated input of the subtraction node 1281 of FIG. 33. All three such ROM outputs can be precomputed from a knowledge of the output of the PWM and of the noise weighting W required.

Finally, the delayed input paths which are present in this embodiment can be dispensed with, in the same fashion as in the transition between FIGS. 2E and 2F; the effect in the audio band is very minor, although a good interpolator circuit 90 is required. If the delayed forward signal paths are retained, they need only be provided in relatively low bit accuracy.

Feed Forward ROM

Figure 38:
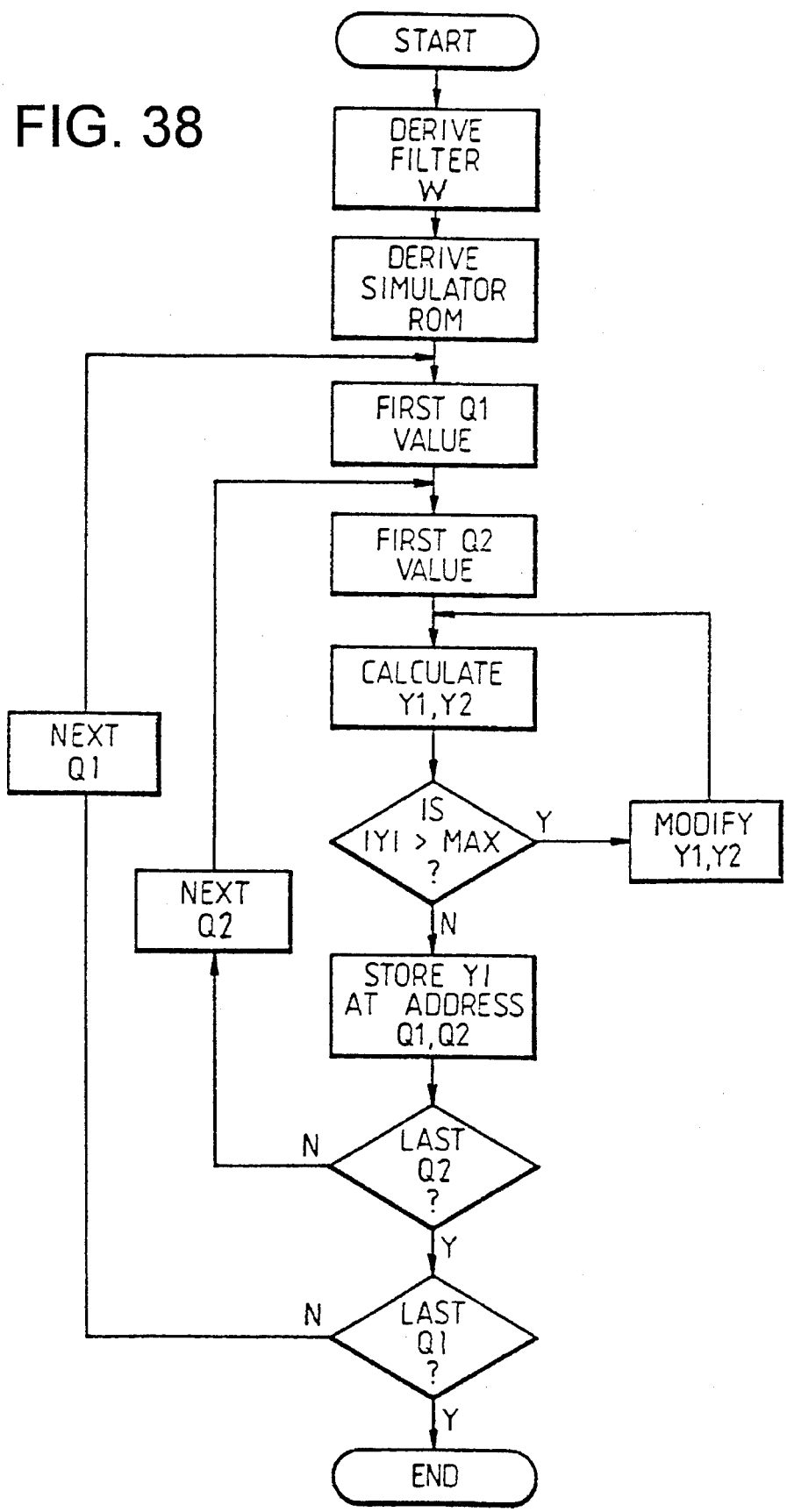
FIG. 38 shows schematically the process of deriving the contents of a look-up table forming part of FIG. 34.
Figure 39:
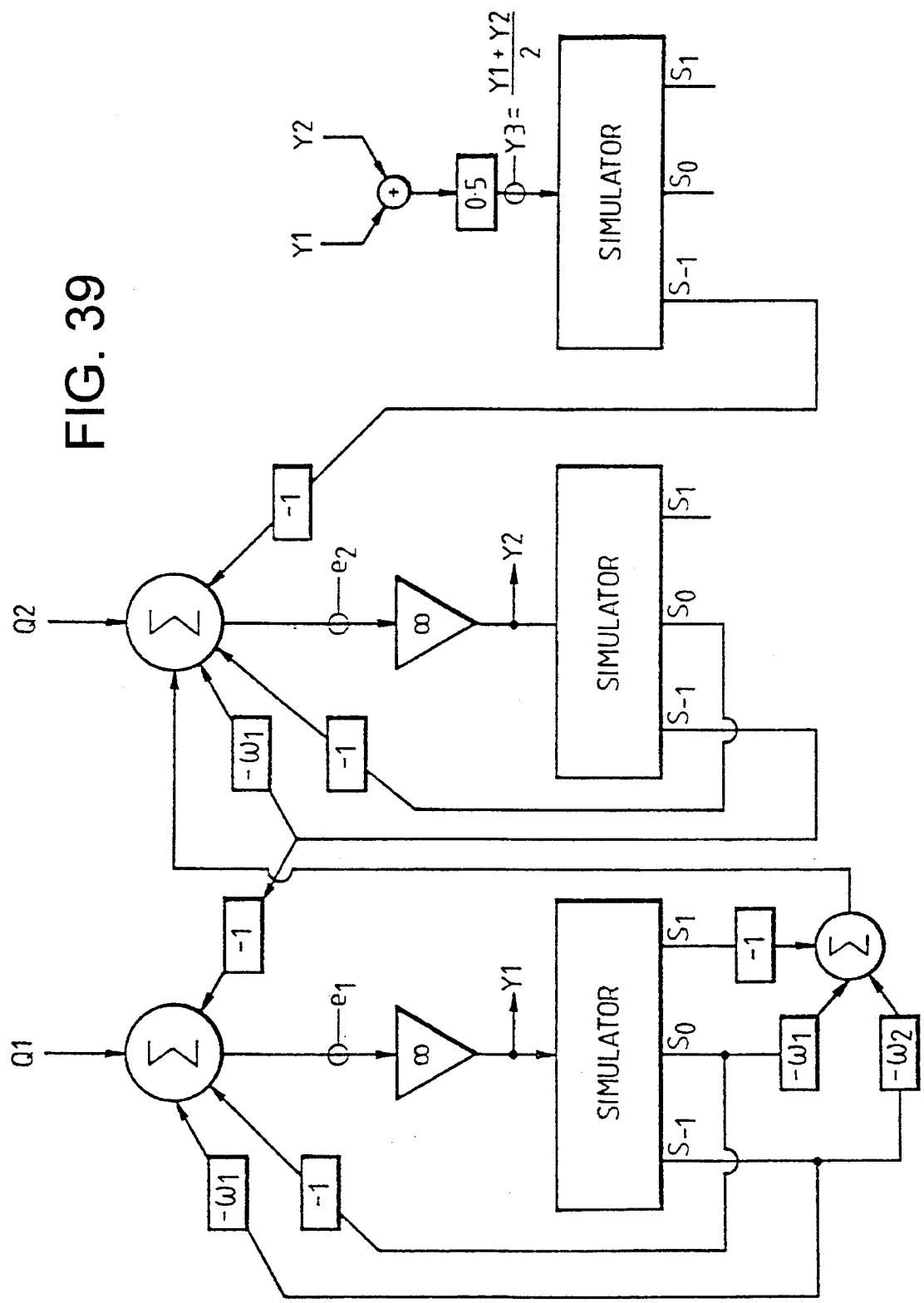
FIG. 39 illustrates diagramatically the process of FIG. 38.

Referring to FIGS. 38 and 39, a method of deriving contents of the feed forward ROM 1185 will now be disclosed.

Initially, the noise weighting filter W is derived as disclosed above with reference to the above referenced Gerzon and Craven paper, as a minimum phase filter with a stop band extending over the audio spectrum, and a relatively flat pass band above the audio spectrum. The set of pulses $S_{-i}$–$S_j$ is then derived to simulate the effects of non-linear errors in the output stage including the pulse width modulator, as described above, to provide a set of such pulses for each possible output of the pulse width modulator.

Initial values for the quantized signals Q1, Q2 output by the two quantizers 1140A, 1140B are selected. Using these values, referring to FIG. 39, a pair of corresponding ROM output values $Y_1$, $Y_2$ are calculated.

Referring to FIG. 39, which is a signal flow diagram of the calculation, the task is to calculate the values of y1 and y2 that make the error terms e1 and e2 as small as possible, y1 is interpreted as the signal fed to the modulator at the current instant, ant y2 is interpreted as an approximation to the modulator input at the next sample instant, when the information currently present at Q2 will have been transferred to Q1 (plus extra terms introduced by network 1183).

Ignoring quantization, the values e1 and e2 may both be forced to zero; the necessary values for y1 and y2 may be found for example by solving the following non-linear simultaneous equations;

| | |
|---|---|
| Q1 = | w1.S − 1 (y1) + S0 (y1) |
| | + S − 1 (y2) |
| Q2 = | w2.S − 1 (y1) + w1.S0 (y1) + S1 (y1) |
| | + w1.S − 1 (y2) + S0 (y2) |
| | + S − 1 (y3) |

However, the last term of the second equation involves y3, interpreted as a prediction of the modulator input two samples hence. To avoid having to make such a prediction accurately, an arbitrary expression is inserted here: y3=(y1−y2)/2 is convenient, but other values could be employed.

The adjustment process involves, for example, testing the values y1 and y2 to see whether they lie close to the values at which the magnitude of the feedback error may cause overload. If y2 exceeds the maximum acceptable level, it is set to the maximum acceptable error and y1 adjusted so that e2 is zero. If y1 exceeds the maximum acceptable level, it is set to the maximum level.

The calculated output value $Y_1$ is then stored at an address corresponding to the bit pattern defined by Q1 and Q2 at the address lines of the ROM 1185. The process is then repeated for all other quantized values of Q1 and Q2. The values of the outputs of the quantizers 1140A, 1140B are in practice not greatly dissimilar and hence in practice those entries in the ROM 1185 which are addressed by widely differing Q1, Q2 values may not in fact need to be calculated and stored; calculation of meaningful values in this case may also not be possible.

By inspection of FIG. 39 and comparison with FIGS. 33 and 34, it will be seen that the simulated PWM outputs which are taken into account when calculating the stored values $Y_1$ within the feed forward ROM 1185 in fact correspond to the paths which are not present within the feedback networks 1183, 1184. The notional structure of FIG. 39 is drawn to indicate the analogy of the ROM 1185 with a high gain operational amplifier with feedback, the output of which is determined by the constraint that the feedback cancels the input signal at its input. This arrangement is shown merely for clarification, and does not describe an actual circuit.

It will of course be apparent that the structure of FIGS. 32–34 could be extended by providing a third quantized input to the ROM 1185 corresponding to a doubly delayed input path; in this case, the extension of the process for deriving the output values stored in the ROM to a third input Q3 will be apparent.

Predictive Power Amplifier

As mentioned above, with reference to FIG. 26, the invention may be employed to provide a digital power amplifier by connecting the output of the pulse width modulator to drive a power transistor 551 filtered by a low pass filter 560. As mentioned above, a pulse width modulator 550 which modulates both edges of each pulse with succeeding signal samples is particularly suitable as this doubles the rate at which signal information is output by the pulse width modulator 550. However, as mentioned above, at particular signal values the edges of pulses will closely approach and the movements of the pulse edges will be closely correlated. In this case, since the semiconductor switch 551 will have a finite rise and fall time due to, for example, the capacitance of the transistor, the edges may interact with each other. In this case, preferably, the correction samples are derived in dependence upon combinations of adjacent pulse values and the feedback ROM is, as in FIG. 19, responsive jointly to the pair of mutually delayed feedback samples. The eighth embodiment is particularly preferred for a power amplifier using this type of modulator, since the ROM 1185 is jointly responsive to two or more mutually delayed samples and can therefore take account of the interaction between pulse edges.

In this particular use of the eighth embodiment, the process of FIG. 38 is performed so as to calculate $Y_1$, $Y_2$ with quantized values, chosen to minimise a function of the errors $e_1$, $e_2$ (rather than calculating $Y_1$ and $Y_2$ to high precision by setting the errors to zero, and then subsequently quantizing $Y_1$ for storage in the ROM 1185).

SUMMARY

It will thus be seen that the invention provides correction in a sample system for errors generated between sampling instants, by providing correction at a plurality of sampling instants so as to correct for the errors over the signal frequency band of interest. This is, in some preferred embodiments, achieved by generating, in response to an estimate of the signal which will be output by the error generating stage, a plurality of sample values simulating the output (including error) in the signal band of interest, and compensating a succession of sampled signal values each by a corresponding one of the simulated signals; in other embodiments, the outputs generated will represent a signal-frequency band representation of the error, rather than of the output. Conveniently, where the error generating signal is quantized to a small number of possible values, the correction samples or simulated signal samples may be provided in look-up tables addressed in dependence upon the quantized signal; the look-up tables are referred to merely for convenience in the foregoing as read only memories (ROMs) but could of course be embodied in other forms. Equally, however, it would be possible in some applications to provide that the correction or simulation in signal impulses were calculated in real time rather than looked up.

In some embodiments, noise shaping feedback is supplied not to (or not only to) the next following sample, but to later occurring samples; this delayed feedback is applicable in other contexts than non-linear error correction.

In other embodiments, correction is provided in the forward signal path, conveniently but not necessarily in the form of a look-up table, enabling an earlier signal sample to be corrected prior to output in dependence upon the value of (or an approximation to) a later signal sample; this may be employed to avoid quantizer overload, or to improve error correction, or to improve stability, or combinations of these.

I claim:

1. A signal convertor comprising:
   a pulse edge modulator having an input and providing an output, and means, responsive to any error in previous values of said modulator output, for modifying said input to said pulse edge modulator thereby reducing effects of said any error within a desired signal band.

2. A signal converter comprising:
   a pulse edge modulator controlled by an output of a quantizer, the quantizer having a processed input, said input processed in dependence upon said quantizer output, by a non-linear stage for reducing effects of any non-linearity due to the pulse edge modulator over a predetermined signal frequency band.

3. A signal converter comprising:
   a signal input,
   a quantizer,
   a feedback network around said quantizer for reducing quantizer noise in a desired frequency band relative to a spectrum of said quantizer which would be exhibited without said feedback network, and
   a pulse modulator, responsive to an output of said quantizer, for providing output of predetermined amplitude pulses, where times of occurrence of edges of said pulses are controlled, by including means for reducing the noise within said desired band by said pulse modulator.

4. A signal convertor including:
   a pulse edge modulator, and
   digital memory means for storing data related to distortion present in an output of said modulator in response to varying input signal levels.

5. A convertor according to claim 4 comprising a digital to analogue converter, wherein said memory means is provided in a feedback path of said signal converter.

6. A convertor according to claim 4, further comprising memory means in a forward signal path thereof.

7. A convertor according to claim 6 in which the forward signal path is tapped to provide a plurality of differentially delayed signals, to which the memory means in the forward path is jointly responsive.

8. A convertor according to claim 6 comprising an analogue to digital convertor having a digital output path, wherein said pulse modulator is included in a feedback path, and said digital memory is in the digital output path.

9. A convertor according to claim 4, in which said memory means comprises a read-only memory device.

10. A convertor according to claim 4, in which said memory is reconditionable.

11. A convertor according to claim 10 further comprising means for deriving said data.

12. A convertor according to claim 11 in which said deriving means comprises means for supplying a predetermined input to said modulator, means for measuring a corresponding output at a point in a signal path subsequent to said modulator, and means for deriving said data from said output.

13. A signal converter which includes:
    a pulse modulator producing pulses having edges, temporal positions of said edges are controlled in dependence upon a value of a digital input to the converter, look-up table means storing a plurality of correction values, said look-up table being addressed in dependence upon a digital input, and means for differentially delaying one of said digital input and an output of said look-up table means, said look-up table means output combined with each digital input to reduce any error generated by the pulse modulator in response to said digital input.

14. A signal converter which includes:
    a pulse modulator producing pulses having edges, temporal positions of said edges are controlled in dependence upon a value of a digital input to the converter,
    look-up table means storing a plurality of correction values, said look-up table being addressed in dependence upon a digital input, and
    means for differentially delaying one of said digital input and an output of said look-up table means, said look-up table means output is connected to said pulse modulator to reduce any error generated by the pulse modulator in response to said digital input.

* * * * *